US008913433B2

(12) United States Patent
Kim et al.

(10) Patent No.: US 8,913,433 B2
(45) Date of Patent: Dec. 16, 2014

(54) NONVOLATILE MEMORY DEVICES, READ METHODS THEREOF AND MEMORY SYSTEMS INCLUDING THE NONVOLATILE MEMORY DEVICES

(75) Inventors: Kihyun Kim, Hwaseong-si (KR); Hansoo Kim, Suwon-si (KR); Jaehoon Jang, Seongnam-si (KR); Sunil Shim, Songpa-gu (KR); Chulmin Park, Siheung-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 256 days.

(21) Appl. No.: 13/093,320

(22) Filed: Apr. 25, 2011

(65) Prior Publication Data
US 2011/0317489 A1    Dec. 29, 2011

(30) Foreign Application Priority Data

Jun. 28, 2010    (KR) ........................ 10-2010-0061421

(51) Int. Cl.
*G11C 16/04*    (2006.01)
*G11C 16/26*    (2006.01)
G11C 16/10    (2006.01)
H01L 27/115    (2006.01)
G11C 16/34    (2006.01)

(52) U.S. Cl.
CPC ............ *G11C 16/0483* (2013.01); *G11C 16/10* (2013.01); *H01L 27/115* (2013.01); *G11C 16/3418* (2013.01); *G11C 16/26* (2013.01)
USPC ............. 365/185.17; 365/189.16; 365/185.18

(58) Field of Classification Search
CPC ............... G11C 16/0483; G11C 16/10; G11C 16/3418; G11C 6/26; H01L 27/115
USPC .......................... 365/185.17, 189.16, 185.18
See application file for complete search history.

(56) References Cited

U.S. PATENT DOCUMENTS

| 7,457,160 | B2 | 11/2008 | Kang et al. | |
| 2009/0073763 | A1 | 3/2009 | Hosono | |
| 2009/0168533 | A1* | 7/2009 | Park et al. | ................ 365/185.17 |
| 2009/0238003 | A1 | 9/2009 | Namiki et al. | |
| 2010/0054036 | A1* | 3/2010 | Lee et al. | ................. 365/185.03 |

FOREIGN PATENT DOCUMENTS

| JP | 2009-070501 A | 4/2009 |
| JP | 2009-193631 A | 8/2009 |
| KR | 10-2008-0038656 A | 5/2008 |
| KR | 10-2009-0028483 A | 3/2009 |

\* cited by examiner

*Primary Examiner* — Jason Lappas
(74) *Attorney, Agent, or Firm* — Harness, Dickey & Pierce, P.L.C.

(57) ABSTRACT

Reading methods of nonvolatile memory devices including a substrate and a plurality of memory cells which are stacked in a direction intersecting the substrate. The reading methods apply a bit line voltage to a plurality of bit lines and apply a first string selection line voltage to at least one selected string selection line. The reading methods apply a second string selection line voltage to at least one unselected string selection line and apply a read voltage to a plurality of word lines. The reading methods apply a first ground selection line voltage to at least one selected ground selection line and apply a second ground selection line voltage to at least one unselected ground selection line.

21 Claims, 39 Drawing Sheets

| # of WLs | # of WLs shared | # of disturb readings to a cell for a block reading | # of disturb readings to a cell for 100K block readings |
|---|---|---|---|
| 8 | 8 | 224 | 22400K |
| 16 | 16 | 960 | 96000k |
| 24 | 24 | 2208 | 220800k |
| 32 | 32 | 3968 | 396800k |
| 56 | 56 | 12320 | 1232000k |
| 64 | 64 | 16128 | 1612800k |
| 96 | 96 | 36480 | 3648000k |
| 128 | 128 | 65024 | 6502400k |

Fig. 10

|  |  | 1st Row (Unselected) | 2nd Row (Selected) | 3rd Row (Unselected) |
|---|---|---|---|---|
| BL | | VBL (Vcc) | VBL (Vcc) | VBL (Vcc) |
| SSL | | VSSL2 (Vss) | VSSL1 (Vcc) | VSSL2 (Vss) |
| WL | WL7 | Vread | Vread | Vread |
|  | WL6 | | | |
|  | WL5 | | | |
|  | WL4 (Selected) | Vrd | Vrd | Vrd |
|  | WL3 | Vread | Vread | Vread |
|  | WL2 | | | |
|  | WL1 | | | |
| GSL | | VGSL2 (Vss) | VGSL1 (Vcc) | VGSL2 (Vss) |
| CSL | | VCSL (Vss) | VCSL (Vss) | VCSL (Vss) |
| Channel | | Vboost | MC dependent | Vboost |

Fig. 12

|  | 1st Row (Unselected) | 2nd Row (Selected) | 3rd Row (Unselected) |
|---|---|---|---|
| BL | VBL (Vcc) | VBL (Vcc) | VBL (Vcc) |
| SSL | VSSL2 (Vss) | VSSL1 (Vcc) | VSSL2 (Vss) |
| WL — WL7 | Vread2 | | |
| WL — WL6 | Vread1 | | |
| WL — WL5 | Vread1 | | |
| WL — WL4 (Selected) | Vrd | | |
| WL — WL3 | Vread1 | | |
| WL — WL2 | Vread1 | | |
| WL — WL1 | Vread2 | | |
| GSL | VGSL2 (Vss) | VGSL1 (Vcc) | VGSL2 (Vss) |
| CSL | VCSL (Vss) | | |
| Channel | Vboost | MC dependent | Vboost |

Fig. 14

|  | 1st Row (Unselected) | 2nd Row (Selected) | 3rd Row (Unselected) |
|---|---|---|---|
| BL | VBL (Vcc) | VBL (Vcc) | VBL (Vcc) |
| SSL | VSSL2 (Vss) | VSSL1 (Vcc) | VSSL2 (Vss) |
| WL / WL7 | Vread2 | | |
| WL6 | Vread3 | | |
| WL5 | Vread1 | | |
| WL4 (Selected) | Vrd | | |
| WL3 | Vread1 | | |
| WL2 | Vread3 | | |
| WL1 | Vread2 | | |
| GSL | VGSL2 (Vss) | VGSL1 (Vcc) | VGSL2 (Vss) |
| CSL | VCSL (Vss) | | |
| Channel | Vboost | MC dependent | Vboost |

US 8,913,433 B2

NONVOLATILE MEMORY DEVICES, READ METHODS THEREOF AND MEMORY SYSTEMS INCLUDING THE NONVOLATILE MEMORY DEVICES

CROSS-REFERENCE TO RELATED APPLICATION

This U.S. non-provisional patent application claims priority under 35 U.S.C. §119 to Korean Patent Application No. 10-2010-0061421, filed on Jun. 28, 2010, in the Korean Intellectual Property Office (KIPO), the entire contents of which is hereby incorporated by reference.

BACKGROUND

1. Field

Example embodiments of the inventive concepts relate to semiconductor memory, and more particularly, to nonvolatile memory devices, reading methods thereof, and memory systems including the nonvolatile memory devices.

2. Description of the Related Art

A semiconductor memory device is a memory device that may be implemented with semiconductor materials, for example, silicon (Si), germanium (Ge), gallium arsenide (GaAs) and/or indium phosphide (InP). Semiconductor memory devices are largely categorized as volatile memory devices and/or nonvolatile memory devices.

A volatile memory device is a memory device in which stored data is erased when a power source is shut off. Volatile memory devices may include Static Random Access Memory (SRAM), Dynamic Random Access Memory (DRAM) and/or Synchronous Dynamic Random Access Memory (SDRAM). A nonvolatile memory device is a memory device that retains stored data even when a power source is shut off. Nonvolatile memory devices may include Read-Only Memory (ROM), Programmable Read Only Memory (PROM), Erasable Programmable Read Only Memory (EPROM), Electrical Erasable Programmable Read Only Memory (EEPROM), flash memory, Phase-change Random Access Memory (PRAM), Magnetoresistive Random Access Memory (MRAM), Resistive Random Access Memory (RRAM) and/or Ferroelectric Random Access Memory (FRAM). A flash memory device is largely categorized into NOR type and/or NAND type.

A three dimensional 3D array structure in which memory cells are vertically stacked may enhance a degree of integration of semiconductor memory devices.

SUMMARY

Example embodiments of the inventive concepts may provide nonvolatile memory devices with enhanced reliability, reading methods thereof, and memory systems including the nonvolatile memory devices.

Example embodiments of the inventive concepts may provide a reading method of a nonvolatile memory device, which includes a substrate and a plurality of memory cells which are stacked in a direction intersecting the substrate, including applying a bit line voltage to a plurality of bit lines, applying a first string selection line voltage to at least one selected string selection line, applying a second string selection line voltage to at least one unselected string selection line, applying a read voltage to a plurality of word lines, applying a first ground selection line voltage to at least one selected ground selection line and applying a second ground selection line voltage to at least one unselected ground selection line.

According to some example embodiments, a plurality of memory cells on a plane parallel to the substrate may share a word line. According to other example embodiments, the applying of a read voltage may include applying a selection read voltage to a selected word line and applying first and second non-selection read voltages to an unselected word line. According to still other example embodiments, the second non-selection read voltage may be applied to a first word line among the word lines, the first word line being adjacent to the at least one selected string selection line and the at least one unselected string selection line.

According to even other example embodiments, the reading method may further include applying a third non-selection read voltage to a second word line among the word lines, the second word line being adjacent to the first word line. According to yet other example embodiments, the second non-selection read voltage may have a level lower than the third non-selection read voltage. According to further example embodiments, the second non-selection read voltage may be applied to a third word line among the word lines, the third word line being adjacent to the at least one selected ground selection line and the at least one unselected ground selection line.

According to still further example embodiments, the reading method may further include applying a third non-selection read voltage to a fourth word line among the word lines, the fourth word line being adjacent to the third word line. According to even further example embodiments, the first non-selection read voltage may be applied to a word line which is separated from the at least one selected string selection line, the at least one unselected string selection line, the at least one selected ground selection line and the at least one unselected ground selection line about at least one word line. According to yet further example embodiments, the first non-selection read voltage may have a level higher than the second non-selection read voltage.

According to yet further example embodiments, the first string selection line voltage may turn on at least one string selection transistor which is connected to the at least one selected string selection line. According to much further example embodiments, the second string selection line voltage may turn off at least one string selection transistor which is connected to the at least one unselected string selection line. According to still much further example embodiments, the first ground selection line voltage may turn on at least one ground selection transistor which is connected to the at least one selected ground selection line. According to even much further example embodiments, the second ground selection line voltage may turn off at least one ground selection transistor which is connected to the at least one unselected ground selection line.

According to other example embodiments of the inventive concepts, a nonvolatile memory device includes a memory cell array including a substrate, and a plurality of memory cells which are stacked in a direction intersecting the substrate, a decoder connected to the memory cell array through a plurality of string selection lines, a plurality of ground selection lines and a plurality of word lines and a read and write circuit connected to the memory cell array through a plurality of bit lines. A plurality of memory cells on a plane parallel to the substrate share a word line, and in a reading operation, the decoder applies a selection read voltage to a selected word line among the word lines, and applies first and second non-selection read voltages to unselected word lines among the word lines.

According to some example embodiments, the decoder may apply a first voltage to a selected string selection line of the string selection lines and a selected ground selection line of the ground selection lines, and apply a second voltage to an unselected string selection line of the string selection lines and an unselected ground selection line of the ground selection lines, in the reading operation. According to other example embodiments, the first voltage may turn on a selected string selection transistor and a selected ground selection transistor, and the second voltage may turn off an unselected string selection transistor and an unselected ground selection transistor.

According to still other example embodiments, the decoder may apply the second non-selection read voltage to some of the unselected word lines, apply the second non-selection read voltage to at least one unselected word line between the string selection lines and the some of the unselected word lines, and apply the second non-selection read voltage to at least one unselected word line between the ground selection lines and the some of the unselected word lines, in the reading operation.

According to still other example embodiments of the inventive concepts, a memory system includes a nonvolatile memory device and a controller controlling the nonvolatile memory device The nonvolatile memory device includes a memory cell array including a substrate, and a plurality of memory cells which are stacked in a direction intersecting the substrate, a decoder connected to the memory cell array through a plurality of string selection lines, a plurality of ground selection lines and a plurality of word lines, and a read and write circuit connected to the memory cell array through a plurality of bit lines, a plurality of memory cells on a plane parallel to the substrate share a word line, and in a reading operation, the decoder applies a selection read voltage to a selected word line among the word lines, and applies first and second non-selection read voltages to unselected word lines among the word lines. According to some example embodiments, the nonvolatile memory device and the controller may configure a Solid State Drive (SSD).

According to example embodiments of the inventive concepts, a reading method of a nonvolatile memory device including a substrate and a plurality of memory cells stacked in a direction intersecting the substrate includes applying a bit line voltage to a plurality of bit lines, applying a first string selection line voltage to at least one selected string selection line, applying a second string selection line voltage to at least one unselected string selection line, applying at least one read voltage to a plurality of word lines, applying a first ground selection line voltage to at least one selected ground selection line and applying a second ground selection line voltage to at least one unselected ground selection line.

According to other example embodiments of the inventive concepts, a nonvolatile memory device includes a memory cell array, the memory cell array including a substrate, at least three first memory cells stacked on the substrate in a direction intersecting the substrate and at least three second memory cells adjacent to the first memory cells in planes parallel to the substrate, the adjacent memory cells in each of planes being commonly connected to one of at least three word lines, a decoder connected to the memory cell array through a plurality of string selection lines, a plurality of ground selection lines and the at least three word lines, the decoder configured to read at least one of the first and second memory cells by applying a first voltage to a selected word line of the at least three word lines, and by applying second and third voltages to a plurality of unselected word lines of the at least three word lines, and a read and write circuit connected to the memory cell array through a plurality of bit lines.

According to still other example embodiments of the inventive concepts, a memory system includes a nonvolatile memory device, the nonvolatile memory device including a memory cell array including a substrate, at least three first memory cells stacked on the substrate in a direction intersecting the substrate and at least three second memory cells adjacent to the first memory cells in planes parallel to the substrate, the adjacent memory cells in each of the planes being commonly connected to one of at least three word lines, a decoder connected to the memory cell array through a plurality of string selection lines, a plurality of ground selection lines and the at least three word lines, the decoder configured to read at least one of the first and second memory cells by applying a first voltage to a selected word line of the at least three word lines, and by applying second and third voltages to a plurality of unselected words line of the at least three word lines, a read and write circuit connected to the memory cell array through a plurality of bit lines and a controller configured to control the nonvolatile memory device.

According to yet other example embodiments, a method of reading a nonvolatile memory device includes applying a first string selection line voltage to at least one selected string selection line connected to a first string selection transistor, applying a second string selection line voltage to at least one unselected string selection line connected to a second string selection transistor, applying a first ground selection line voltage to at least one selected ground selection line connected to a first ground selection transistor, a selected memory string between the first string selection transistor and the first ground selection transistor, the selected memory string including a plurality of first memory cells stacked on a substrate, applying a second ground selection line voltage to at least one unselected ground selection line connected to a second ground selection transistor, an unselected memory string between the second string selection transistor and the second ground selection transistor, the unselected memory string including a plurality of second memory cells stacked on the substrate, and applying a plurality of read voltages to a plurality of word lines, each of the plurality of word lines commonly connecting at least one of the first memory cells and at least one of the second memory cells.

BRIEF DESCRIPTION OF THE DRAWINGS

Example embodiments of the inventive concepts will be more clearly understood from the following brief description taken in conjunction with the accompanying drawings. FIGS. 1-40 represent non-limiting, example embodiments as described herein.

FIG. 1 is a block diagram illustrating nonvolatile memory devices according to example embodiments of the inventive concepts;

FIG. 2 is a block diagram illustrating a memory cell array of FIG. 1;

FIG. 3 is a perspective view illustrating any one of the memory blocks of FIG. 2 according to example embodiments of the inventive concepts;

FIG. 4 is a cross-sectional view taken along line IV-IV' of FIG. 3;

FIG. 5 is a cross-sectional diagram illustrating a transistor structure of FIG. 4;

FIG. 6 is a circuit diagram illustrating an equivalent circuit of a memory block described with reference to FIGS. 3-5;

FIG. 7 is a diagram illustrating threshold voltage dispersion of a memory cell;

FIG. 8 is a table illustrating the number of disturbance reads in a memory cell according to the number of word lines and the number of shared word lines;

FIG. 9 is a flowchart illustrating reading methods according to example embodiments of the inventive concepts;

FIG. 10 is a table illustrating a voltage condition according to example embodiments of the reading method of FIG. 9;

FIG. 11 is a timing diagram illustrating voltage changes based on the voltage condition of FIG. 10;

FIG. 12 is a table illustrating a voltage condition according to other example embodiments of the reading method of FIG. 9;

FIG. 13 is a timing diagram illustrating voltage changes based on the voltage condition of FIG. 12;

FIG. 14 is a table illustrating a voltage condition according to still other example embodiments of the reading method of FIG. 9;

FIG. 15 is a timing diagram illustrating voltage changes based on the voltage condition of FIG. 14;

FIG. 16 is a circuit diagram illustrating an equivalent circuit according to other example embodiments of a memory block described with reference to FIGS. 3-5;

FIG. 17 is a timing diagram illustrating voltage changes in a reading operation of the memory block of FIG. 16;

FIG. 18 is a circuit diagram illustrating an equivalent circuit according to still other example embodiments of a memory block described with reference to FIGS. 3-5;

FIG. 19 is a circuit diagram illustrating an equivalent circuit according to further example embodiments of a memory block described with reference to FIGS. 3-5;

FIG. 20 is a circuit diagram illustrating an equivalent circuit according to still further example embodiments of a memory block described with reference to FIGS. 3-5;

FIG. 21 is a circuit diagram illustrating an equivalent circuit according to yet further example embodiments of a memory block described with reference to FIGS. 3-5;

FIG. 22 is a perspective view illustrating a modification example of a memory block of FIG. 3;

FIG. 23 is a cross-sectional view taken, along line XXIII-XXIII' of a memory block of FIG. 22;

FIG. 24 is a circuit diagram illustrating an equivalent circuit according to example embodiments of a memory block described with reference to FIGS. 22 and 23;

FIG. 25 is a timing diagram illustrating voltage changes in a reading operation of the memory block of FIG. 24;

FIG. 26 is a perspective view illustrating other example embodiments of one of the memory blocks of FIG. 2;

FIG. 27 is a perspective view illustrating a modification example of a memory block of FIG. 26;

FIG. 28 is a perspective view illustrating a still other example embodiments of one of the memory blocks of FIG. 3;

FIG. 29 is a cross-sectional view taken along line XXIX-XXIX' of a memory block of FIG. 28;

FIG. 30 is a perspective view illustrating a modification example of a memory block of FIG. 28;

FIG. 31 is a cross-sectional view taken along line XXXI-XXXI' of a memory block of FIG. 30;

FIG. 32 is a perspective view illustrating still further example embodiments of one of the memory blocks of FIG. 3;

FIG. 33 is a cross-sectional view taken along line XXXIII-XXXIII' of a memory block of FIG. 32;

FIG. 34 is a perspective view illustrating a modification example of a memory block of FIG. 32;

FIG. 35 is a cross-sectional view taken along line XXXV-XXXV' of a memory block of FIG. 34;

FIG. 36 is a perspective view illustrating yet still other example embodiments of one of the memory blocks of FIG. 2;

FIG. 37 is a cross-sectional view taken along line XXXVII-XXXVII' of a memory block of FIG. 36;

FIG. 38 is a block diagram illustrating memory systems which include a nonvolatile memory device according to example embodiments of the inventive concepts;

FIG. 39 is a block diagram illustrating example applications of the memory systems of FIG. 38; and FIG. 40 is a block diagram illustrating computing systems including memory systems described with reference to FIG. 39.

Figure 1:
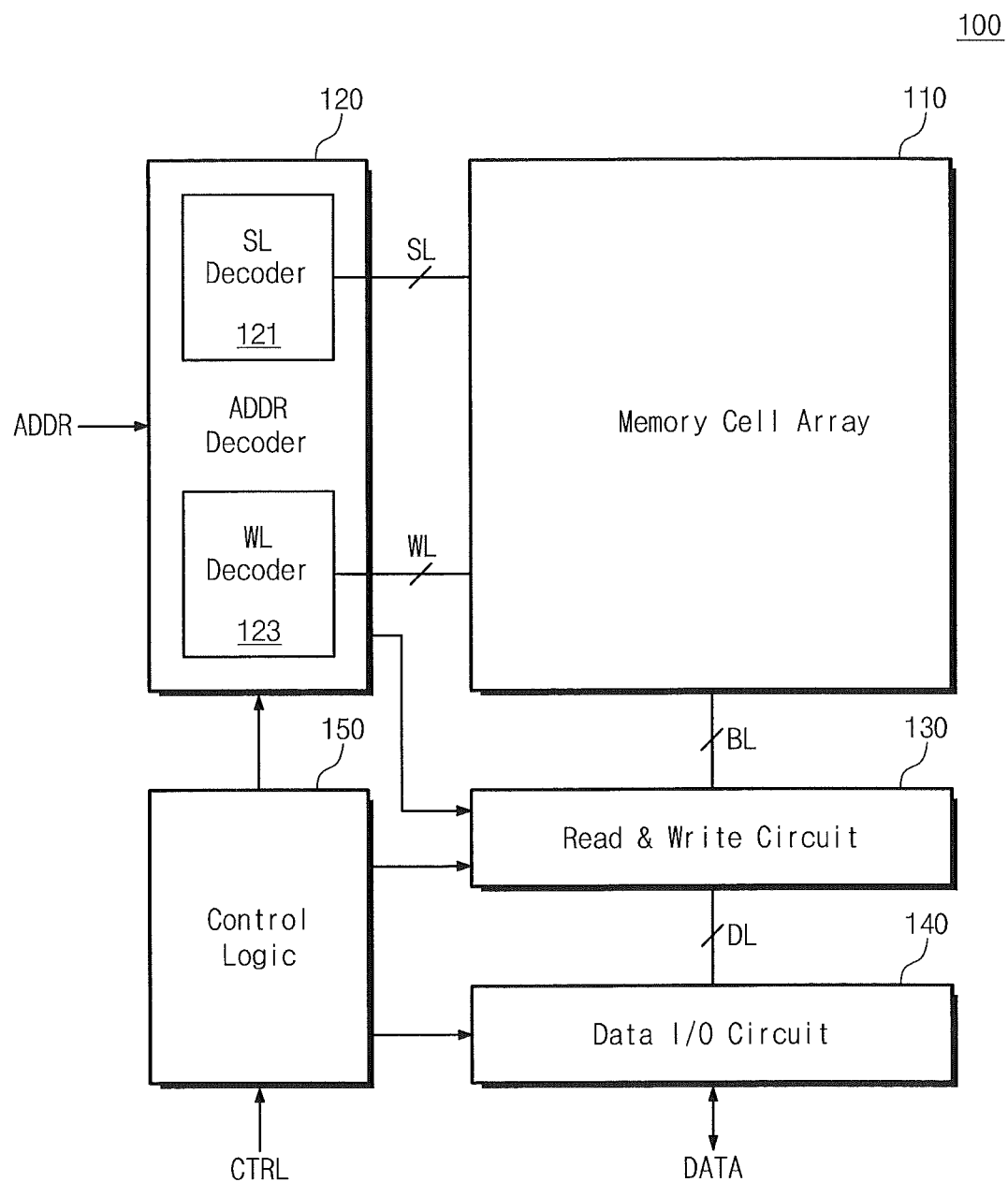

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating nonvolatile memory devices according to example embodiments of the inventive concepts. Referring to FIG. 1, a nonvolatile memory device 100 according to example embodiments of the inventive concepts may include a memory cell array 110, an address decoder 120, a read and write circuit 130, a data input/output (I/O) circuit 140 and a control logic 150. The memory cell array 110 may be connected to the address decoder 120 through word lines WL and selection lines SL, and may be connected to the read and write circuit 140 through bit lines BL. For example, the memory cell array 110 may include a plurality of memory cells that are stacked in a direction intersecting a substrate. According to example embodiments of the inventive concepts the memory cell array 110 may be configured with a plurality of memory cells that may store one or more bits in each cell.

The address decoder 120 may be connected to the memory cell array 110 through the word lines WL and the selection lines SL. The address decoder 120 may operate according to the control of the control logic 150. The address decoder 120 may receive an address ADDR from the outside. The address decoder 120 may decode the row address of the received address ADDR. The address decoder 120 may select a word line corresponding to the decoded row address from among the word lines WL. The address decoder 120 may select a selection line corresponding to the decoded row address from among the selection lines SL. According to example embodiments of the inventive concepts, if the address decoder 120 is connected to the memory cell array 110 through dummy word lines (DWL, not shown), it may further select a dummy word line corresponding to the decoded row address from among the dummy word lines (DWL, not shown).

The address decoder 120 may decode the column address of the received address ADDR. The address decoder 120 may transfer the decoded column address to the read and write circuit 130. The address decoder 120 may include a selection line decoder 121 and a word line decoder 123. The selection line decoder 121 may select a selection line corresponding to the decoded row address from among the selection lines SL. The word line decoder 123 may select a word line corresponding to the decoded row address from among the word lines WL. According to example embodiments of the inventive concepts, the address decoder 120 may include a row decoder decoding a row address, a column decoder decoding a column address and an address buffer storing the received address ADDR (not shown).

The read and write circuit 130 may be connected to the memory cell array 110 through the bit lines BL, and may be connected to the data input/output circuit 140 through data lines DL. The read and write circuit 130 may receive the decoded column address from the address decoder 120. The read and write circuit 130 may select the bit lines BL with the decoded column address. For example, the read and write circuit 130 may receive data from the data input/output circuit 140, and may write the received data in the memory cell array 110. The read and write circuit 130 may read data from the memory cell array 110 and may output the read data to the data input/output circuit 140.

The read and write circuit 130 may read data from a first storage region of the memory cell array 110 and may write the read data in a second storage region of the memory cell array 110. For example, the read and write circuit 130 may perform a copy-back operation. For example, the read and write circuit 130 may include elements such as a page buffer (or a page register) (not shown) that may perform the reading and writing of data and a column selection circuit selecting bit lines BL. As another example, the read and write circuit 130 may include elements such as a sensing amplifier reading data, a writing driver writing data and a column selection circuit selecting bit lines BL (not shown).

The data input/output circuit 140 may be connected to the read and write circuit 130 through the data lines DL. The data input/output circuit 140 may operate according to the control of the control logic 150. The data input/output circuit 140 may exchange data DATA with the outside. The data input/ output circuit 140 may transfer the data DATA received from the outside to the read and write circuit 130 through the data lines DL. The data input/output circuit 140 may transfer data DATA, which may be transferred through the data lines DL from the read and write circuit 130, to the outside. For example, the data input/output circuit 140 may include elements such as a data buffer.

The control logic 150 may be connected to the address decoder 120, the read and write circuit 130 and the data input/output circuit 140. The control logic 150 may control the overall operation of the nonvolatile memory device 100 (e.g., a flash memory device). The control logic 150 may operate in response to a control signal CTRL from the outside.

Figure 2:
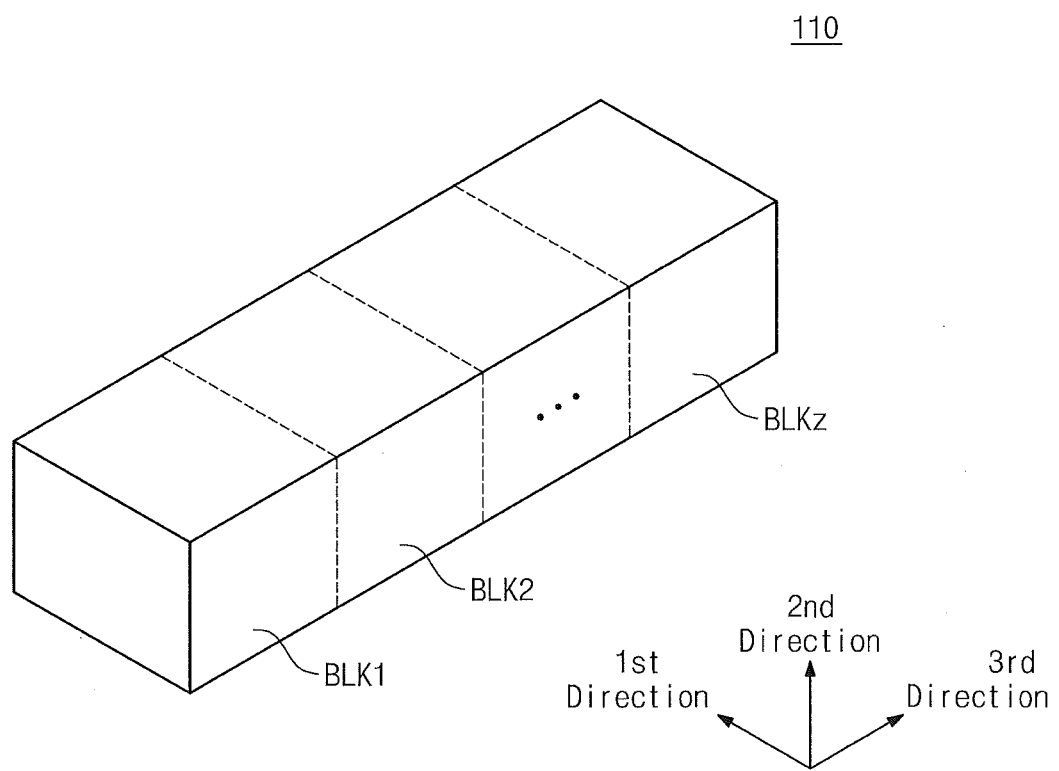

FIG. 2 is a block diagram illustrating a memory cell array 110 of FIG. 1. Referring to FIG. 2, the memory cell array 110 may include a plurality of memory blocks BLK1-BLKz. Each memory block BLK may have a Three-Dimensional (3D) structure (or vertical structure). Each memory block BLK may include structures that are extended in first to third directions. For example, each memory block BLK may include a plurality of NAND strings NS (not shown) that may be extended in the second direction. For example, the plurality of NAND strings NS may be provided in the first to third directions.

Each NAND string NS may be connected to a bit line BL, a string selection line SSL, a ground selection line GSL, word lines WL and a common source line CSL (not shown). Each memory block may be connected to a plurality of bit lines BL, a plurality of string selection lines SSL, a plurality of ground selection lines GSL, a plurality of word lines WL and a common source line CSL. According to example embodiments of the inventive concepts, the memory blocks BLK1-BLKz may be selected by the address decoder of FIG. 1. For example, the address decoder 120 may select a memory block BLK corresponding to the decoded row address from among the memory blocks BLK1-BLKz.

Figure 3:
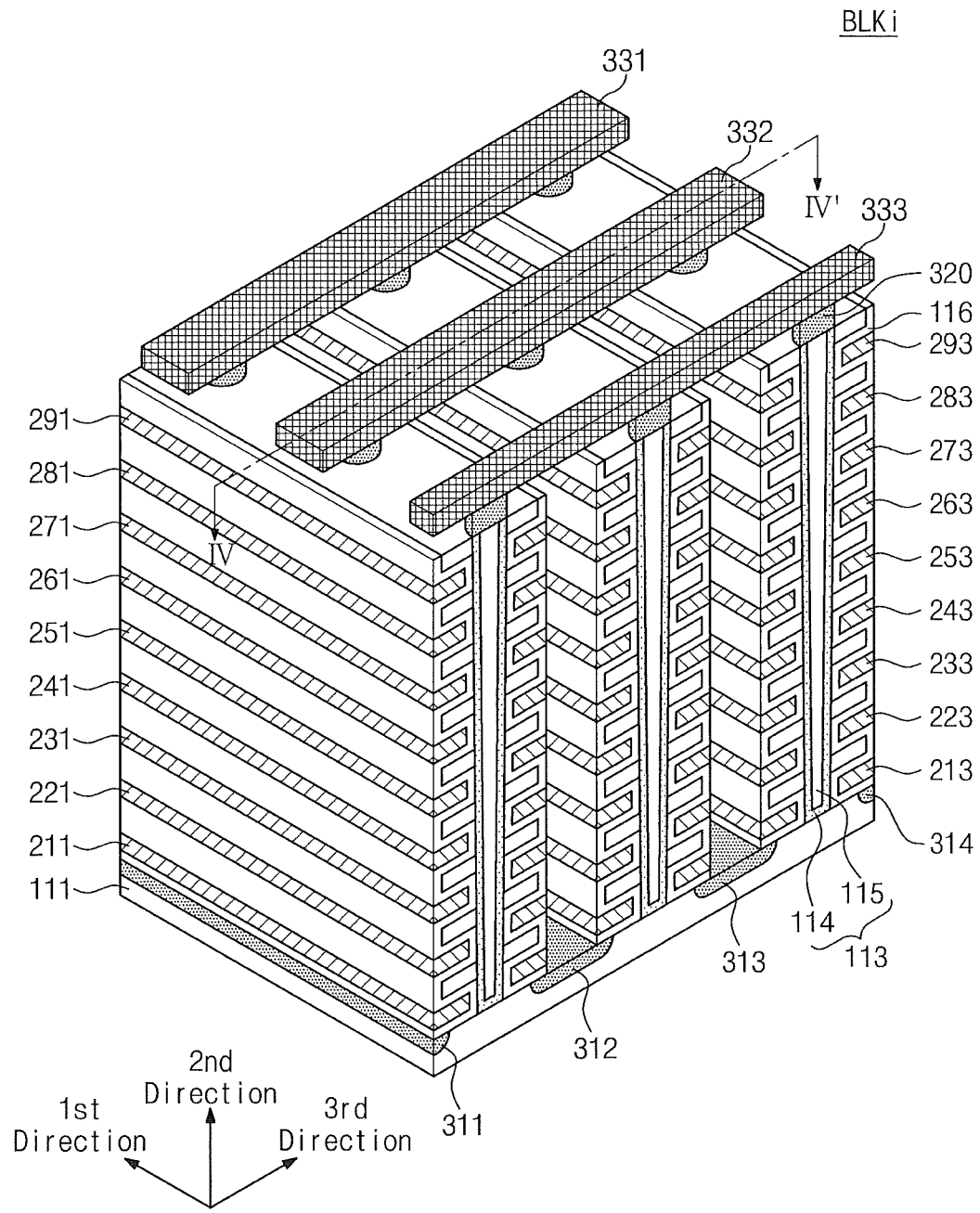
Figure 4:
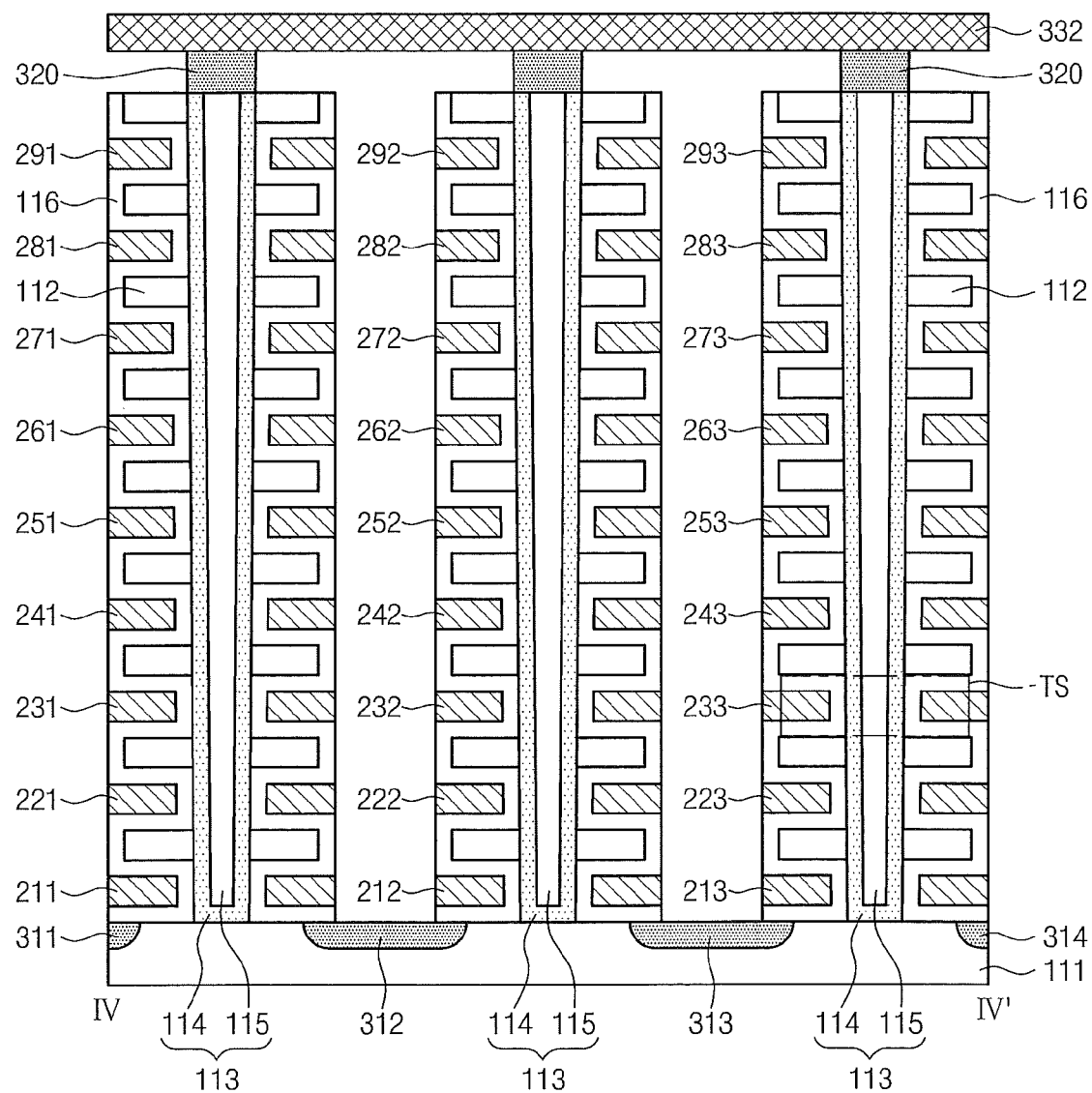

FIG. 3 is a perspective view illustrating a memory block BLKi of the memory blocks BLK1-BLKz in FIG. 2 according to example embodiments of the inventive concepts. FIG. 4 is a cross-sectional view taken along line IV-IV' of FIG. 3. Referring to FIGS. 3 and 4, a memory block BLKi may include structures extending in first to third directions. A substrate 111 may be provided. According to example embodiments of the inventive concepts, the substrate 111 may be a well with a first type (e.g., a well of a first conductive type). For example, the substrate 111 may be a p well that is formed by injecting a group-III element (e.g., boron (B)). As an example, the substrate 111 may be a pocket p well that may be provided to an n well. Hereinafter, it may be assumed for purposes of explanation that the substrate 111 may be a p type well (e.g., a p type pocket well). However, the conductive type of the substrate 111 need not be limited to p type.

A plurality of doping regions 311-314 extending in the first direction may be on the substrate 111. For example, a plurality of doping regions 311-314 may be a second type (e.g., a second conductive type) different from that of the substrate 111. For example, the doping regions 311-314 may be n type. Hereinafter, it may be assumed for purposes of explanation that the first to fourth doping regions 311-314 may be n type. However, the conductive types of the first to fourth doping regions 311-314 need not be limited to n type.

In a region on the substrate 111 between the first and second doping regions 311 and 312, a plurality of insulating materials 112 extending in the first direction may be sequentially provided in the second direction. For example, the plurality of insulating materials 112 may be separated from each other in the second direction. According to example embodiments of the inventive concepts, the insulating materials 112 may include an insulating material (e.g., silicon oxide). In the region on the substrate 111 between the first and second doping regions 311 and 312, a plurality of pillars 113 may be provided and sequentially disposed in the first direction, and may pass through the insulating materials 112 in the second direction. According to example embodiments of the inventive concepts, each of the pillars 113 may be connected to the substrate 111.

According to example embodiments of the inventive concepts, each pillar 113 may be a plurality of materials. For example, a surface layer 114 of the each pillar 113 may include a silicon material of a first type. For example, the surface layer 114 of the each pillar 113 may include a silicon material of a same type of that of the substrate 111. Hereinafter, it may be assumed for the purposes of explanation that the surface layer 114 of each pillar 113 may include p type silicon. However, the surface layer 114 of each pillar 113 is not limited thereto. An inner layer 115 of each pillar 113 may be an insulating material. For example, the inner layer 115 of each pillar 113 may include an insulating material (e.g., silicon oxide). As an example, the inner layer 115 of each pillar 113 may include an air gap.

In a region between the first and second doping regions 311 and 312, an insulation layer 116 may be provided along an exposed surface of the substrate 111, the insulating materials 112 and the pillars 113. The insulating layer 116 may be removed to expose a surface of the last insulating material 112 in the second direction. A thickness of the insulating layer 116 may be less than one-half of a distance between the insulating materials 112. A region where a material other than the insulating materials 112 and the insulation layer 116 may be disposed may be provided between an insulation layer 116 provided to the lower surface of a first insulating material among the insulating materials 112 and an insulation layer 116 provided to the upper surface of a second insulating material in the lower portion of the first insulating material.

In the region between the first and second doping regions 311 and 312, conductive materials 211-291 may be on the exposed surface of the insulation layer 116. For example, the conductive material 211 extending in the first direction may be between the insulating material 112 adjacent to the substrate 111, and the substrate 111. The conductive material 211 extending in the first direction may be between the insulation layer 116 on the lower surface of the insulating material 112 and the insulating layer 116 adjacent to the substrate 111. A first conductive material extending in the first direction may be provided between the insulation layer 116 on the upper surface of a specific insulating material of the insulating materials 112 and the insulation layer 116 on the lower surface of an insulating material disposed on the specific insulating material. According to example embodiments of the inventive concepts, a plurality of first conductive materials 211-291 extending in the first direction may be between the insulating materials 112. For example, first conductive materials 211-291 may be metal materials. As an example, the first conductive materials 211 to 291 may be conductive materials, for example, polysilicon.

In a region between the second doping region 312 and a third doping region 313, a same or similar structure as a structure between the first and second doping regions 311 and 312 may be provided. In the region between the second and third doping regions 312 and 313, the insulating materials 112 may extend in the first direction. The pillars 113 may be sequentially disposed in the first direction and may pass through the insulating materials 112 in the third direction.

The insulation layer 116 that may be on exposed surfaces of the insulating materials 112 and the exposed surfaces of the pillars 113. A plurality of first conductive materials 212-292 may extend in the first direction.

In a region between the third doping region 313 and a fourth doping region 314, a same or similar structure as a structure between the first and second doping regions 311 and 312 may be provided. In the region between the third and fourth doping regions 313 and 314, the insulating materials 112 may extend in the first direction. The pillars 113 may be sequentially disposed in the first direction and may pass through the insulating materials 112 in the third direction. The insulation layer 116 may be on the exposed surfaces of the insulating materials 112 and the exposed surfaces of the pillars 113. A plurality of first conductive materials 213-293 may extend in the first direction.

Heights of first conductive materials 211-291, 212-292 and 213-293 may be defined. The first conductive materials 211-291, 212-292 and 213-293 may be defined to be first to ninth heights sequentially from the substrate 111. The first conductive materials 211, 212 and 213 adjacent to the substrate 111 may be at a first height. The first conductive materials 291, 292 and 293 adjacent to second conductive materials 331, 332 and 333 may be at a ninth height. As the sequence of a specific conductive material in the first conductive materials 211-291, 212-292 and 213-293 from the substrate increases, a height identifier of the first conductive material may increase.

Drains 320 may be provided onto the pillars 113. According to example embodiments of the inventive concepts, the drains 320 may be silicon materials that are doped in a second type. For example, the drains 320 may be n type silicon materials. Hereinafter, it may be assumed for purposes of explanation that the drains 320 include n-type silicon. However, the drains 320 need not be limited thereto. According to example embodiments of the inventive concepts, a width of each of the drains 320 may be greater than that of a corresponding pillar 113. For example, each drain 320 may be in a pad shape on the upper surface of a corresponding pillar 113. For example, each drain 320 may extend to a portion of a surface layer 114 of a corresponding pillar 113.

Second conductive materials 331-333 extending in the third direction may be on the drains 320. The second conductive materials 331-333 may be separated from each other and may be sequentially disposed in the first direction. The second conductive materials 331-333 may be connected to the drains 320 of a corresponding region. According to example embodiments of the inventive concepts, the drains 320 and the conductive materials 331-333 extending in the third direction may be connected through a contact plug. For example, the second conductive materials 331-333 may be metal materials.

For example, the second conductive materials 331-333 may be polysilicon. Each pillar 113 may form a string together with the insulation layer 116 and one set of the first conductive lines 211-291, 212-292 and 213-293. For example, each pillar 113 may form a NAND string together with a region adjacent to the insulation layer 116 and an adjacent region among conductive lines 211-291, 212-292 and 213-293. The NAND string may include a plurality of transistor structures TS.

Figure 5:
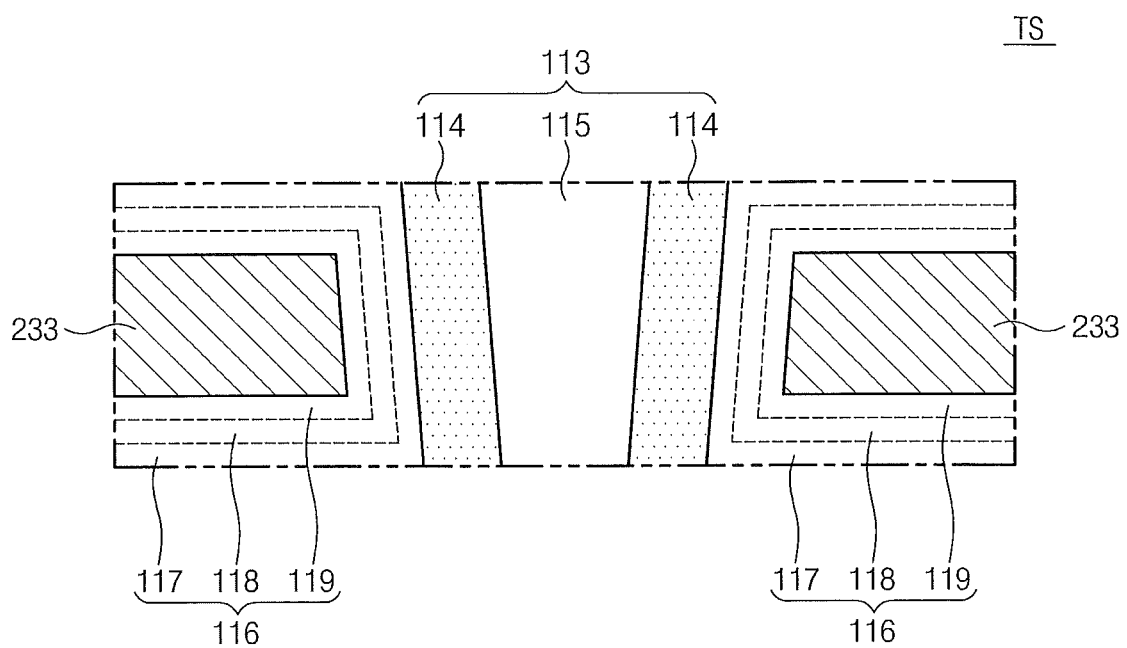

FIG. 5 is a cross-sectional diagram illustrating the transistor structure TS of FIG. 4. Referring to FIGS. 3-5, the insulation layer 116 may include first to third sub-insulation layers 117, 118 and 119. A surface layer including the p-type silicon of the pillar 113 may serve as a body. The first sub-insulation layer 117 adjacent to the pillar 113 may serve as a tunneling insulation layer. For example, the first sub-insulation layer 117 adjacent to the pillar 113 may include a thermal oxide layer. The second sub-insulation layer 118 may serve as a charge storage layer. For example, the second sub-insulation layer 118 may serve as a charge trapping layer.

For example, the second sub-insulation layer 118 may include a nitride layer and/or metal oxide layer (e.g., an aluminum oxide layer and/or a hafnium oxide layer). The third sub-insulation layer 119 adjacent to the first conductive material 233 may serve as a blocking insulation layer. For example, the third sub-insulation layer 119 adjacent to the conductive material 233 extending in the first direction may be formed as a single layer or a multi-layer. The third sub-insulation layer 119 may be a high dielectric layer (e.g., an aluminum oxide layer and/or a hafnium oxide layer) with a higher dielectric constant than the first and second sub-insulation layers 117 and 118. The first conductive material 233 may serve as a gate (or a control gate).

The first conductive material 233 may serve as the gate (or the control gate), the third sub-insulating layer 119 may serve as a blocking insulation layer, the second sub-insulation layer 118 may serve as a charge storage layer, the first sub-insulation layer 117 may serve as a tunneling insulation layer and the surface layer 114 which may include p type silicon may serve as a body, to form a transistor (or a memory cell transistor structure). For example, the first to third sub-insulation layers 117-119 may be an oxide-nitride-oxide (ONO).

Hereinafter, the surface layer 114 including the p-type silicon of the pillar 113 may be defined as a second-direction body. In the memory block BLKi, one pillar 113 may correspond to one NAND string. The memory block BLKi may include a plurality of pillars 113. The memory block BLKi may include a plurality of NAND strings. The memory block BLKi may include a plurality of NAND strings extending in the second direction (or the direction vertical to the substrate). Each NAND string may include a plurality of transistor structures TS stacked in the second direction. At least one of the transistor structures TS of each NAND string may serve as a string selection transistor. At least one of the transistor structures TS of each NAND string may serve as a ground selection transistor.

Gates (or control gates) may correspond to the first conductive materials 211-291, 212-292 and 213-293 that extend in the first direction. The gates (or the control gates) may extend in the first direction, and may form word lines WL and at least two selection lines SL (e.g., at least one string selection line and at least one ground selection line). The second conductive materials 331-333 extending in the third direction may be connected to the one end of each NAND string. For example, the second conductive materials 331-333 extending in the third direction may serve as bit lines. In one memory block BLKi a plurality of NAND strings may be connected to one bit line.

Second type doping regions 311-314 extending in the first direction may be provided to the other end of each NAND string. The second type doping regions 311-314 extending in the first direction may serve as the common source line. The memory block BLKi may include a plurality of NAND strings that extend in a direction (e.g., the second direction) vertical to the substrate 111 and serve as a NAND flash memory block (e.g., a charge trapping type) where the plurality of NAND strings may be connected to one bit line.

In FIGS. 3-5, the first conductive lines 211-291, 212-292 and 213-293 may be nine layers. However, the first conductive lines 211-291, 212-292 and 213-293 need not be limited thereto. For example, the first conductive lines may be provided to at least eight layers of memory cells and at least two layers of selection transistors. The first conductive lines may be provided to at least sixteen layers of memory cells and at least two layers of selection transistors. The first conductive lines may be provided to a plurality of layers forming memory cells and two layers forming selection transistors. For example, the first conductive lines may be provided to a layer forming dummy memory cells. Various configurations are contemplated.

In FIGS. 3-5, three NAND strings may be connected to one bit line. Example embodiments of the inventive concepts are not limited thereto. For example, in the memory block BLKi, an m number of NAND strings may be connected to one bit line. In this case, the number of conductive materials 211-291, 212-292 and 213-293 extending in the first direction and the number of doping regions 311-314 serving as a common source line may be determined in proportion to the number of NAND strings connected to one bit line BL.

In FIGS. 3-5, three NAND strings may be connected to one first conductive material extending in the first direction. Example embodiments of the inventive concepts are not limited thereto. For example, an n number of NAND strings may be connected to one first conductive material. The number of bit lines 331-333 may be determined in proportion to the number of NAND strings that are connected to one first conductive material.

As illustrated in FIGS. 3-5, the cross-sectional area of the pillar 113 in the first and third directions may decrease progressively closer to the substrate 111. For example, the cross-sectional area of the pillar 113 in the first and third directions may vary due to the characteristic or error of a process. The pillar 113 may be formed by providing materials, for example, a silicon material and an insulating material to a hole that may be formed by etching. As an etched depth increases, a cross-sectional area of a hole formed by etching may decrease in the first and third directions. The cross-sectional area of the pillar 113 in the first and third directions may decrease as a function of distance to the substrate 111.

Figure 6:
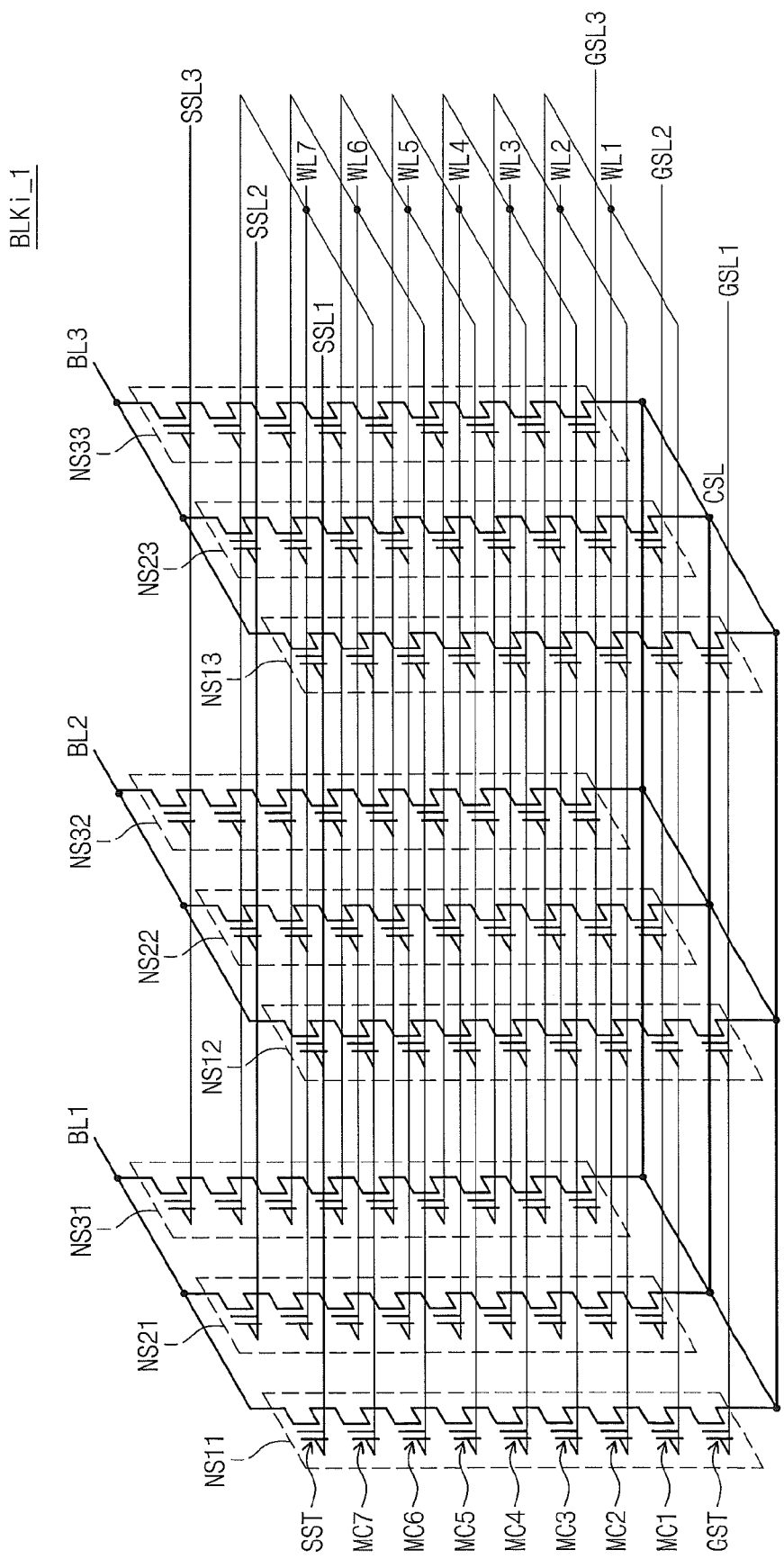

FIG. 6 is a circuit diagram illustrating an equivalent circuit BLIKi_1 of the memory block BLKi which is described with reference to FIGS. 3-5. Referring to FIGS. 3-5, NAND strings NS11, NS21 and NS31 may be between a first bit line BL1 and a common source line CSL. NAND strings NS12, NS22 and NS32 may be between a second bit line BL2 and the common source line CSL. NAND strings NS13, NS23 and NS33 may be between a third bit line BL3 and the common source line CSL. The first to third bit lines BL1-BL3 may correspond to the second conductive materials 331-333 extending in the third direction. The string selection transistor SST of each NAND string NS may be connected to a corresponding bit line BL.

The ground selection transistor GST of each NAND string NS may be connected to the common source line CSL. Memory cells MC may be provided between the string selection transistor SST and common source line CSL of each NAND string NS. Hereinafter, NAND strings NS may be defined in row and column units. The NAND strings NS, which may be connected to one bit line in common, may form one column. For example, the NAND strings NS11-NS31 connected to the first bit line BL1 may correspond to a first column. The NAND strings NS12-NS32 connected to the second bit line BL2 may correspond to a second column. The NAND strings NS13 to NS33 connected to the third bit line BL3 may correspond to a third column. The NAND strings that are connected to one string selection line SSL may form one row.

For example, the NAND strings NS11, NS12 and NS13 may be connected to a first string selection line SSL1 and form a first row. The NAND strings NS21, NS22 and NS23 may be connected to a second string selection line SSL2 and form a second row. The NAND strings NS31, NS32 and NS33 may be connected to a third string selection line SSL3 and form a third row.

In each NAND string NS, a height may be defined. For example, in each NAND string NS, the height of the ground selection transistor GST may be defined as 1. The height of a memory cell MC1 adjacent to the ground selection transistor GST may be defined as 2, The height of the string selection transistor SST may be defined as 9. The height of a memory cell MC7 adjacent to the string selection transistor SST may be defined as 8. As a distance between the memory cell MC and the ground selection transistor GST increases, the height of the memory cell MC may increase. The first to seventh memory cells MC1-MC7 may be defined as having second to eighth heights.

The NAND strings NS of the same row may share a ground selection line GSL1, GSL2 or GSL3. The NAND strings NS of different rows may be connected to the ground selection lines GSL1-GSL3. The ground selection lines GSL1-GSL3 may correspond to the first conductive lines 211-213 with the first height. Hereinafter, first ground selection transistors GST1 may be defined as ground selection transistors GST connected to the first ground selection line GSL1. Second ground selection transistors GST2 may be defined as ground selection transistors GST connected to the ground string selection line GSL2. Third ground selection transistors GST3 may be defined as ground selection transistors GST connected to the third ground selection line GSL3.

The memory cells MC with the same height in the NAND strings NS of a same row may share a word line WL. The word lines WL of NAND strings NS that may be the same height and may correspond to different rows may be connected in common. Memory cells with the same height may share the word line WL. The first conductive lines 221-223 with a second height may be connected in common and may be a first word line WL1. The first conductive lines 231-233 with a third height may be connected in common and may be a second word line WL2.

The first conductive lines 241-243 with a fourth height may be connected in common and may be a third word line WL3. The first conductive lines 251-253 with a fifth height may be connected in common and may be a fourth word line WL4. The first conductive lines 261-263 with a sixth height may be connected in common and may be a fifth word line WL5. The first conductive lines 271-273 with a seventh height may be connected in common and may be a sixth word line WL6. The first conductive lines 281-283 with an eighth height may be connected in common and may be a seventh word line WL7.

The NAND strings NS of a same row may share a string selection line SSL. The NAND strings NS of different rows may be connected to string selection lines SSL1-SSL3. The first to third string selection lines SSL1-SSL3 may correspond to the first conductive lines 291-293 with a ninth height. Hereinafter, first string selection transistors SST1 may be defined as string selection transistors SST connected to the first string selection line SSL1. Second string selection transistors SST2 may be defined as string selection transistors SST connected to the second string selection line SSL2. Third string selection transistors SST3 may be defined as string selection transistors SST connected to the third string selection line SSL3.

The common source line CSL may be connected to the NAND strings NS in common. For example, in an active region on the substrate 111, the first to fourth doping regions 311-314 may be connected and thereby may form the common source line CSL Referring to FIG. 6, the word lines WL with the same height may be connected in common. When a specific word line WL is selected, all NAND strings NS connected to the specific word line WL may be selected. The NAND strings NS of different rows may be connected to different string selection lines SSL. By selecting and unselecting the string selection lines SSL1-SSL3, the NAND strings NS of an unselected row among NAND strings NS connected to the same word line WL may be electrically disconnected from a corresponding bit line, and the NAND strings of a selected row may be electrically connected to a corresponding bit line.

The NAND strings of different rows may be connected to different ground selection lines GSL. By selecting and unselecting the string selection lines SSL1-SSL3, a row of the NAND strings NS may be selected. By selecting the bit lines BL1-BL3, the NAND strings NS of a selected row may be selected in column units. For example, one of the string selection lines SSL1-SSL3 may be selected in a programming and reading operation. The programming and reading operation may be performed in the row units of the NAND strings NS11-NS13, NS21-NS23 and NS31-NS33.

According to example embodiments of the inventive concepts, in a programming and reading operation, a selection voltage may be applied to the selected word line of a selected row and a non-selection voltage may be applied to unselected word lines. For example, a selection voltage may be a program voltage or a read voltage. As an example, a non-selection voltage may be a pass voltage or a non-selection read voltage. The programming and reading operations may be performed in word line units of the selected row of the NAND strings NS11-NS13, NS21-NS23 and NS31-NS33.

According to example embodiments of the inventive concepts, widths of the insulating materials 112, which may be between first conductive lines serving as selection lines and first conductive lines serving as word lines among the first conductive lines 211-291, 212-292 and 213-293, may be greater than those of other insulating materials 112. The first conductive lines 211-213 with the first height may serve as ground selection lines GSL and the first conductive lines 291-293 with the ninth height may serve as the string selection lines SSL1-SSL3.

The widths of the insulating materials 112, which may be between the first conductive lines 211-213 with the first height and the first conductive lines 221-223 with the second height in the second direction may be greater than those of the insulating materials 112, which may be between the first conductive lines 221-223 with the second height and the conductive lines 281-283 with the eighth height in the second direction. Widths of the insulating materials 112, which may be between the first conductive lines 281-283 with the eighth height and the first conductive lines 291-293 with the ninth height may be greater than those of the insulating materials 112, which may be between the first conductive lines 221-223 with the second height and the conductive lines 281-283 with the eighth height in the second direction.

Figures 7, 8:
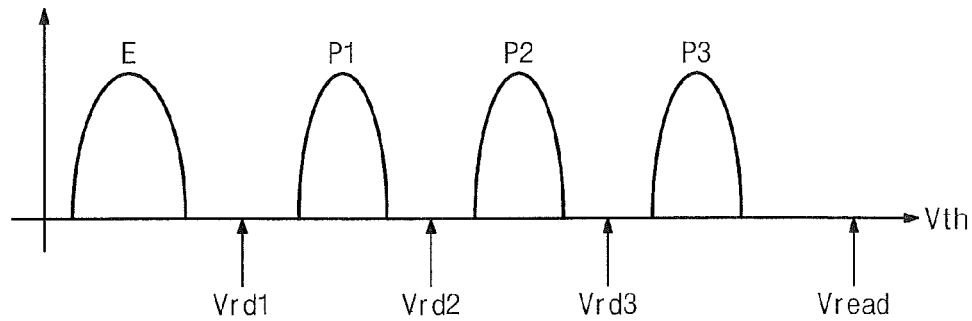

FIG. 7 is a diagram illustrating threshold voltage dispersion of a memory cell MC. According to example embodiments of the inventive concepts, a memory cell MC may have a threshold voltage dispersion corresponding to four logic states. For purposes of explanation it may be assumed that the memory cell MC may store two bits. However, the memory cell MC is not be limited thereto and any number of bits may be stored in one memory cell. Referring to FIGS. 6 and 7, a memory cell MC may have an erasure state E and a threshold voltage corresponding to one of first to third program states P1-P3. According to example embodiments of the inventive concepts, when data is not written in the memory cell MC, the memory cell MC may have the erasure state E. When data is written in the memory cell MC, the memory cell MC may have the erasure state E and a state corresponding to the written data among one of first to third program states P1-P3.

A reading operation may include a pre-charge operation and a developing operation. In the pre-charge operation, the bit lines BL1-BL3 may be pre-charged to a bit line voltage. In the developing operation, a selection read voltage Vrd may be applied to a selected word line (e.g., WL4), and a non-selection read voltage Vread may be applied to unselected word lines (e.g., WL1-WL3 and WL5-WL7). For example, it may be assumed for purposes of explanation that a first selection read voltage Vrd1 may be applied to a selected word line (e.g., WL4). When the first selection read voltage Vrd1 is applied to the selected word line (e.g., WL4), a selected memory cell (e.g., MC4) may be turned on/off with a threshold voltage.

The non-selection read voltage Vread may be applied to unselected word lines (e.g., WL1-WL3 and WL5-WL7). The non-selection read voltage Vread may have a voltage level for turning on unselected memory cells MC1-MC3 and MC4-MC7. The unselected memory cells MC1-MC3 and MC4-MC7 may have one of an erasure state E and first to third program states P1-P3. The non-selection read voltage Vread1 may be a greater (e.g., of greater absolute value) voltage than that of the third program state P3. When the selected memory cell MC4 is turned on, a channel may be formed in a NAND string corresponding to the selected memory cell MC4. The pre-charged voltage of a bit line may be discharged to a common source line CSL through the NAND string NS.

When the selected memory cell MC4 is turned off, a channel may not be formed in the NAND string corresponding to the selected memory cell MC4. The pre-charged voltage of the bit line may be maintained. The logic state of the selected memory cell MC4 may be determined according to whether the pre-charged voltage of the bit line is changed. When the pre-charged voltage of the bit line is changed, a threshold voltage of the selected memory cell MC4 may be less (e.g., of smaller absolute value) than the first selection read voltage Vrd1. The selected memory cell MC4 may be determined to be in the erasure state E. When the pre-charged voltage of the bit line is maintained, a threshold voltage of the selected memory cell MC4 may be greater than the first selection read voltage Vrd1. The selected memory cell MC4 may be determined as being in one of the first to third program states P1-P3.

The methods that are described above on the basis of the first read voltage Vrd1 may be identically or similarly applied to a reading operation using second and third selection read voltages Vrd2 and Vrd3. By selectively reading the selected memory cell MC4 with the first to third selection read voltages Vrd1-Vrd3, data written in the selected memory cell MC4 may be determined. A voltage level of the non-selection read voltage Vread may be greater than that of the highest threshold voltage (e.g., P3) in a memory cell MC with written data. In a reading operation, the threshold voltages of the unselected memory cells MC1-MC3 and MC5-MC7 may be boosted by the non-selection read voltage Vread. A read disturbance may occur.

The non-selection read voltage Vread may be controlled so as to sufficiently secure a cell current in a NAND string NS. When the level of the non-selection read voltage Vread is highly controlled based on the cell current, read disturbance may increase. Hereinafter, a reading operation where the non-selection read voltage Vread is applied to a specific memory cell may be defined as a disturbance read for the specific memory cell. It may be assumed for purposes of explanation that data written in a memory block BLKi_1 may be read. When a selection read voltage Vrd is applied to a first word line WL1, a non-selection read voltage may be applied to second to seventh word lines WL2-WL7. A disturbance read may occur in the unselected memory cells MC2-MC7.

When the selection read voltage Vrd is applied to the second word line WL2, the non-selection read voltage may be applied to the third to seventh word lines WL1 and WL3-WL7, A disturbance read may occur in the unselected memory cells MC1 and MC3-MC7. When the selection read voltage Vrd is sequentially applied to the second to seventh word lines WL2-WL7, a disturbance read may occur six times in the first memory cell MC1 connected to the first word line WL1. The NAND strings NS11-NS13, NS21-NS23 and NS31-NS33 of the memory block BLKi may be configured in three rows. Memory cells MC of the same height may share a word line even when they are in different rows.

When a reading operation is performed in the NAND strings NS11-NS13 of a first row, the selection read voltage Vrd and the non-selection read voltage Vread may also be applied to the NAND strings NS21-NS23 of a second row and the NAND strings NS31-NS33 of a third row. When a reading operation is performed in the NAND strings NS21-NS23 of the second row, the selection read voltage Vrd and the non-selection read voltage Vread may also be applied to the NAND strings NS11-NS13 of the first row and the NAND strings NS31-NS33 of a third row. When data written in the memory block BLKi_1 is read, the number of times a disturbance read occurs in one memory cell MC of the memory block BLKi_1 may be defined as Equation (1) where the number of shared word lines denotes the number of rows of NAND strings NS sharing a word line.

$$(\text{number of word lines}-1) \times (\text{number of shared word lines}) \quad (1)$$

When a memory cell MC is a Multi-Level Cell (MLC), the number of read times for determining data written in the memory cell MC may increase. When data written in the memory block BLKi_1 is read, the number of times a disturbance read occurs in one memory cell MC of the memory block BLKi_1 may be expressed as Equation (2).

$$(\text{number of word lines}-1) \times (\text{number of shared word lines}) \times (\text{number of times reading MLC}) \quad (2)$$

According to example embodiments of the inventive concepts, when the number of word lines is 8, the number of shared word lines is 8 and the number of times an MLC is read is 4, the number of times a disturbance read occurs in one memory cell MC may be 224.

For process reasons, the number of word lines and the number of shared word lines may have a specific relationship. For example, for process reasons, the number of word lines may accord with the number of shared word lines. When the number of word lines increases, the number of shared word lines may increase.

FIG. 8 is a table illustrating a number of disturbance reads in a memory cell MC according to the number of word lines and the number of shared word lines. Referring to FIG. 8 and Equation (2), when the number of word lines WL is 8, a disturbance read may occur 224 times in one memory cell MC in reading a memory block BLKi_1. When the memory block BLKi_1 is read a hundred thousand times, disturbance read may occur 22400K times in one memory cell MC. When the number of word lines is 16, a disturbance read may occur 960 times in one memory cell MC in reading the memory block BLKi_1. When the memory block BLKi_1 is read a hundred thousand times, a disturbance read may occur 96000K times in one memory cell MC. When the numbers of word lines are 24, 32, 56, 64, 96 and 128, the number of disturbance read times may be shown.

As expressed in Equation (2) and Illustrated in FIG. 8, when the number of word lines WL may increase arithmetically, the number of disturbance read times may increase exponentially. As the number of word lines increases, reliability of data stored in the memory block BLKi_1 may decrease. For preventing or reducing such a limitation, the nonvolatile memory device 100 according to example embodiments of the inventive concepts may provide a reading method for preventing and/or reducing read disturbance.

Figure 9:
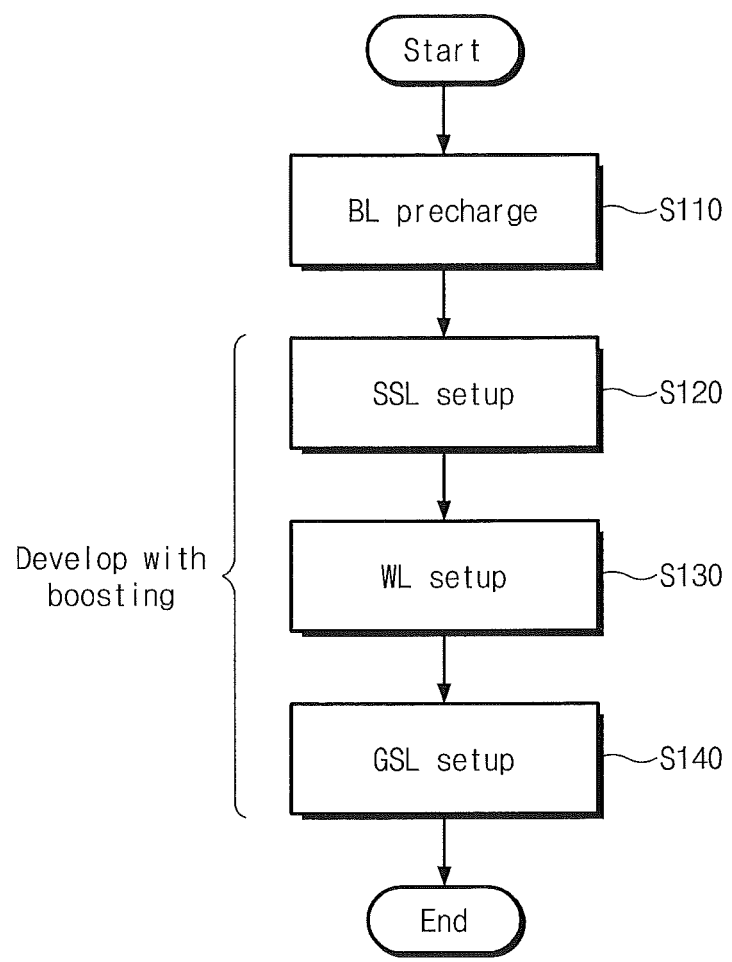

FIG. 9 is a flowchart illustrating reading methods according to example embodiments of the inventive concepts. Referring to FIGS. 6 and 9, a bit line may be pre-charged in operation S110. In operation S120, the string selection lines SSL1-SSL3 may be set up. In operation S130, the word lines WL1-WL7 may be set up. In operation 5140, the ground selection lines GSL1-GSL3 may be set up. The setup operation S120 of the string selecting lines SSL1-SSL3, the setup operation 5130 of the word lines WL1-WL7 and the setup operation S140 of the ground selection lines GSL1-GSL3 may be part of a developing operation which accompanies boosting.

Hereinafter, for purposes of explanation, it may be assumed that the NAND strings NS21-NS23 of the second row may be selected. The second string selection line SSL2 and the second ground selection line GSL2 may be selected. The first and third string selection lines SSL1 and SSL3 and the first and third ground selection lines GSL1 and GSL3 may not be selected. For purposes of explanation it may be assumed that the fourth word line WL4 is selected.

Figure 11:
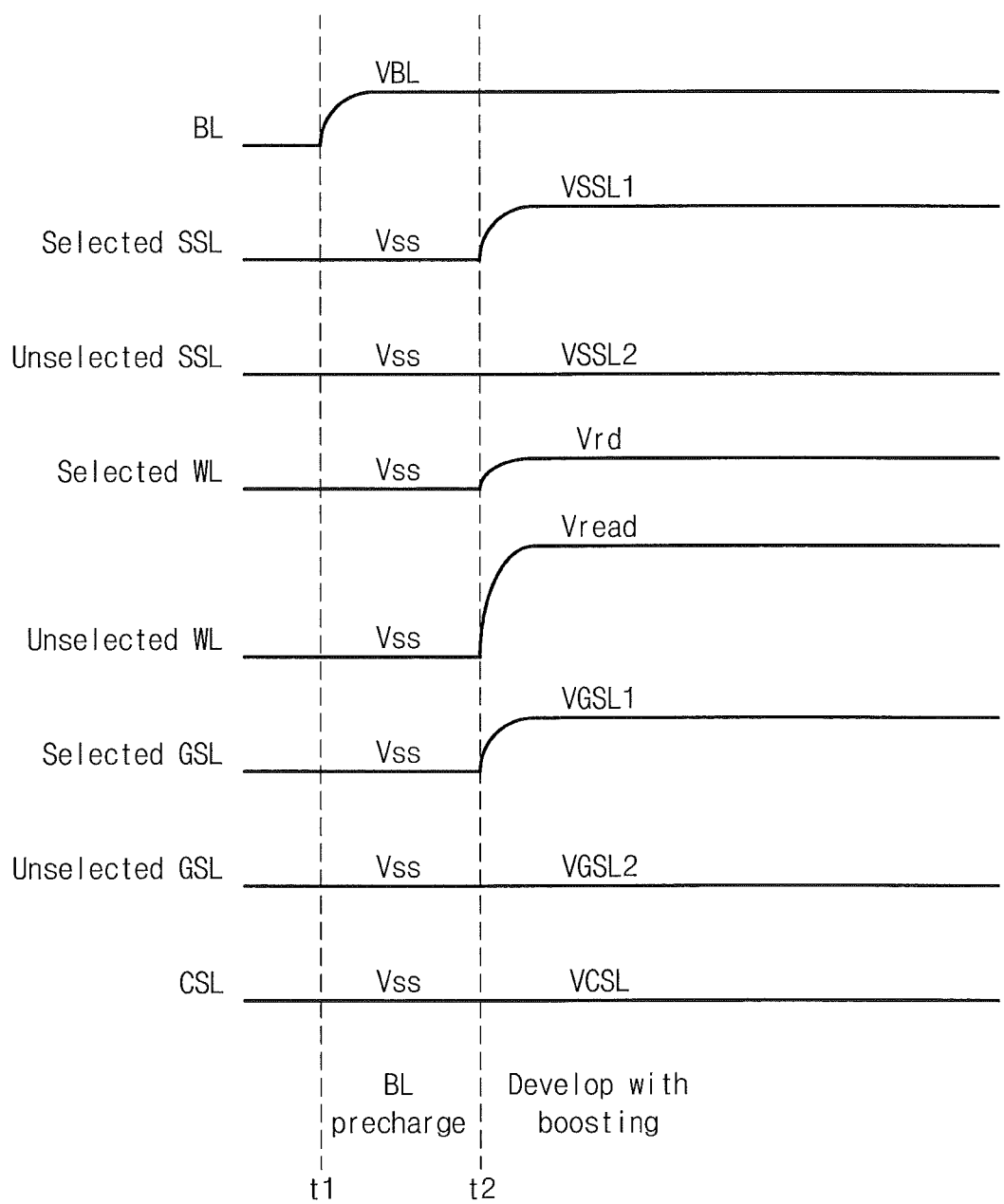

FIG. 10 is a table illustrating a voltage condition according to example embodiments of the reading method of FIG. 9. FIG. 11 is a timing diagram illustrating voltage changes based on the voltage condition of FIG. 10. Referring to FIGS. 6 and 9-11, bit lines BL may be pre-charged to a bit line voltage VBL at a first time t1. For example, the bit line voltage VBL may be a power source voltage Vcc. A developing operation which accompanies boosting may be performed at a second time t2. A first string selection line voltage VSSL1 may be applied to a selected string selection line SSL2. The first string selection line voltage VSSL1 may be a voltage level for turning on a selected string selection transistor SST2. For example, the first string selection line voltage VSSL1 may be the power source voltage Vcc.

A second string selection line voltage VSSL2 may be applied to unselected string selection lines (e.g., SSL1 and SSL3). The second string selection line voltage VSSL2 may be a voltage level for turning off unselected string selection transistors SST1 and SST3. For example, the second string selection line voltage VSSL2 may be a ground voltage Vss. A read voltage Vrd may be applied to a selected word line WL4. A non-selection read voltage Vread may be applied to unselected word lines WL1-WL3 and WL5-WL7. A first ground selection line voltage VGSL1 may be applied to a selected ground selection line GSL2. The first ground selection line voltage VGSL1 may be a voltage level for turning on a selected ground selection transistor GST2. For example, the first ground selection line voltage VGSL1 may be the power source voltage Vcc.

A second ground selection line voltage VGSL2 may be applied to unselected ground selection lines GSL1 and GSL3. The second ground selection line voltage VGSL2 may be a voltage level for turning off unselected ground selection transistors GST1 and GST3. For example, the second ground selection line voltage VGSL2 may be the ground voltage Vss. A common source line voltage VCSL may be applied to the common source line CSL. For example, the common source line voltage VCSL may be the ground voltage Vss. The first string selection line voltage VSSL1 and the first ground selection line voltage VGSL1 may be applied to the second string selection line SSL2 and the second ground selection line GSL2. The selected NAND strings NS21-NS23 of the second row may be connected to bit lines BL1-BL3 and may be connected to the common source line CSL.

The unselected read voltage Vread may be applied to unselected word lines WL1-WL3 and WL5-WL7. Unselected memory cells MC1-MC3 and MC5-MC7 connected to the unselected word lines WL1-WL3 and WL5-WL7 may be turned on. The selection read voltage Vrd may be applied to the selected word line WL4. The channel of the selected NAND strings NS21-NS23 of the second row may be induced at the threshold voltage of selected memory cells MC4 connected to the selected word line WL4. For example, when the selected memory cell MC4 is turned on with the selection read voltage Vrd a channel may be formed in a corresponding NAND string NS. A current may flow from a bit line BL to the common source line CSL through a NAND string NS. The voltage of the bit line BL may be changed. When the selected memory cell MC4 is turned off with the selection read voltage Vrd, a channel may not be induced in a corresponding NAND string NS. The voltage of the bit line BL may be maintained.

A bias condition for the NAND strings NS11-NS13 of the unselected first row will be described below. The second string selection line voltage VSSL2 and the second ground selection line voltage VGSL2 may be applied to the first string selection line SSL1 and the first ground selection line GSL1. The NAND strings NS11-NS13 of the unselected first row may be separated from bit lines BL1-BL3, and may be separated from the common source line CSL and floated. The unselected read voltage Vread may be applied to unselected word lines WL1-WL3 and WL5-WL7. Unselected memory cells MC1-MC3 and MC5-MC7 connected to the unselected word lines WL1-WL3 and WL5-WL7 may be turned on. The channel of the unselected memory cells MC1-MC3 and MC5-MC7 may be separated from the bit line BL1-BL3 and the common source line CSL and floated.

The channel voltage of the unselected memory cells MC1-MC3 and MC5-MC7 may be boosted with the non-selection read voltage Vread. The channel voltage of the unselected memory cells MC1-MC3 and MC5-MC7 may reach a boosting voltage Vboost. The control gates of the unselected memory cells MC1-MC3 and MC5-MC7 may be at the non-selection read voltage Vread and a channel voltage may be a boosted voltage Vboost. A difference between the voltage of the control gates of the unselected memory cells MC1-MC3 and MC5-MC7 and the channel voltage may be reduced through boosting, and read disturbances may be prevented and/or reduced in the unselected memory cells MC1-MC3 and MC5-MC7.

Boosting may be similarly performed with the non-selection read voltage Vread in the NAND strings NS31-NS33 of the unselected third row. Read disturbances due to the non-selection read voltage Vread may be prevented and/or reduced. According to example embodiments of the inventive concepts, in a developing section which accompanies boosting, the first string selection line voltage VSSL1, the selection read voltage Vrd, the non-selection read voltage Vread and the first ground selection line voltage VGSL1 may be applied at the second time t2. The first string selection line voltage VSSL1, the selection read voltage Vrd, the non-selection read voltage Vread and the first ground selection line voltage VGSL1 are not limited to being applied at the same time. For example, the first string selection line voltage VSSL1, the selection read voltage Vrd, the non-selection read voltage Vread and the first ground selection line voltage VGSL1 may be applied at time intervals therebetween. An order in which the first string selection line voltage VSSL1, the selection read voltage Vrd, the non-selection read voltage Vread and the first ground selection line voltage VGSL1 are applied may be variously changed and applied.

Figure 13:
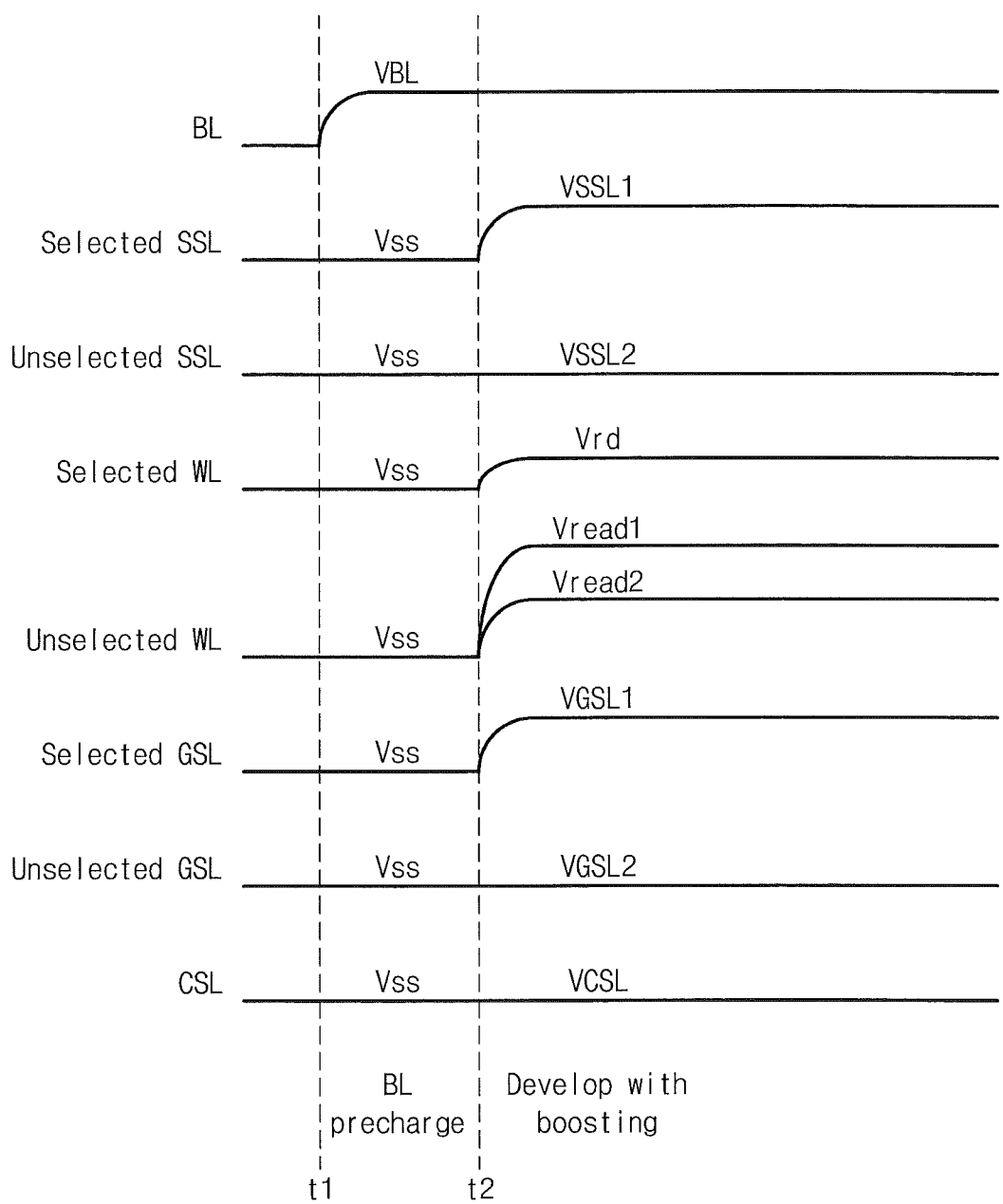

FIG. 12 is a table illustrating a voltage condition according to other example embodiments of the reading method of FIG. 9, FIG. 13 is a timing diagram illustrating voltage changes based on the voltage condition of FIG. 12. Referring to FIGS. 6, 9, 12 and 13, the bit lines BL1-BL3 may be pre-charged at the first time t1. The bit line voltage VBL may be pre-charged to the bit lines BL1 to BL3. For example, the bit line voltage VBL may be the power source voltage Vcc. A developing operation which accompanies boosting may be performed at the second time t2. Comparing with the above-described reading method with reference to FIGS. 10 and 11, first and second non-selection read voltages Vread1 and Vread2 may be applied to the unselected word lines WL1-WL3 and WL5-WL7.

According to example embodiments of the inventive concepts, the second non-selection read voltage Vread2 may be applied to at least one word line (e.g., WL1) adjacent to the ground selection lines GSL1-GSL3 among the unselected word lines WL1-WL3 and WL5-WL7. The second non-selection read voltage Vread2 may be applied to at least one word line (e.g., WL7) adjacent to the string selection lines SSL1-SSL3 among the unselected word lines WL1-WL3 and WL5-WL7. The first non-selection read voltage Vread1 may be applied to the other unselected word lines WL2, WL3, WL5 and WL6.

As described above with reference to FIGS. 10 and 11, the channel voltage of the unselected memory cells MC1-MC3 and MC5-MC7 in the NAND strings NS11-NS13 of the unselected first row may be boosted to a boosting voltage Vboost with the first and second non-selection read voltages Vread1 and Vread2. The second ground selection line voltage VGSL2, for example, the ground voltage Vss, may have been applied to the gate of the unselected ground selection transistor GST1. The channel voltage of the unselected memory cells MC1-MC3 and MC5-MC7 may be a relatively high voltage, but the gate voltage of the unselected ground selection transistor GST1 may be a relatively low voltage. Hot carriers may be generated by a difference between the channel voltage of the unselected memory cells MC1-MC3 and MC5-MC7 and the gate voltage of the unselected ground selection transistor GST1.

For example, hot carriers may be generated by an electric field that is generated by a voltage difference. As an example, hot carriers may be generated by Gate Induced Drain Leakage (GIDL). The hot carriers may lead to the change of the threshold voltage of the unselected memory cell MC7 adjacent to the unselected ground selection transistor GST1. The hot carriers may do damage to the unselected memory cell MC7 adjacent to the unselected ground selection transistor GST1. In a reading method according to the other example embodiments of the inventive concepts, a voltage level of the second non-selection read voltage Vread2 may be less than that of the first non-selection read voltage Vread1. A non-selection read voltage may incrementally increase from the second non-selection read voltage Vread2 to the first non-selection read voltage Vread1 as a function of distance from the unselected ground selection transistor GST1.

If the non-selection read voltage increases as a function of distance from the unselected ground selection transistor GST1, an electric field which may be generated by a voltage difference may be moderated. Boosting of the channel of the unselected memory cell MC1 adjacent to the unselected ground selection transistor GST1 may be moderated. Hot carriers may be prevented (or reduced) from being generated between the unselected memory cells MC1-MC3 and MC5-MC7 and the unselected ground selection transistor GST1. A non-selection read voltage may incrementally increase from the second non-selection read voltage Vread2 to the first non-selection read voltage Vread1 as a function of distance from the unselected string selection transistor SST1. Hot carriers may be prevented (or reduced) from being generated between the unselected memory cells MC1-MC3 and MC5-MC7 and the unselected ground selection transistor GST1.

Similarly, hot carriers may be prevented (or reduced) from being generated between the NAND strings NS11-NS13 and NS31-NS33 of the unselected first and third rows. Reliability of the nonvolatile memory device 100 may be enhanced. For example, the first non-selection read voltage Vread1 may be a same voltage level as that of the non-selection read voltage Vread described with reference to FIGS. 10 and 11. According to example embodiments of the inventive concepts, in a developing section which accompanies boosting, the first string selection line voltage VSSL1, the selection read voltage Vrd, the first non-selection read voltage Vread1, the second non-selection read voltage Vread2 and the first ground selection line voltage VGSL1 may be applied at the second time t2.

The first string selection line voltage VSSL1, the selection read voltage Vrd, the first non-selection read voltage Vread1, the second non-selection read voltage Vread2 and the first ground selection line voltage VGSL1 are not limited to being applied at the same time. The first string selection line voltage VSSL1, the selection read voltage Vrd, the first non-selection read voltage Vread1, the second non-selection read voltage Vread2 and the first ground selection line voltage VGSL1 may be applied at time intervals therebetween. An order in which the first string selection line voltage VSSL1, the selection read voltage Vrd, the first non-selection read voltage Vread1, the second non-selection read voltage Vread2 and the first ground selection line voltage VGSL1 are applied may be variously changed and applied.

Figure 15:
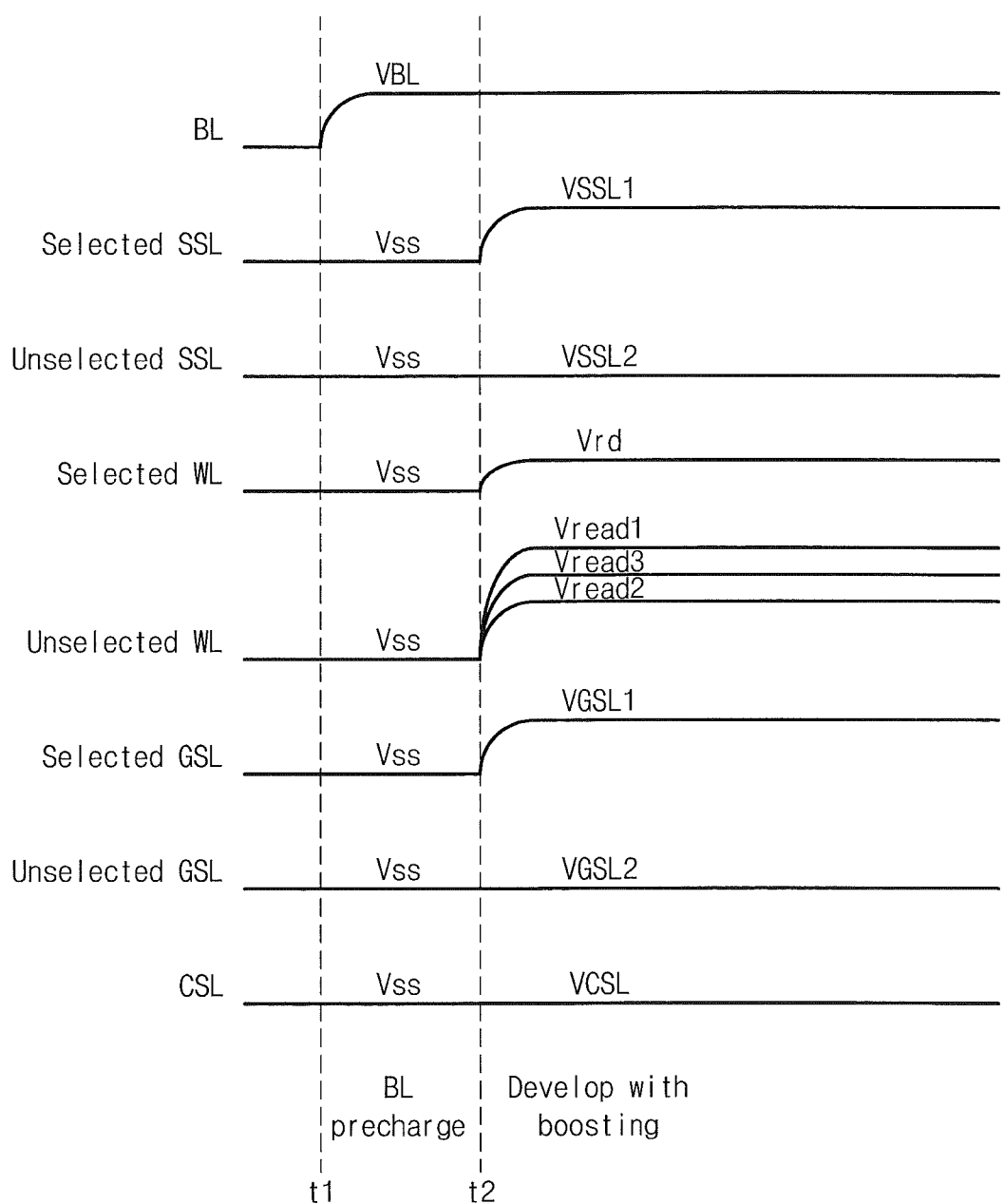

FIG. 14 is a table illustrating a voltage condition according to still other example embodiments of the reading method of FIG. 9. FIG. 15 is a timing diagram illustrating voltage changes based on the voltage condition of FIG. 14. Referring to FIGS. 14 and 15, the bit lines BL1-BL3 may be pre-charged at a first time t1. A bit line voltage VBL may be pre-charged to the bit lines BL1-BL3. For example, the bit line voltage VBL may be the power source voltage Vcc. A developing operation which accompanies boosting may be performed at a second time t2. First to third non-selection read voltages Vread1-Vread3 may be applied to the unselected word lines WL1-WL3 and WL5-WL7.

According to example embodiments of the inventive concepts, the second non-selection read voltage Vread2 may be applied to at least one word line (e.g., WL1) adjacent to the ground selection lines GSL1-GSL3 among the unselected word lines WL1-WL3 and WL5-WL7. The third non-selection read voltage Vread3 may be applied to at least one unselected word line (e.g., WL2) adjacent to at least one unselected word line (e.g., WL1) adjacent to the ground selection lines GSL1-GSL3 and receiving the second non-selection read voltage Vread2.

The second non-selection read voltage Vread2 may be applied to at least one word line (e.g., WL7) adjacent to the string selection lines SSL1-SSL3 among the unselected word lines WL1-WL3 and WL5-WL7. The third non-selection read voltage Vread3 may be applied to at least one unselected word line (e.g., WL6) adjacent to at least one unselected word line (e.g., WL7) adjacent to the string selection lines SSL1-SSL3 and receiving the second non-selection read voltage Vread2. The first non-selection read voltage Vread1 may be applied to the other unselected word lines (e.g., WL3 and WL5).

A voltage level of the third non-selection read voltage Vread3 may be less than that of the first non-selection read voltage Vread1 and greater than that of the second non-selection read voltage Vread2. A non-selection read voltage may incrementally increase from the second non-selection read voltage Vread2 to the third non-selection read voltage Vread3, and from the third non-selection read voltage Vread3 to the first non-selection read voltage Vread1, as a function of distance from the unselected ground selection transistor GST1.

Hot carriers may be prevented (or reduced) from being generated between the unselected memory cells MC1-MC3 and MC5-MC7 and the unselected ground selection transistor GST1. Hot carriers may be prevented (or reduced) from being generated between the unselected memory cells MC1-MC3 and MC5-MC7 and the unselected string selection transistor SST1. Hot carriers may be prevented (or reduced) from being generated between the NAND strings NS11-NS13 and NS31-NS33 of the unselected first and third rows.

According to example embodiments of the inventive concepts, in a developing section which accompanies boosting, the first string selection line voltage VSSL1, the selection read voltage Vrd, the first non-selection read voltage Vread1, the second non-selection read voltage Vread2, the third non-selection read voltage Vread3 and the first ground selection line voltage VGSL1 may be applied at the second time t2. However, the first string selection line voltage VSSL1, the selection read voltage Vrd, the first non-selection read voltage Vread1, the second non-selection read voltage Vread2, the third non-selection read voltage Vread3 and the first ground selection line voltage VGSL1 are not limited to being applied at the same time.

The first string selection line voltage VSSL1, the selection read voltage Vrd, the first non-selection read voltage Vread1, the second non-selection read voltage Vread2, the third non-selection read voltage Vread3 and the first ground selection line voltage VGSL1 may be applied at time intervals therebetween. An order in which the first string selection line voltage VSSL1, the selection read voltage Vrd, the first non-selection read voltage Vread1, the second non-selection read voltage Vread2, the third non-selection read voltage Vread3 and the first ground selection line voltage VGSL1 are applied may be variously changed and applied.

Figure 16:
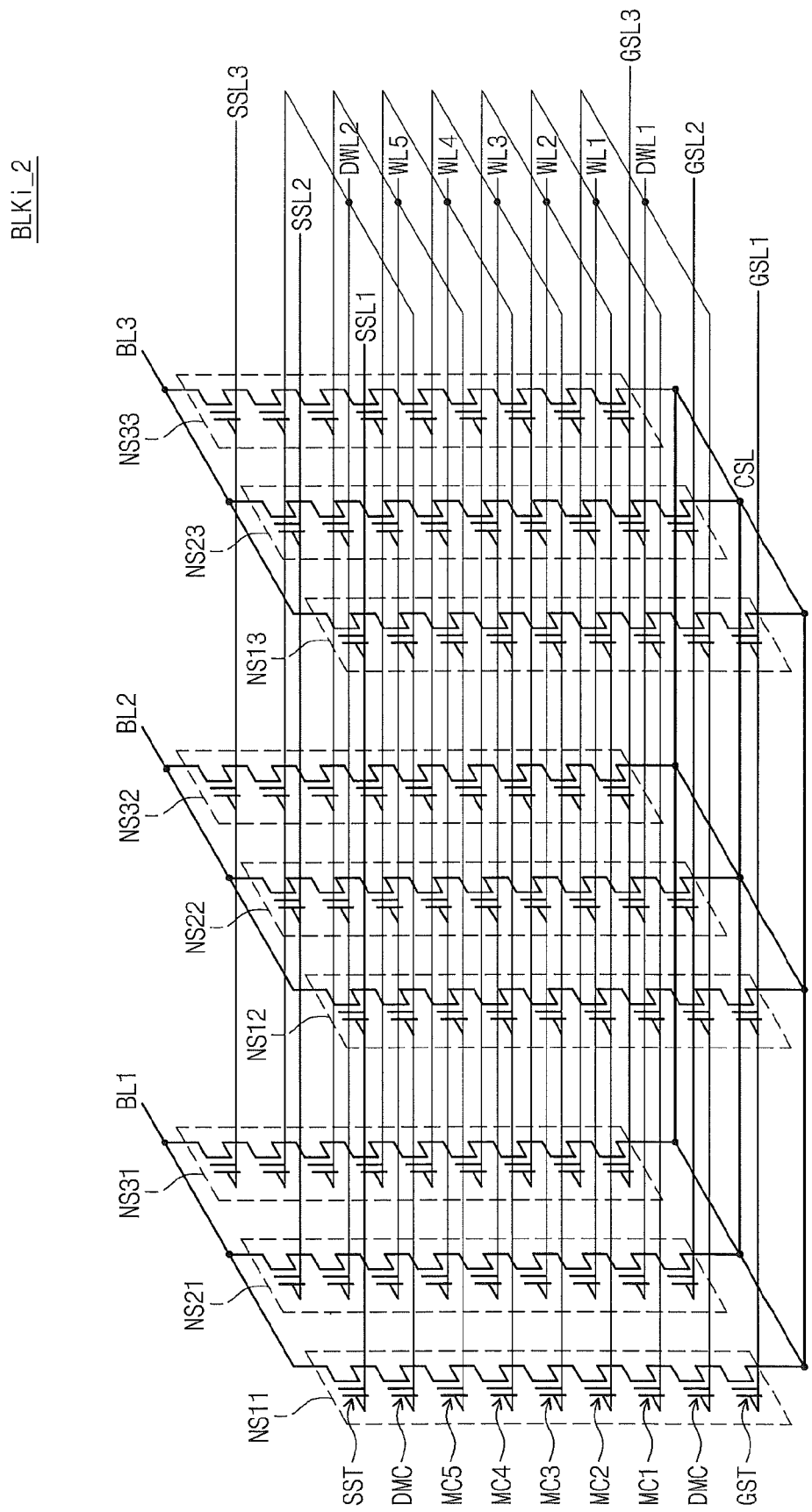

FIG. 16 is a circuit diagram illustrating an equivalent circuit BLKi_2 according to other example embodiments of the memory block BLKi described with reference to FIGS. 3-5. Dummy memory cell DMC may be between a ground selection transistor GST and the memory cells MC1-MC5, in each NAND string. Dummy memory cells DMC with a second height may be connected to a first dummy word line DWL1 in common. The first dummy word line DWL1 may be between ground selection lines GSL and word lines WL1-WL5. Dummy memory cells DMC may be provided between a string selection transistor SST and memory cells MC1-MC5, in each NAND string. Dummy memory cells DMC with an eighth height may be connected to a second dummy word line DWL2 in common. The second dummy word line DWL2 may be provided between string selection lines SSL1-SSL3 and the word lines WL1-WL5.

Figure 17:
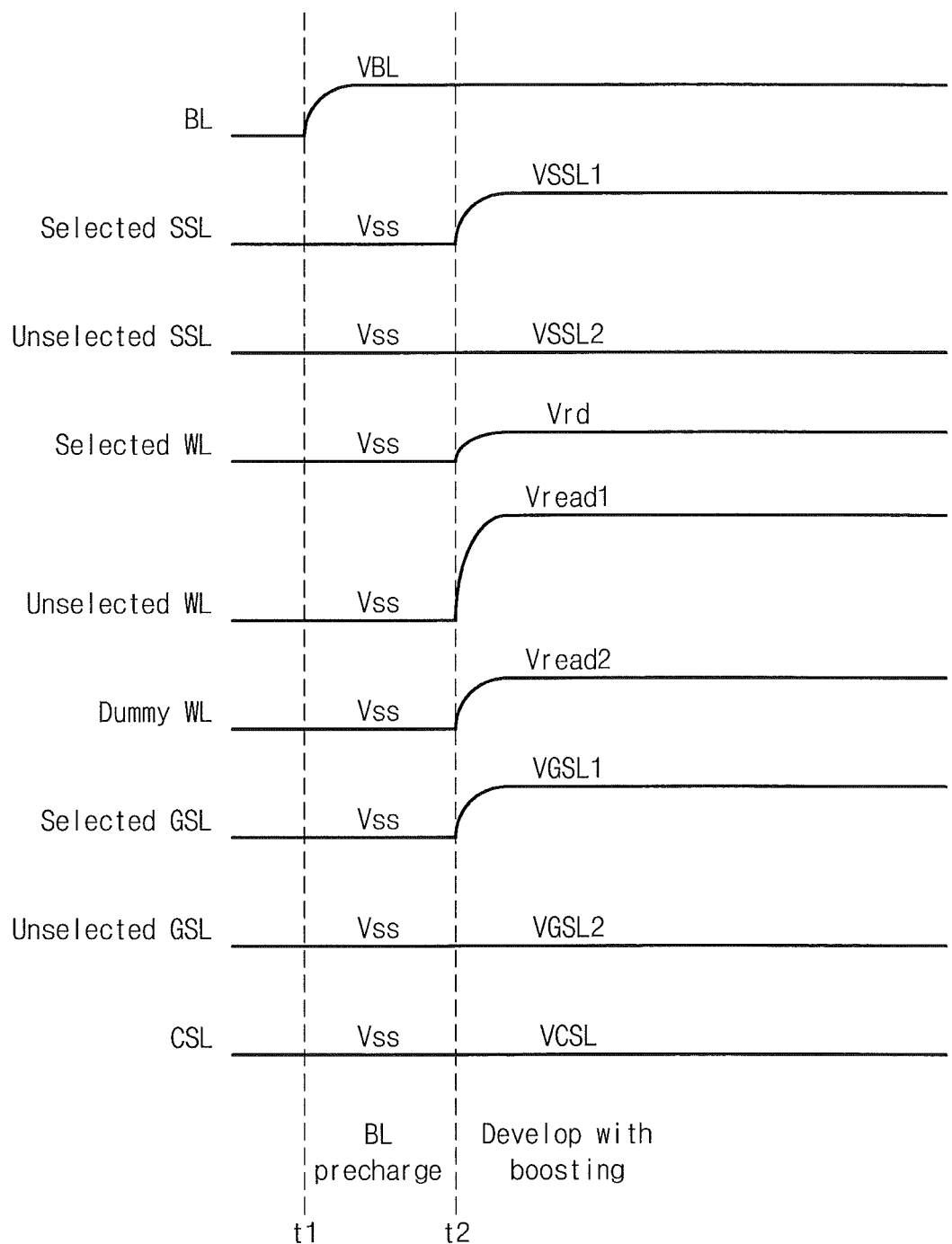

FIG. 17 is a timing diagram illustrating voltage changes in a reading operation of the memory block BLKi_2 of FIG. 16. Referring to FIGS. 16 and 17, a bit line may be pre-charged at a first time t1, and a developing operation which accompanies boosting may be performed at a second time t2. A reading operation of the memory block BLKi_2 may be performed identically or similarly to the methods described with reference to FIGS. 11 and 12, except that the second non-selection read voltage Vread2 may be applied to the first and second dummy word lines DWL1 and DWL2 other than unselected word lines.

According to example embodiments of the inventive concepts, the second non-selection read voltage Vread2 may be applied to at least one unselected word line adjacent to the first dummy word line DWL1 (not shown). The second non-selection read voltage Vread2 may be applied to at least one unselected word line adjacent to the second dummy word line DWL2 (not shown). According to example embodiments of the inventive concepts, the first string selection line voltage VSSL1, the selection read voltage Vrd, the first non-selection read voltage Vread1, the second non-selection read voltage Vread2 and the first ground selection line voltage VGSL1 may be applied at time intervals therebetween.

An order in which the first string selection line voltage VSSL1, the selection read voltage Vrd, the first non-selection read voltage Vread1, the second non-selection read voltage Vread2 and the first ground selection line voltage VGSL1 may be applied may be variously changed and applied. As described above with reference to FIGS. 14 and 15, according to example embodiments of the inventive concepts, the third non-selection read voltage Vread3 may be applied to unselected word lines between dummy word lines receiving the second non-selection read voltage Vread2 and unselected word lines receiving the first non-selection read voltage Vread1.

Figure 18:
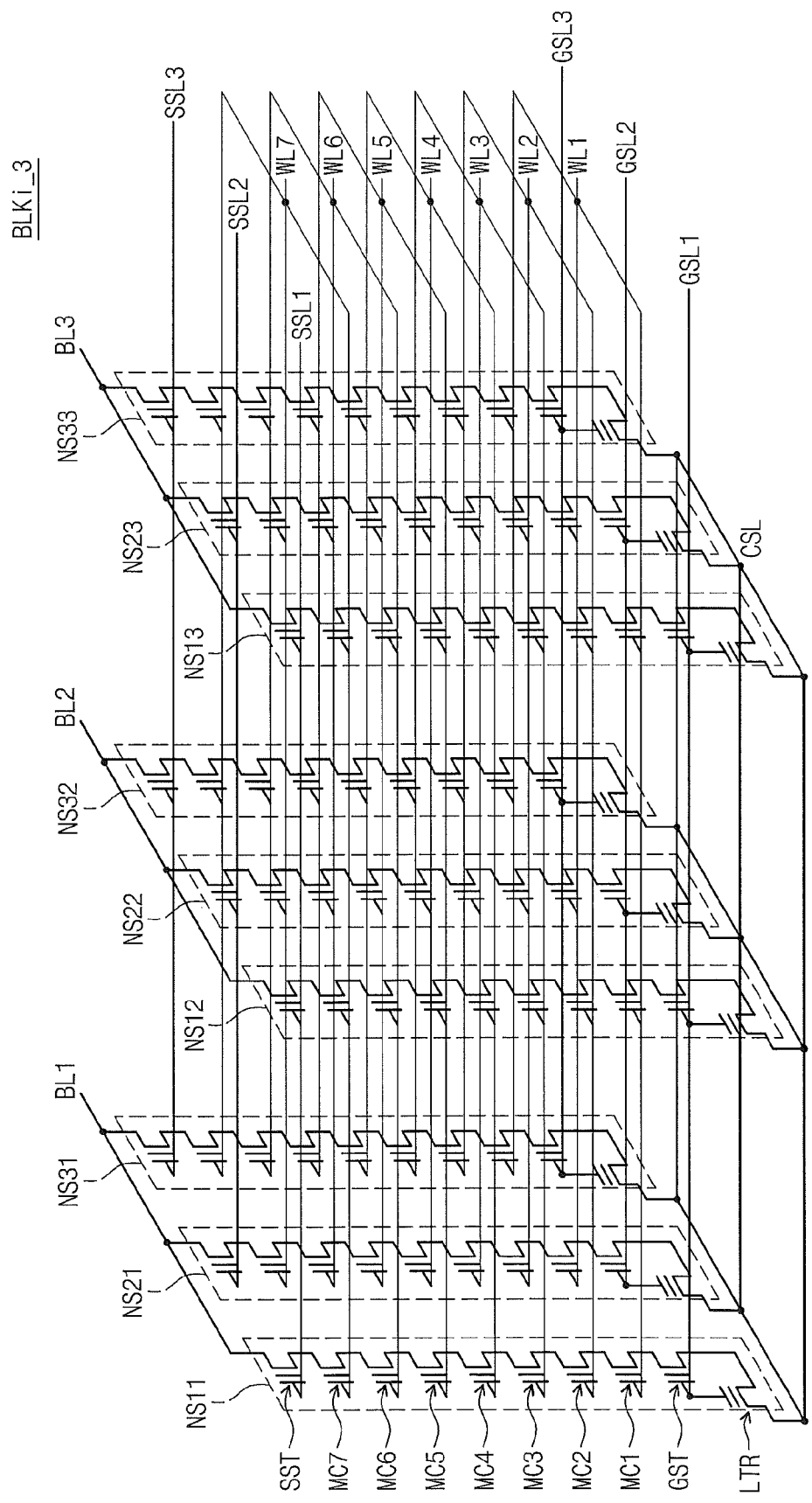

FIG. 18 is a circuit diagram illustrating an equivalent circuit BLKi_3 according to still other example embodiments of a memory block BLKi described with reference to FIGS. 3-5. Comparing with the equivalent circuit described with reference to FIG. 6, a lateral transistor LTR may be additionally provided to each NAND string NS of a memory block BLKi_3. The lateral transistor LTR may be connected to a ground selection transistor GST and a common source line CSL. The gate (or control gate) of the later transistor LTR may be connected to a ground selection line GSL together with the gate (or control gate) of the ground selection transistor GST.

As illustrated in FIGS. 3-6, conductive lines 211-213 with a first height may correspond to first to third ground selection lines GSL1-GSL3. When a specific voltage is applied to the first conductive lines 211-213 with the first height, a channel may be induced in a region of a surface layer corresponding to the first conductive lines 211-213. A channel may be induced in ground selection transistors GST. When a specific voltage is applied to the first conductive lines 211-213 a channel may be induced in a region of a substrate 111 adjacent to the first conductive lines 211-213. For example, a first doping region 311 may be connected to the channel which is induced in the substrate 111 with the voltage of the first conductive line 211.

The channel which is induced in the substrate 111 with the voltage of the first conductive line 211 may be connected to a channel which is induced in the surface layer 114 serving as a second-direction body with the voltage of the first conductive line 211. A channel may be induced in the substrate 111 with the voltages of the first conductive lines 211-213. First to fourth doping regions 311-314 may be connected to the surface layer 114 serving as a second-direction body through the channel that is induced in the substrate 111 with the voltages of the first conductive lines 211-213. As described above with reference to FIGS. 3-6, the first to fourth doping regions 311-314 may be connected in common and thereby form a common source line CSL.

The channels of the memory cells MC1-MC7 and the common source line CSL may be electrically connected through a channel that is formed with the voltage of a ground selection line GSL and is vertical to the substrate 111, and a channel that is formed with the voltage of the ground selection line GSL and is parallel to the substrate 111. It may be understood that provided are a transistor which is driven by the ground selection line GSL and is vertical to a substrate, and a transistor which is driven by the ground selection line GSL and is parallel to the substrate, between the memory cells MC1-MC7 and the common source line CSL. It may be understood that the transistor vertical to the substrate is a ground selection transistor GST and the transistor parallel to the substrate is a lateral transistor LTR.

Figure 19:
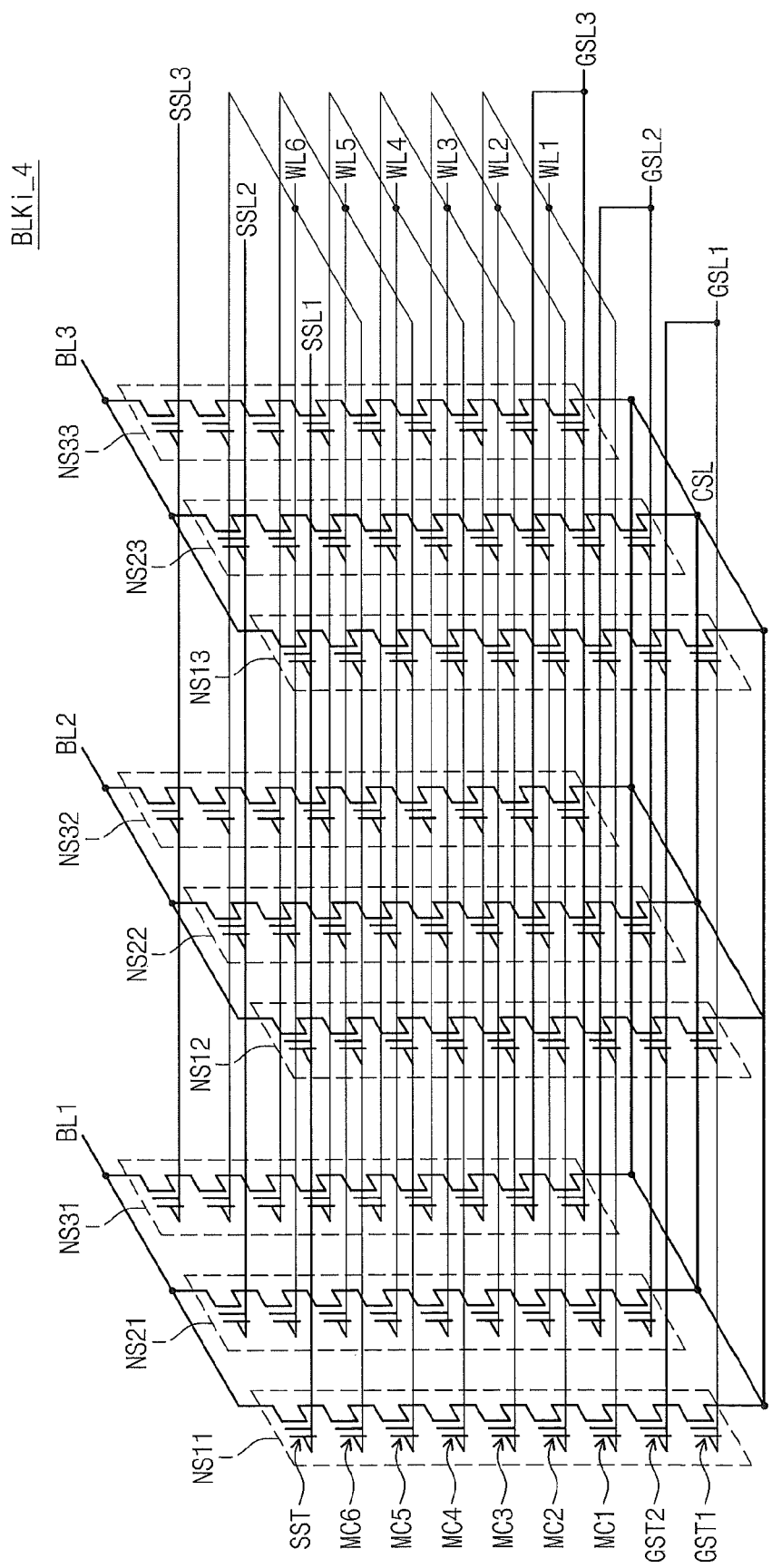

FIG. 19 is a circuit diagram illustrating an equivalent circuit BLKi_4 according to further example embodiments of a memory block BLKi described with reference to FIGS. 3-5. Comparing with the memory block BLKi_1 of FIG. 6, in each NAND string NS, two ground selection transistors GST1 and GST2 may be provided between memory cells MC1-MC6 and a common source line CSL. In NAND strings of a same row, the ground selection transistors GST1 and GST2 may be connected to one ground selection line GSL. The ground selection transistors GST1 and GST2 of the NAND strings NS11-NS13 of a first row may be connected to a first ground selection line GSL1 in common. The ground selection transistors GST1 and GST2 of the NAND strings NS21-NS23 of a second row may be connected to a second ground selection line GSL2 in common. The ground selection transistors GST1 and GST2 of the NAND strings NS31-NS33 of a third row may be connected to a third ground selection line GSL3 in common.

Figure 20:
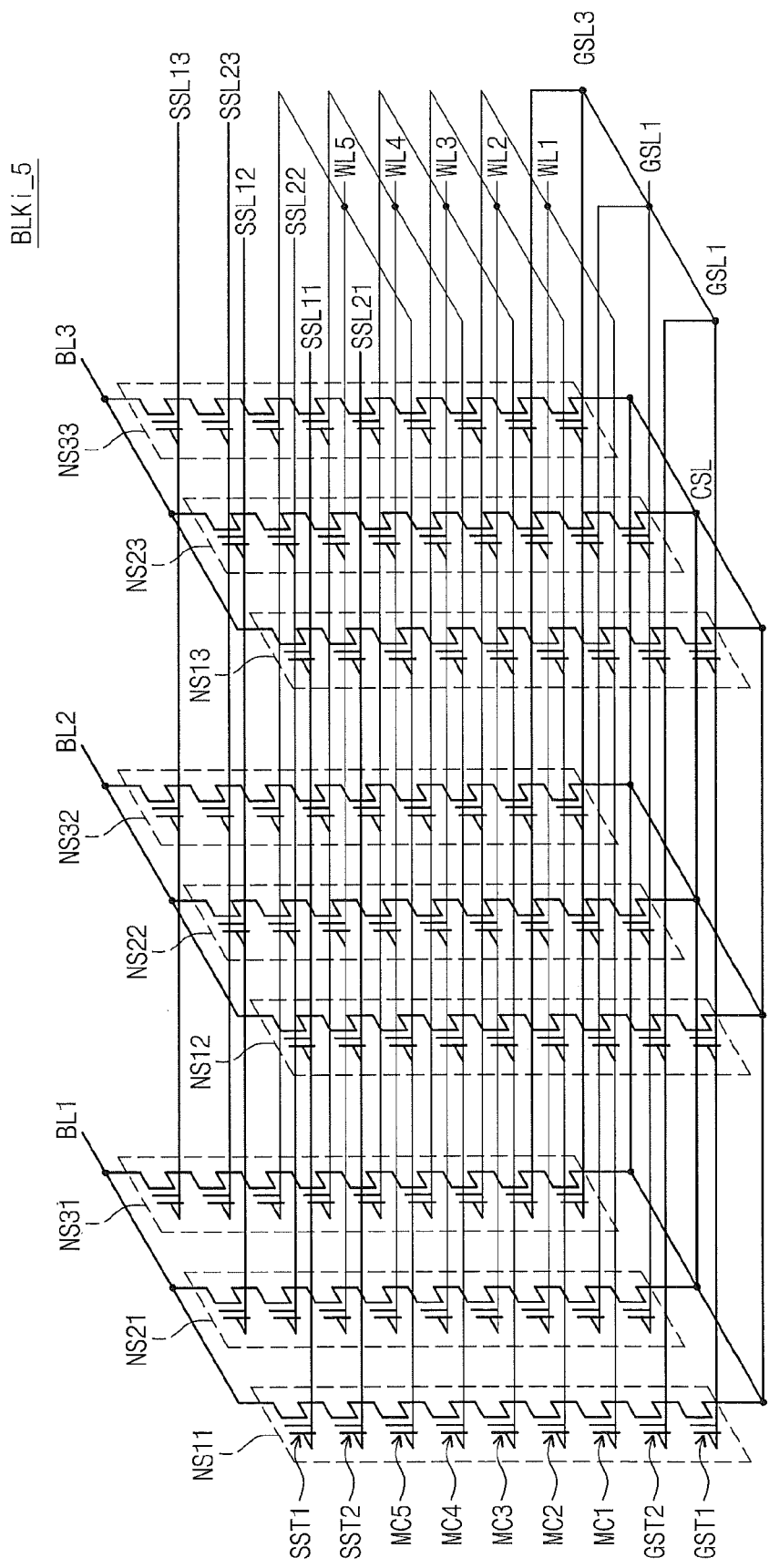

FIG. 20 is a circuit diagram illustrating an equivalent circuit BLKi_5 according to still further example embodiments of a memory block BLKi described with reference to FIGS. 3-5. Comparing with the memory block BLKi_4 of FIG. 19, in each NAND string NS, two string selection transistors SST1 and SST2 may be provided between memory cells MC1-MC5 and a bit line BL. In NAND strings of a same row, string selection transistors SST with the same height may share one string selection line SSL. For example, in the NAND strings NS11-NS13 of a first row, first string selection transistors SST1 may share an $11^{th}$ string selection line SSL11. Second string selection transistors SST2 may share a twenty-first string selection line SSL21.

In NAND strings NS21-NS23 of a second row, the first string selection transistors SST1 may share a twelfth string selection line SSL12. The second string selection transistors SST2 may share a twenty-second string selection line SSL22. In NAND strings NS31-NS33 of a third row, the first string selection transistors SST1 may share a thirteenth string selection line SSL13. The second string selection transistors SST2 may share a twenty-third string selection line SSL23.

Figure 21:
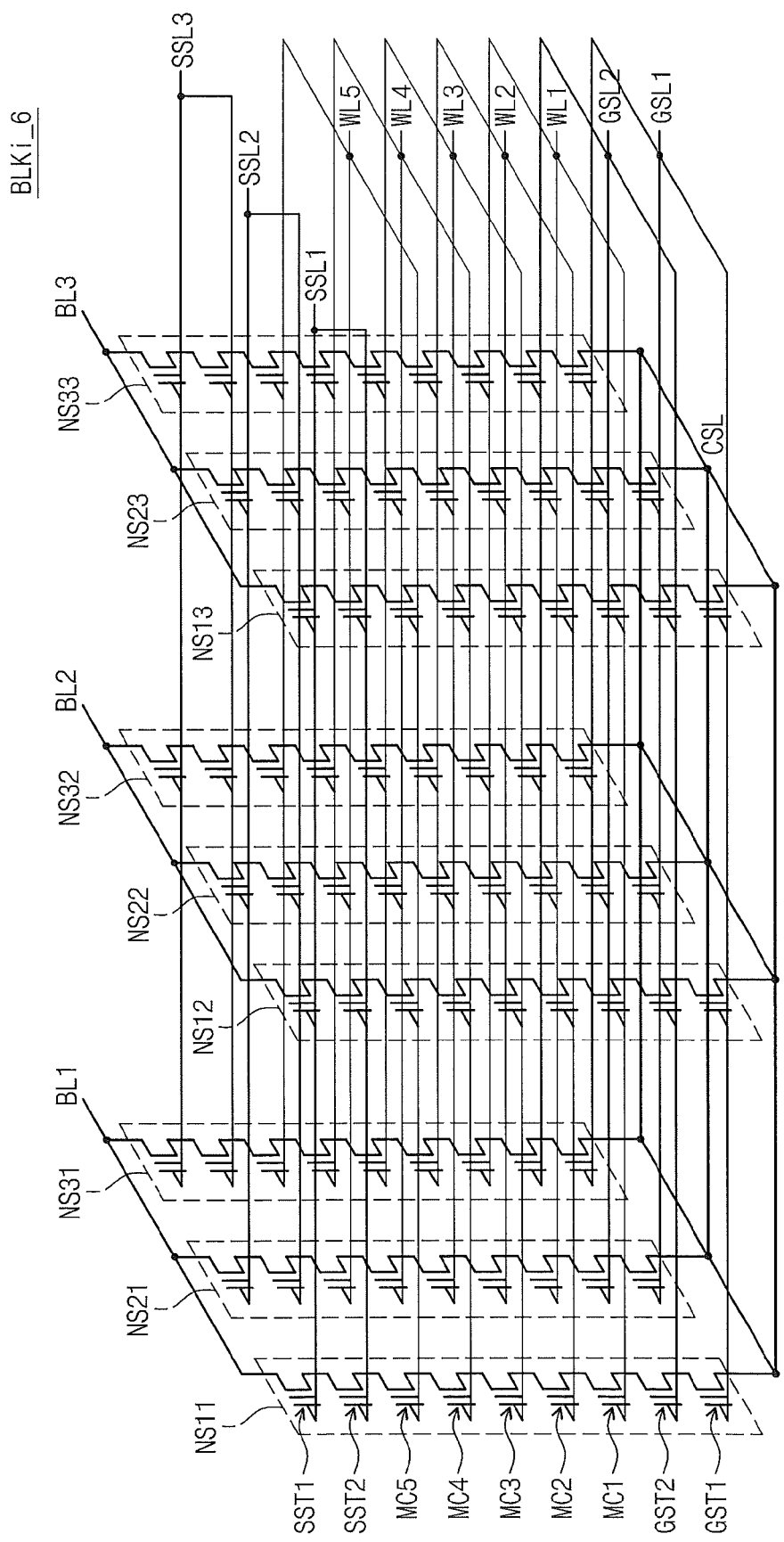

FIG. 21 is a circuit diagram illustrating an equivalent circuit BLKi_6 according to yet further example embodiments of a memory block BLKi described with reference to FIGS. 3-5. Comparing with the memory block BLKi_5 of FIG. 20, string selection lines SSL (e.g., SSL1-SSL3) corresponding to the NAND strings NS of a same row may be connected in common.

Figure 22:
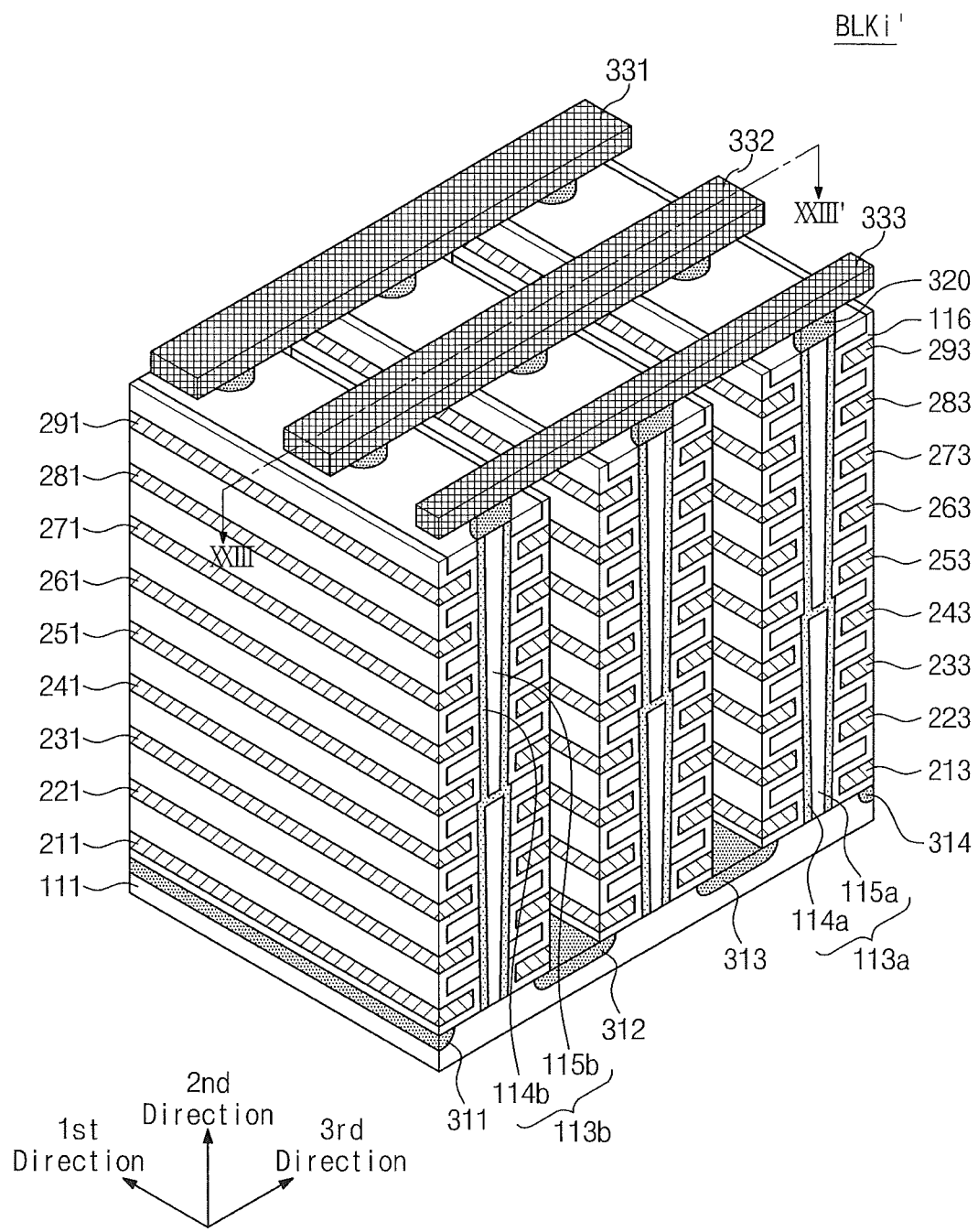
Figure 23:
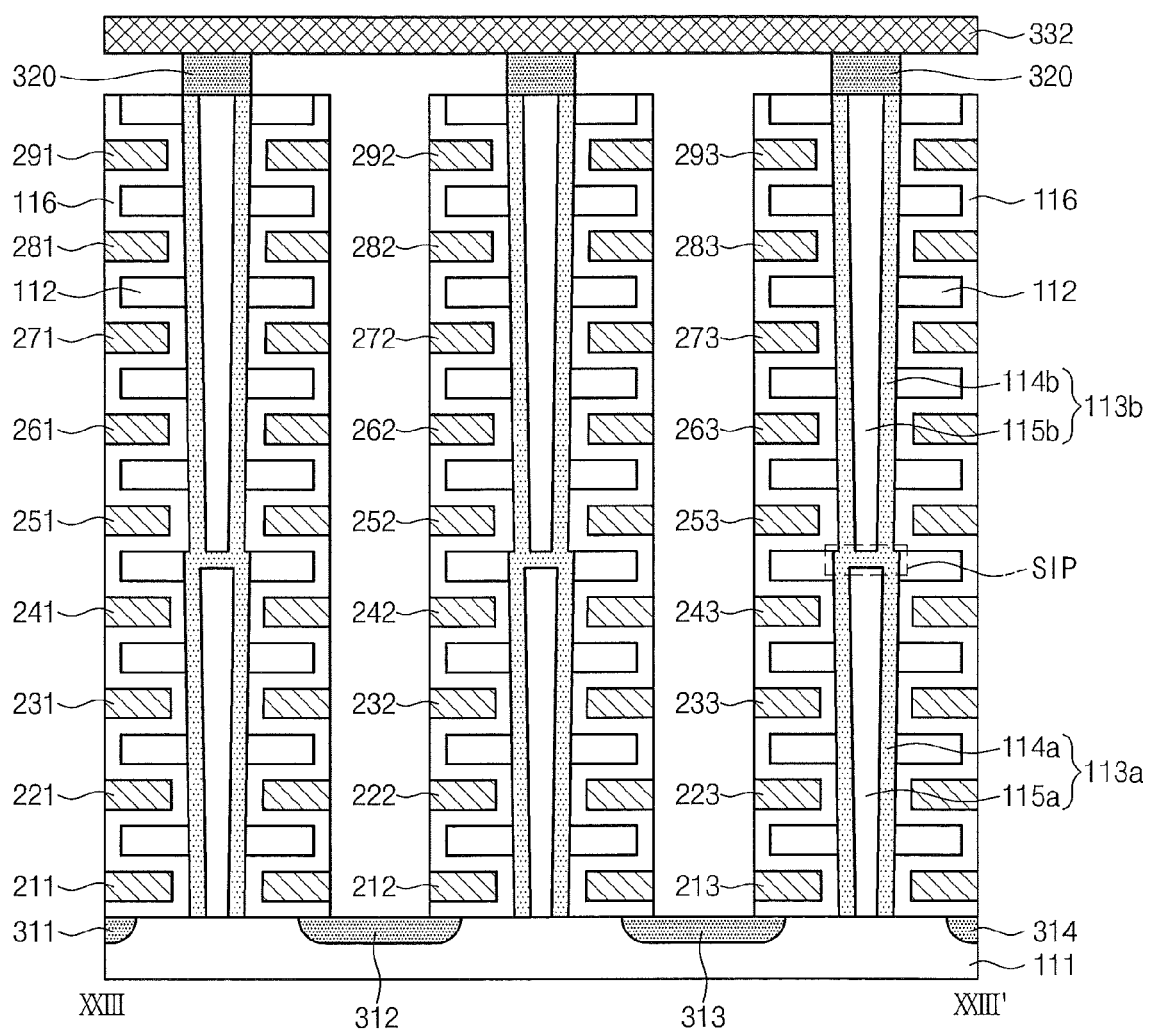

FIG. 22 is a perspective view illustrating a modification example BLKi' of the memory block BLKi of FIG. 3. FIG. 23 is a cross-sectional view taken along line XXIII-XXIII' of a memory block BLKi' of FIG. 22. Except that one pillar of a memory block BLKi' includes a first sub-pillar 113a and a second sub-pillars 113b, a memory block BLKi_2 is the same or similar to the memory block BLKi described with reference to FIGS. 4-21. Description of elements previously described may not be repeated.

Referring to FIGS. 22 and 23, the first sub-pillar 113a may be on the substrate 111. According to example embodiments of the inventive concepts, a surface layer 114a of the first sub-pillar 113a may include, for example, a p-type silicon material. The surface layer 114a of the first sub-pillar 113a may serve as a second-direction body. An inner layer 115a of the first sub-pillar 113a may be an insulating material. The second sub-pillar 113b may be on the first sub-pillar 113a. According to example embodiments of the inventive concepts, a surface layer 114b of the second sub-pillar 113b may include, for example, a p-type silicon material.

For example, the surface layer 114b of the second sub-pillar 113b may serve as the second-direction body. An inner layer 115b of the second sub-pillar 113b may be an insulating material. According to example embodiments of the inventive concepts, the surface layer 114a of the first sub-pillar 113a and the surface layer 114b of the second sub-pillar 113b may be connected. For example, as described above with reference to FIGS. 22 and 23, the surface layer 114a of the first sub-pillar 113a and the surface layer 114b of the second sub-pillar 113b may be connected through a p type silicon pad SIP.

Figure 24:
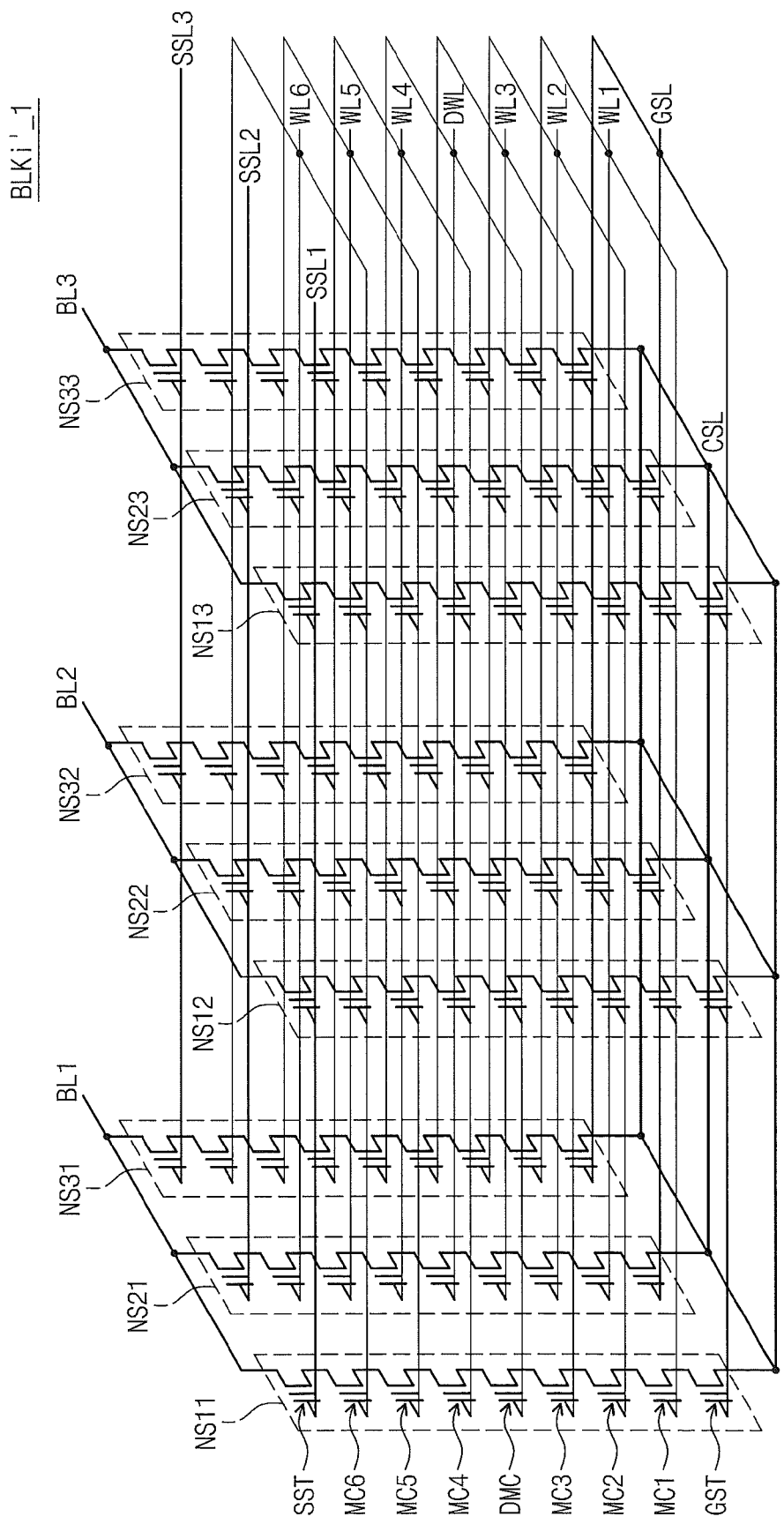

FIG. 24 is a circuit diagram illustrating an equivalent circuit BLKi'_1 according to example embodiments of a memory block BLKi' described above with reference to FIGS. 22 and 23. Comparing with the memory block BLKi of FIG. 6, a dummy word line DWL may be between first to third word lines WL1-WL3 and fourth to sixth word lines WL4-WL6, in a memory block BLKi'_1. Memory cells MC1-MC3 with second to fourth heights may be connected to the first to third word lines WL1-WL3. Dummy memory cells DMC may be at a fifth height. The dummy memory cells DMC with the fifth height may be connected to a dummy word line DWL in common.

Memory cells MC4-MC6 with sixth to eighth heights may be connected to the fourth to sixth word lines WL4-WL6. According to example embodiments of the inventive concepts, first conductive lines with a height which corresponds to a silicon pad SIP may be connected and be a dummy word line DWL. In FIG. 24, it may be illustrated that first conductive lines with a fifth height may be the dummy word line DWL. However, the height of the first conductive lines forming the dummy word line DWL is not limited thereto.

Figure 25:
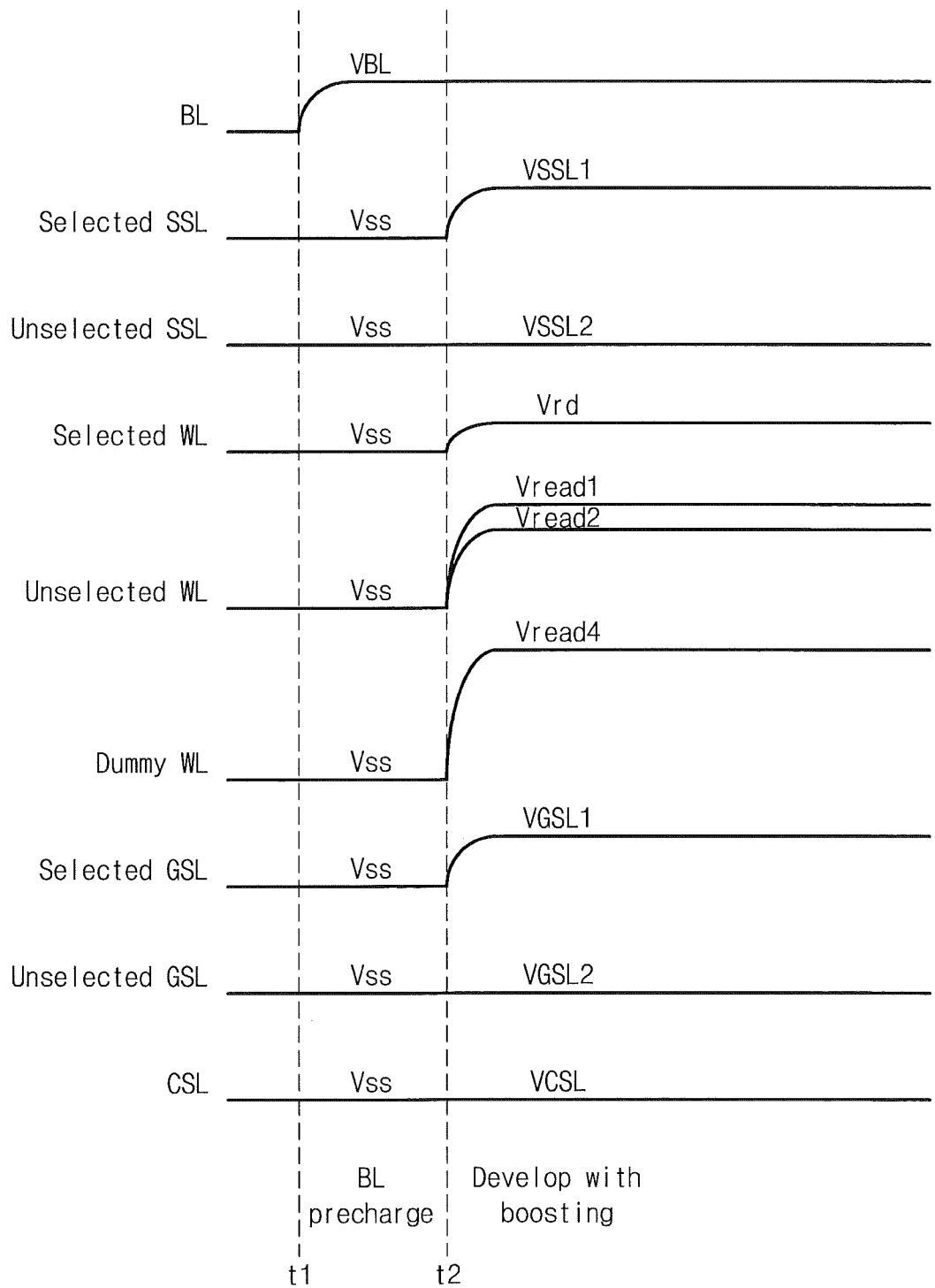

FIG. 25 is a timing diagram showing voltage changes in a reading operation of the memory block BLKi'_1 of FIG. 24. Comparing with the timing diagram of FIG. 13, a fourth selection read voltage Vread4 may be applied to a dummy word line DWL. The fourth selection read voltage Vread4 may be a greater voltage level than a first selection read voltage Vread1. In a region to which a silicon pad SIP is provided, a surface layer 114a of a first sub-pillar 113a and a surface layer 114b of a second sub-pillar 113b may be connected in an irregular shape. A channel may not be stably induced in the region to which the silicon pad SIP is provided. To prevent and/or reduce such a limitation, a dummy word line DWL and a dummy memory cell DMC may be provided to a height corresponding to the silicon pad SIP.

In the reading operation, the fourth selection read voltage Vread4 with a greater voltage level than the first selection read voltage Vread1 may be applied to the dummy word line DWL. A channel may be stably induced in the region including the silicon pad SIP. A cell current of each NAND string NS may be prevented from decreasing due to the silicon pad SIP or a decrease in cell current may be reduced due to the silicon pad SIP. According to example embodiments of the inventive concepts, the first string selection line voltage VSSL1, the selection read voltage Vrd, the first non-selection read voltage Vread1, the second non-selection read voltage Vread2, the fourth non-selection read voltage Vread4 and the first ground selection line voltage VGSL1 may be applied at time intervals therebetween.

An order in which the first string selection line voltage VSSL1, the selection read voltage Vrd, the first non-selection read voltage Vread1, the second non-selection read voltage Vread2, the fourth non-selection read voltage Vread4 and the first ground selection line voltage VGSL1 are applied may be variously changed and applied. As described with reference to FIGS. 14 and 15, the third non-selection read voltage Vread3 may be applied to unselected word lines between unselected word lines receiving the second non-selection read voltage Vread2 and unselected word lines receiving the first non-selection read voltage Vread1.

Figure 26:
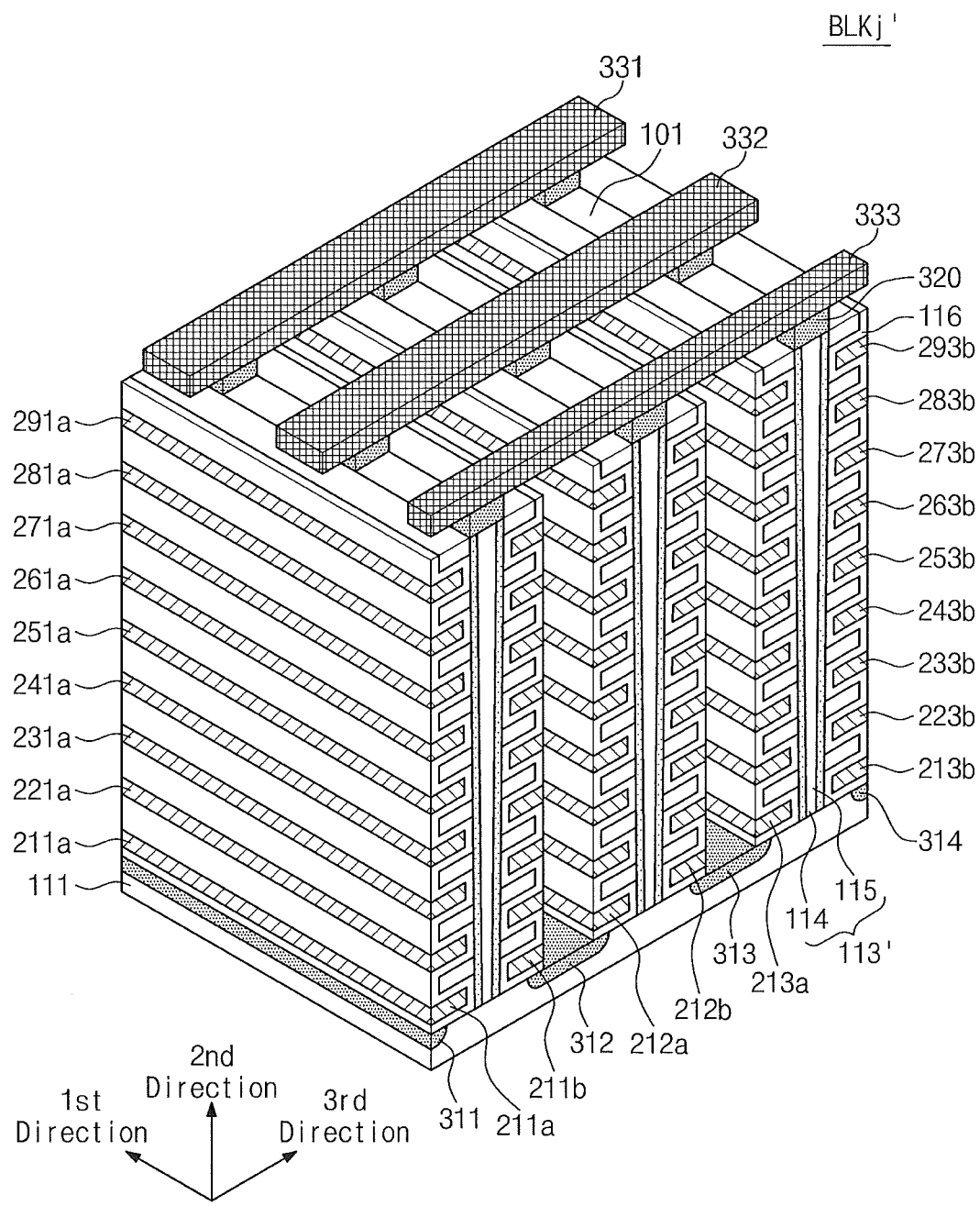

FIG. 26 is a perspective view illustrating a memory block BLKj according to other example embodiments of one of the memory blocks BLK1-BLKz of FIG. 2. A cross-sectional view taken along conductive material 332 of a memory block BLKj may be the same or similar to the cross-sectional view of FIG. 4. Comparing with the memory block BLKi of FIG. 3, pillars 113' may be in a shape of a tetragonal pillar. Insulating materials 101 may be between the pillars 113' that are spaced apart in the first direction. According to example embodiments of the inventive concepts, the insulating materials 101 may be extended in the second direction and contact the substrate 111.

The first conductive materials 211-291, 212-292 and 213-293 described above with reference to FIG. 3 may be divided into first portions 211a-291a, 212a-292a and 213a-293a and second portions 211b-291b, 212b-292b and 213b-293b by the insulating materials 101. In a region on the first and second doping regions 311 and 312, each of the pillars 113', the first portions 211a-291a of first conductive materials and the insulation layer 116 may form one NAND string NS, and each of the pillars 113', the second portions 211b-291b of the first conductive materials and the insulation layer 116 may form another NAND string NS.

In a region on the second and third doping regions 312 and 313, each of the pillars 113', the first portions 212a-292a of first conductive materials and the insulation layer 116 may form one NAND string NS, and each of the pillars 113', the second portions 212b-292b of the first conductive materials and the insulation layer 116 may form another NAND string NS. In a region on the third and fourth doping regions 313 and 314, each of the pillars 113', the first portions 213a-293a of first conductive materials and the insulation layer 116 may form one NAND string NS, and each of the pillars 113', the second portions 213b-293b of the first conductive materials and the insulation layer 116 may form another NAND string NS.

By dividing the first and second conductive materials 211-291 into first and second portions 211a-291a and 211b-291b of the first conductive materials that are provided to the both-side surfaces of the each pillar 113' with the insulating material 101, each pillar 113' may form two NAND strings NS. As described with reference to FIGS. 6-21, the first portions 211a-291a, 212a-292a and 213a-293a, and second portions 211b-291b, 212b-292b and 213b-293b of the first conductive materials may correspond to the ground word lines GSL, the word lines WL and the string selection lines SSL. Word lines WL with the same height may be connected in common.

As described above with reference to FIGS. 6-21, a reading operation of the memory block BLKj may be performed. In the reading operation, a developing operation which accompanies boosting may be performed in the memory block BLKj. When the developing operation which accompanies boosting is performed generation of hot carriers may be prevented and/or reduced.

Figure 27:
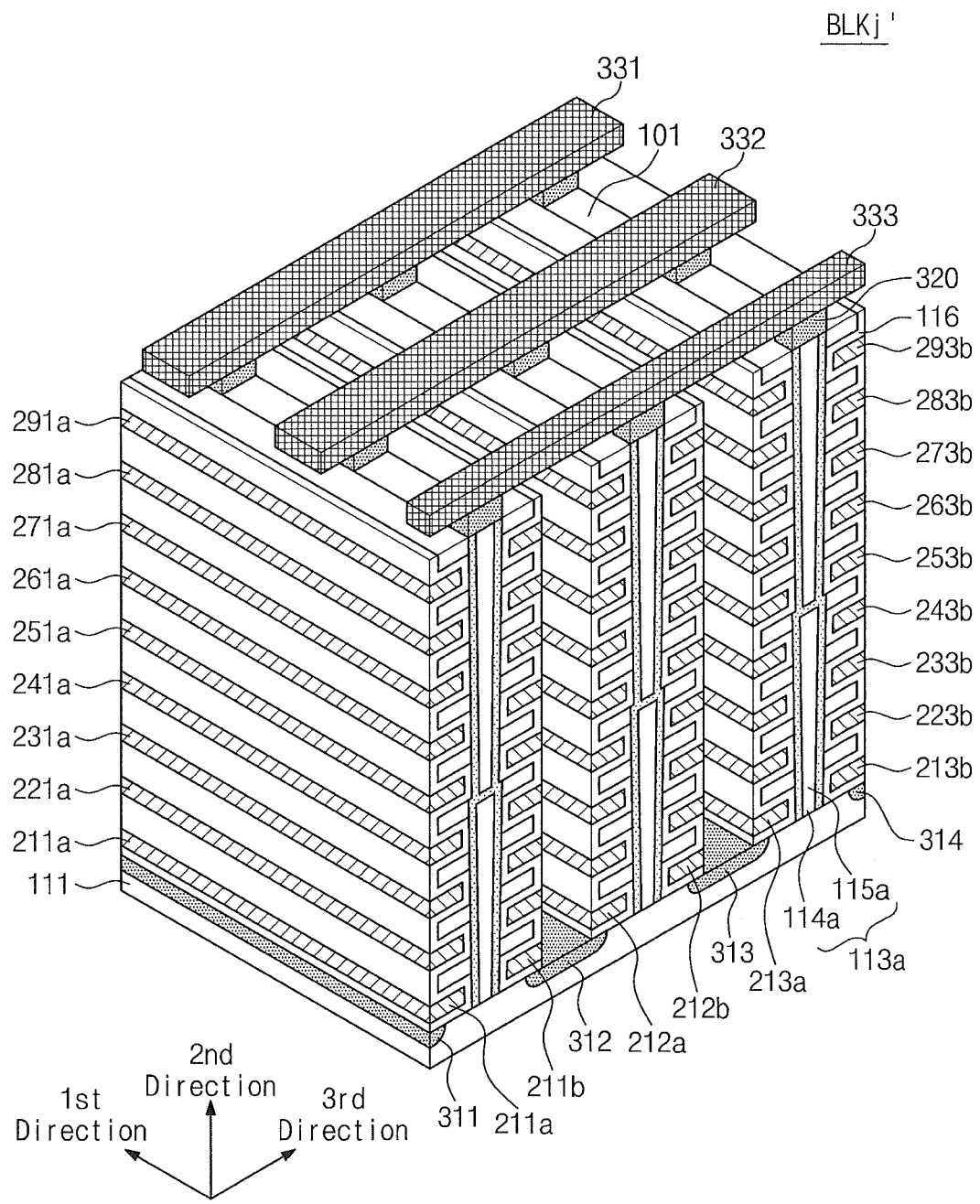

FIG. 27 is a perspective view illustrating a memory block BLKj' that is a modification example of the memory block BLKj of FIG. 26. A cross-sectional view taken along the conductive material 332 of a memory block BLKj' may be the same or similar to the cross-sectional view of FIG. 23. A pillar of the memory block BLKj' may include the first and second sub-pillars 113a and 113b and otherwise the memory block BLKj' may be the same or similar to the memory block BLKj described with reference to FIG. 26. As described with reference to FIGS. 22 and 23, one pillar may include first and second pillars 113a and 113b, in the memory block BLKj'. The first and second pillars 113a and 113b may be configured identically to the elements that have been described above with reference to FIGS. 22 and 23.

As described with reference to FIG. 26, first and second pillars 113a and 113b may include two NAND strings NS. The first portions 211a-291a, 212a-292a and 213a-293a and second portions 211b-291b, 212b-292b and 213b-293b of the first conductive materials may correspond to the ground word lines GSL, the word lines WL and the string selection lines SSL. Word lines WL having the same height may be connected in common. As described with reference to FIGS. 6-21, a reading operation of the memory block BLKj may be performed. In the reading operation, a developing operation which accompanies boosting may be performed in the memory block BLKj. When the developing operation which accompanies boosting is performed generation of hot carriers may be prevented and/or reduced.

Figure 28:
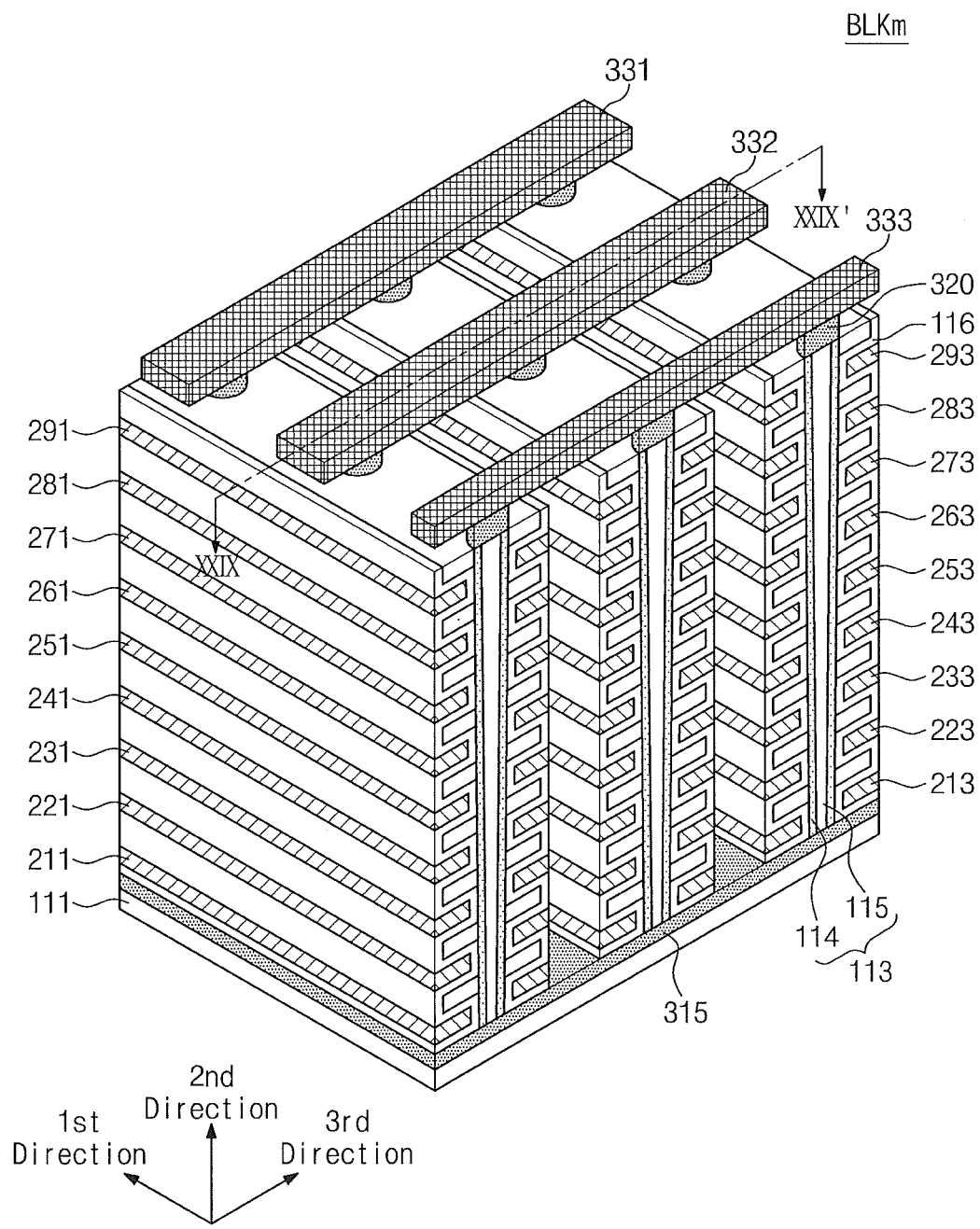
Figure 29:
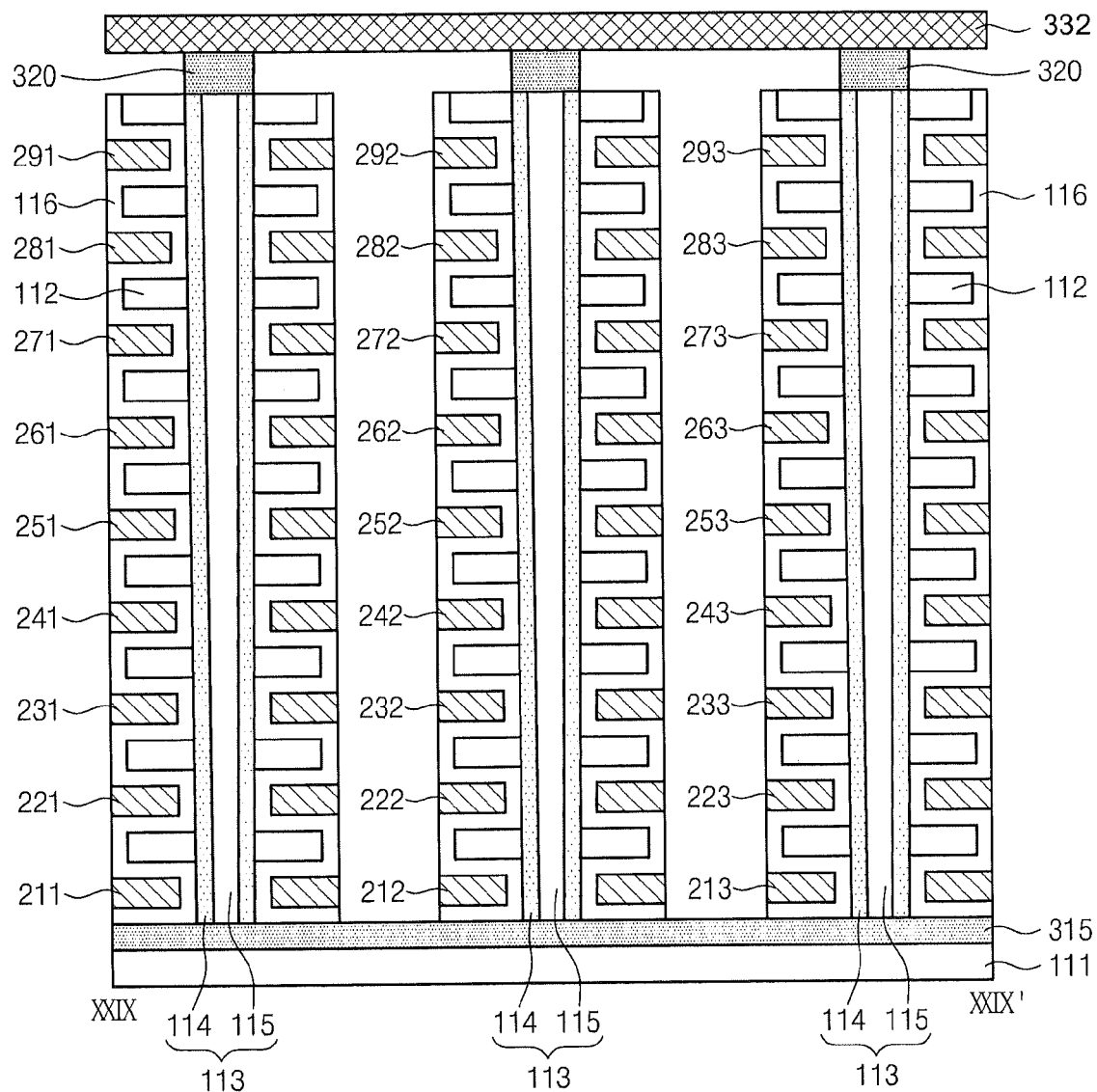

FIG. 28 is a perspective view illustrating a memory block BLKm according to still other example embodiments of one of the memory blocks BLK1-BLKz of FIG. 3. FIG. 29 is a cross-sectional view taken along line XXIX-XXIX' of the memory block BLKm of FIG. 28, Referring to FIGS. 28 and 29, a memory block BLKm may be configured identically to the memory block BLKi described with reference to FIGS. 3-21 except that an n-type doping region 315 of the common source line CSL may be in a plate shape. For example, the n-type doping region 315 may be provided as an n-type well.

As described with reference to FIGS. 6-21, the first conductive materials 211-291, 212-292 and 213-293 may correspond to the ground word lines GSL, the word lines WL and the string selection lines SSL. Word lines WL with the same height may be connected in common. As described above with reference to FIGS. 6-21, a reading operation of the memory block BLKm may be performed. In the reading operation, a developing operation which accompanies boosting may be performed in the memory block BLKm. When the developing operation which accompanies boosting is performed generation of hot carriers may be prevented and/or reduced.

Figure 30:
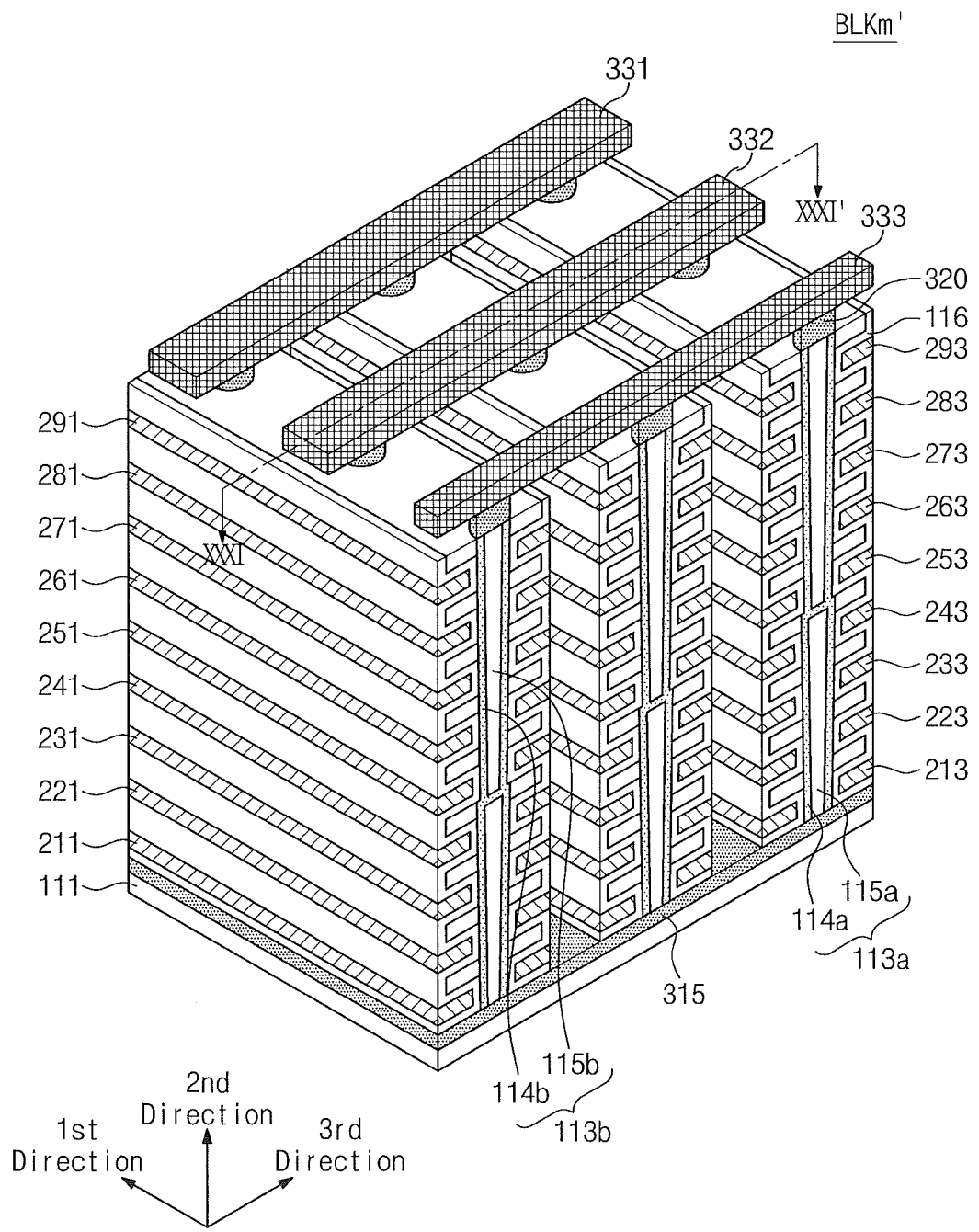
Figure 31:
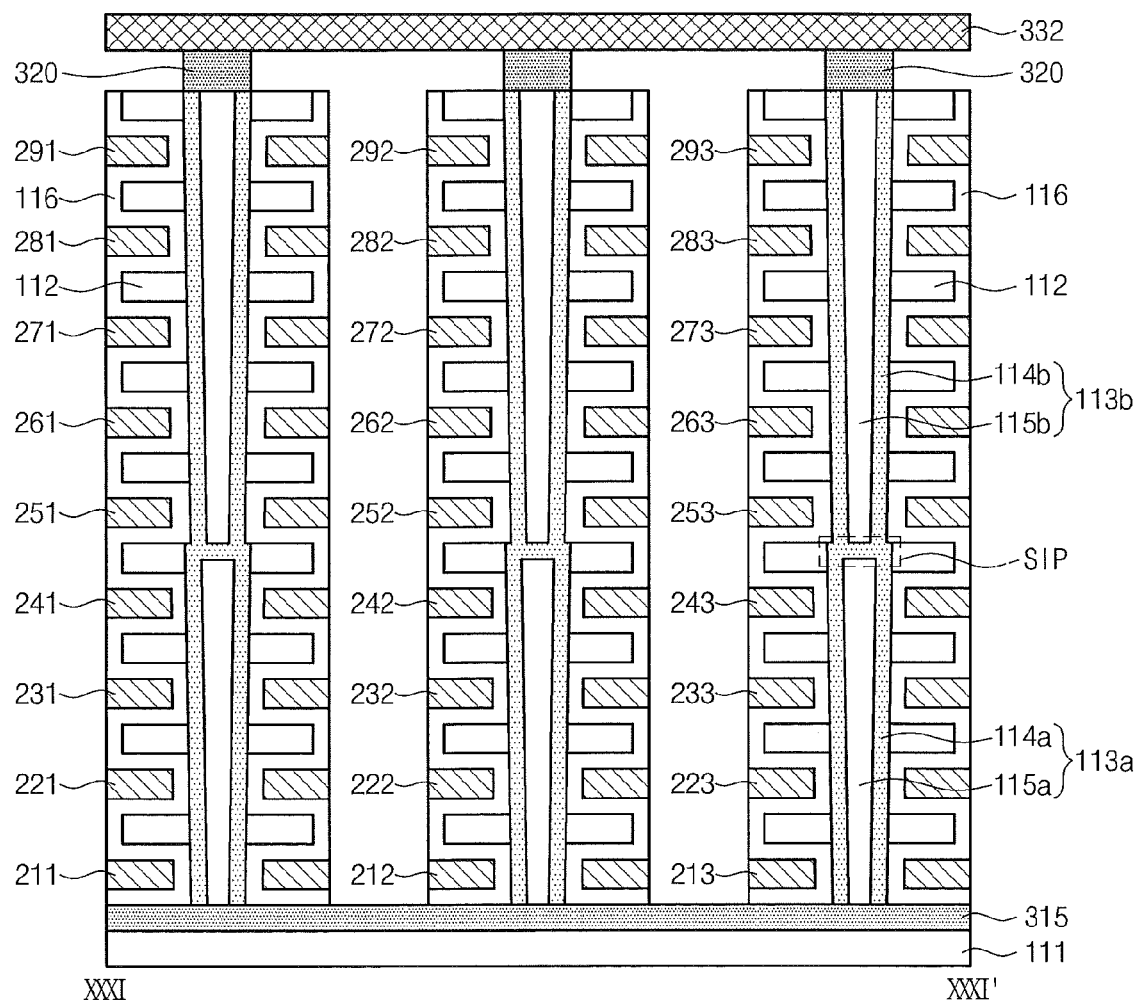

FIG. 30 is a perspective view illustrating a memory BLKm' that is a modification example of a memory block BLKm of FIG. 28. FIG. 31 is a cross-sectional view taken along line XXXI-XXXI' of a memory block BLKm' of FIG. 30. A memory block BLKm' may be the same or similar to the memory block BLKm described with reference to FIGS. 28 and 29, except that one pillar of the memory block BLKm' may include first and second sub-pillars 113a and 113b. As described above with reference to FIGS. 22 and 23, one pillar may include the first and second sub-pillars 113a and 113b, in the memory block BLKm'. The first and second sub-pillars 113a and 113b may be configured identically to the sub-pillars 113a and 113b that have been described above with reference to FIGS. 22 and 23.

As described above with reference to FIGS. 28 and 29, the n-type doping region 315 of the common source line CSL may be a plate shape. As described above with reference to FIGS. 6-21, a reading operation of the memory block BLKm' may be performed. In the reading operation, a developing operation which accompanies boosting may be performed in the memory block BLKm'. When the developing operation which accompanies boosting is performed generation of hot carriers may be prevented and/or reduced.

Figure 32:
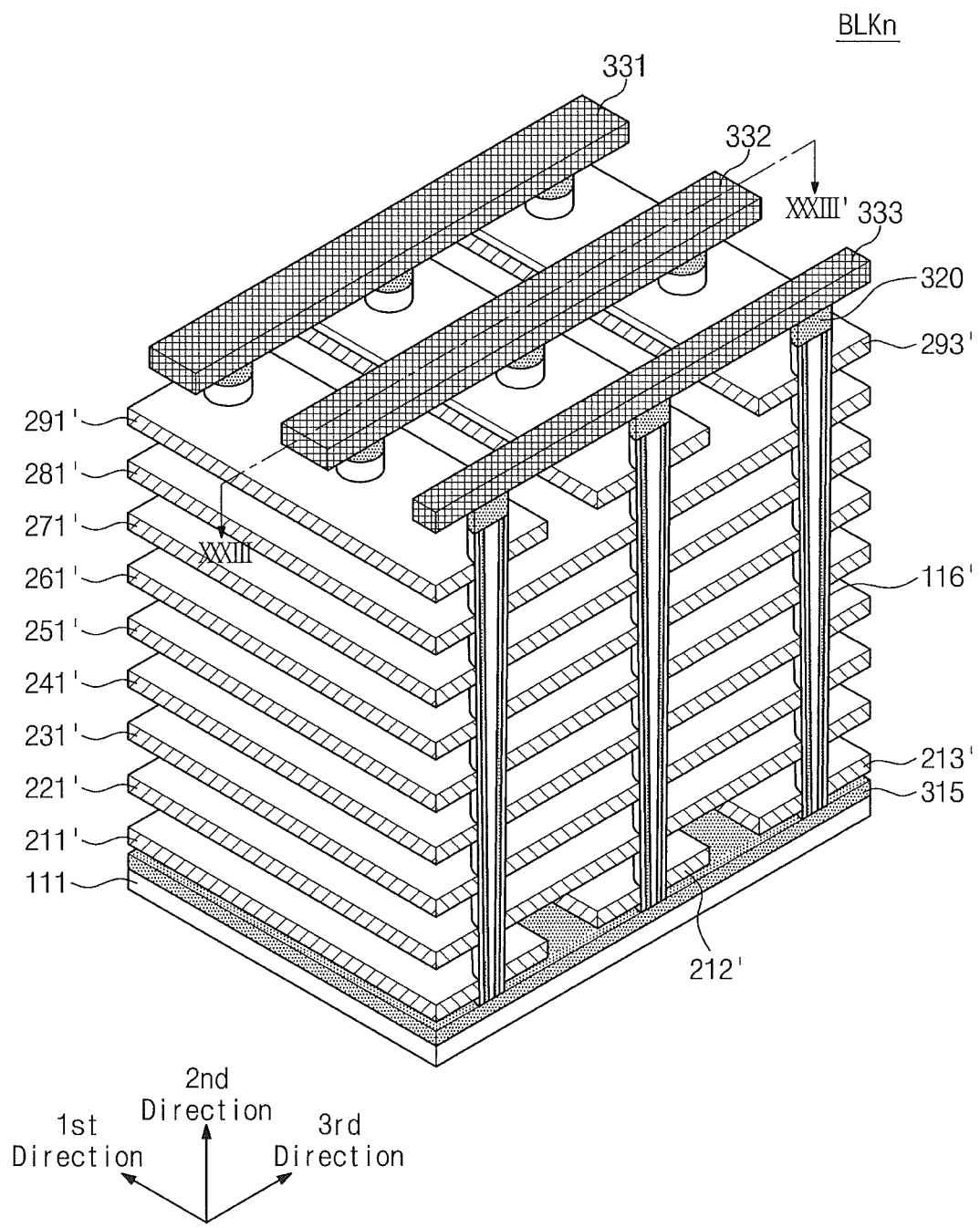
Figure 33:
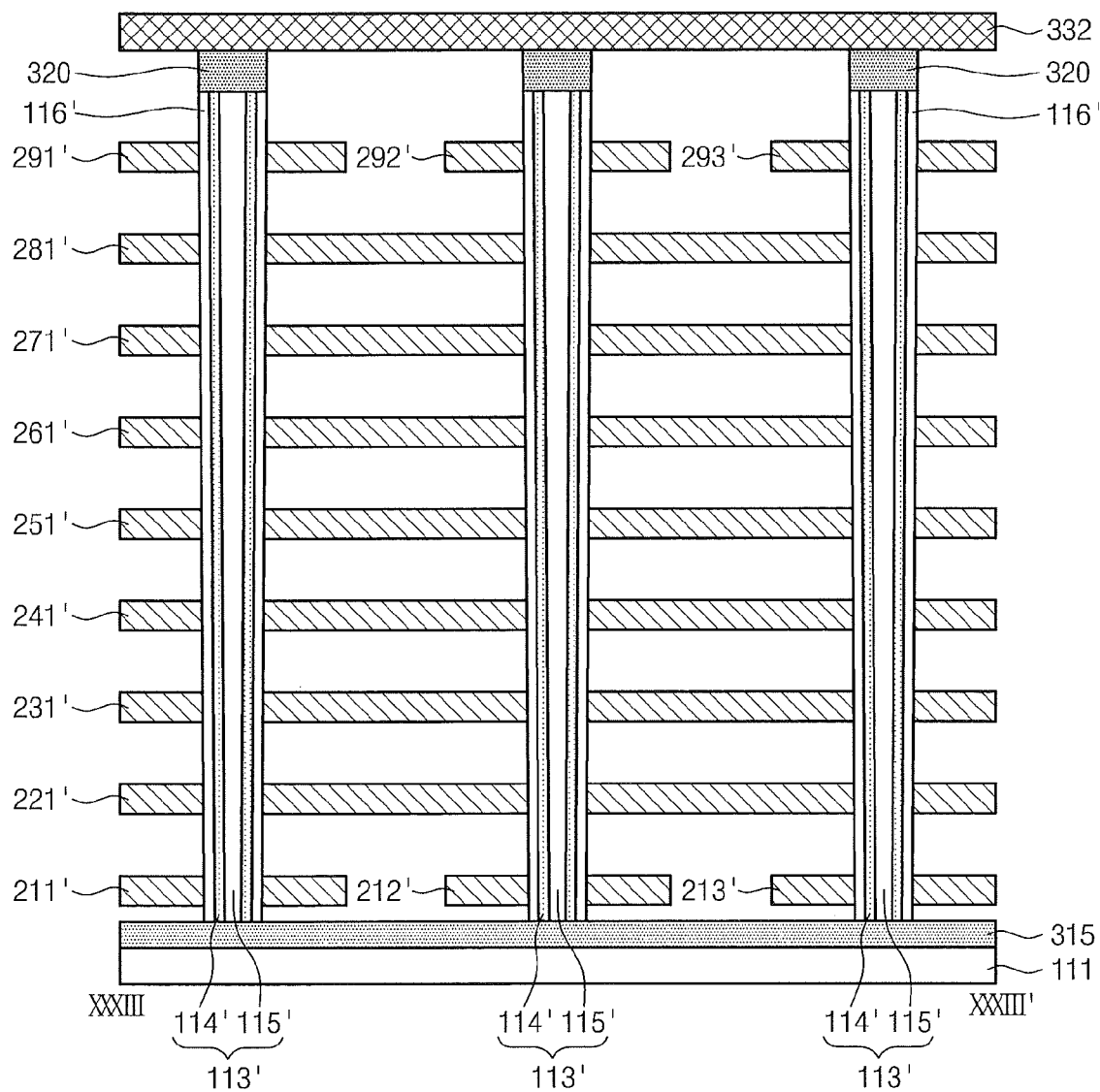

FIG. 32 is a perspective view illustrating a memory block BLKn according to still further example embodiments of one of the memory blocks BLK1-BLKz of FIG. 3. FIG. 33 is a cross-sectional view taken along line XXXIII-XXXIII' of a memory block BLKn of FIG. 32. Referring to FIGS. 32 and 33, an n-type doping region 315 of the common source line CSL may be in a plate shape as described above with reference to FIGS. 28 and 29. Comparing with the memory block BLKi described with reference to FIGS. 3 and 4, first conductive lines 221' to 281' of the word lines WL1-WL7 may be in a plate shape.

The surface layer 116' of the each pillar 113' may include an insulation layer. The surface layer 116' of the pillar 113' may store data similar to the insulation layer 116 described above with reference to FIG. 5. For example, the surface layer 116' may include a tunneling insulation layer, a charge storage layer and/or a blocking insulation layer. The intermediate layer 114' of the pillar 113' may include p-type silicon. The intermediate layer 114' of the pillar 113' may serve as a second-direction body. The inner layer 115' of the pillar 113' may include an insulating material.

According to example embodiments of the inventive concepts, when the first conductive line 221' with the second height is used as the ground selection line GSL, it may be divided similarly to the first conductive lines 211'-213' with the first height. When the first conductive line 281' with the eighth height is used as the string selection line SSL, it may be divided similarly to the first conductive line 291' with the ninth height. As described with reference to FIGS. 6-21, a reading operation of the memory block BLKn may be performed. In the reading operation, a developing operation which accompanies boosting may be performed in the memory block BLKn. When the developing operation which accompanies boosting is performed generation of hot carriers may be prevented and/or reduced.

Figure 34:
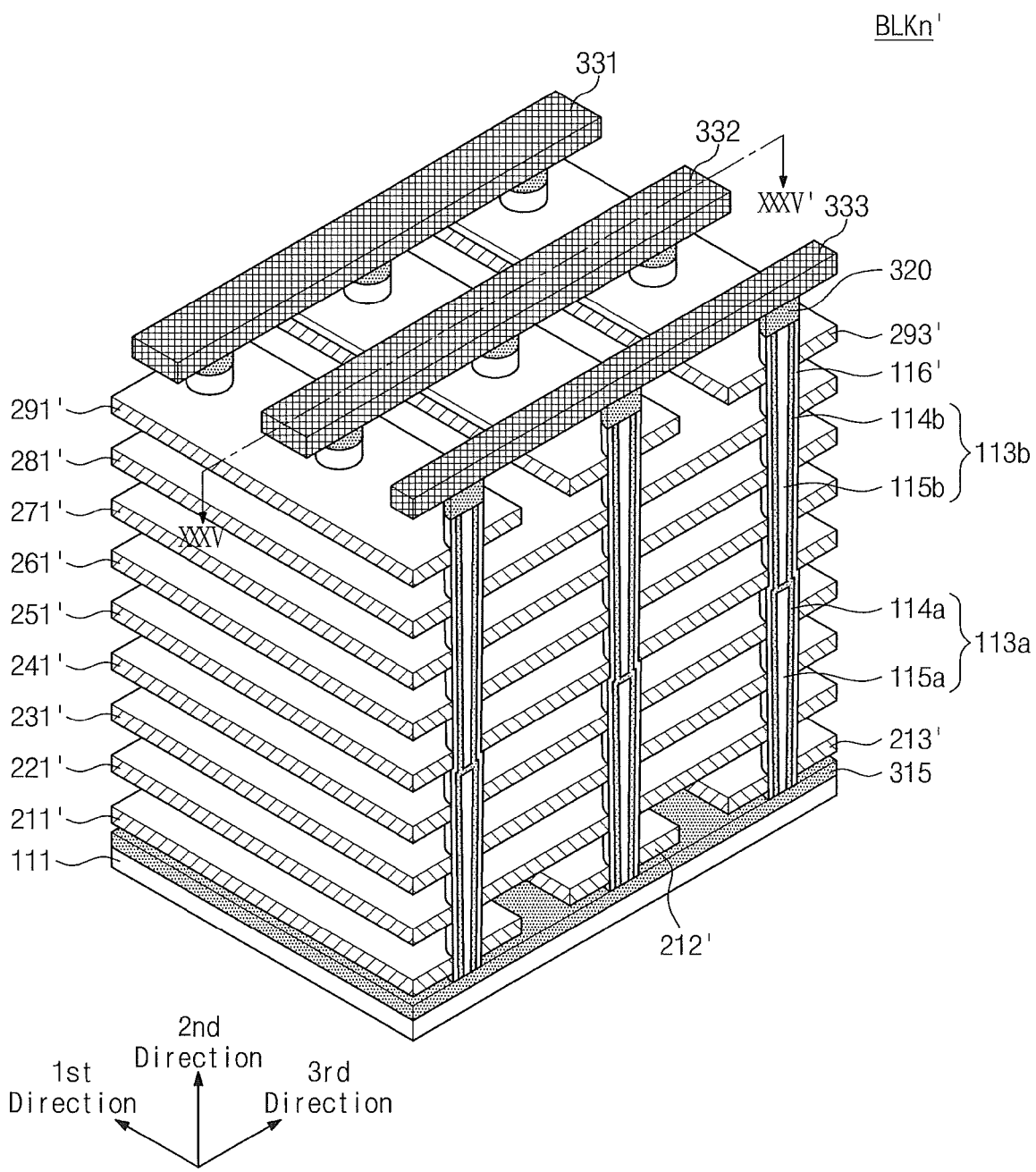
Figure 35:
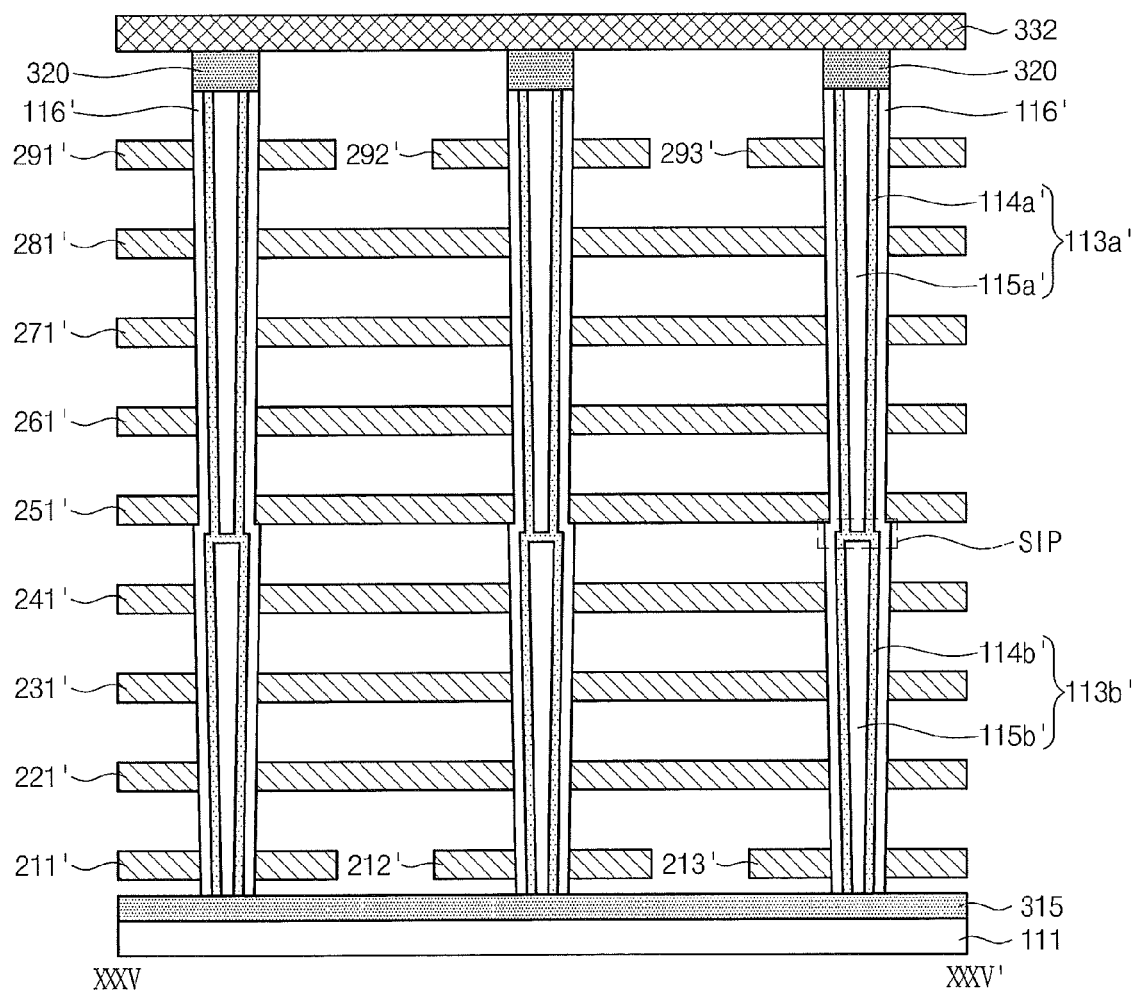

FIG. 34 is a perspective view illustrating a memory block BLKn' that is a modification example of the memory block BLKn of FIG. 32. FIG. 35 is a cross-sectional view taken along line XXXV-XXXV' of the memory block BLKn' of FIG. 34. A memory block BLKn' may be the same or similar to the memory block BLKn described with reference to FIGS. 32 and 33, except that one pillar of the memory block BLKn' may include first and second sub-pillars 113a and 113b. As described above with reference to FIGS. 22 and 23, one pillar may include first and second sub-pillars 113a and 113b, in the memory block BLKn'. The first and second sub-pillars 113a and 113b may be configured identically to the sub-pillars 113a and 113b described with reference to FIGS. 22 and 23.

As described above with reference to FIGS. 6-21, a reading operation of the memory block BLKn' may be performed. In the reading operation, a developing operation which accompanies boosting may be performed in the memory block BLKn'. When the developing operation which accompanies boosting is performed generation of hot carriers may be prevented and/or reduced.

Figure 36:
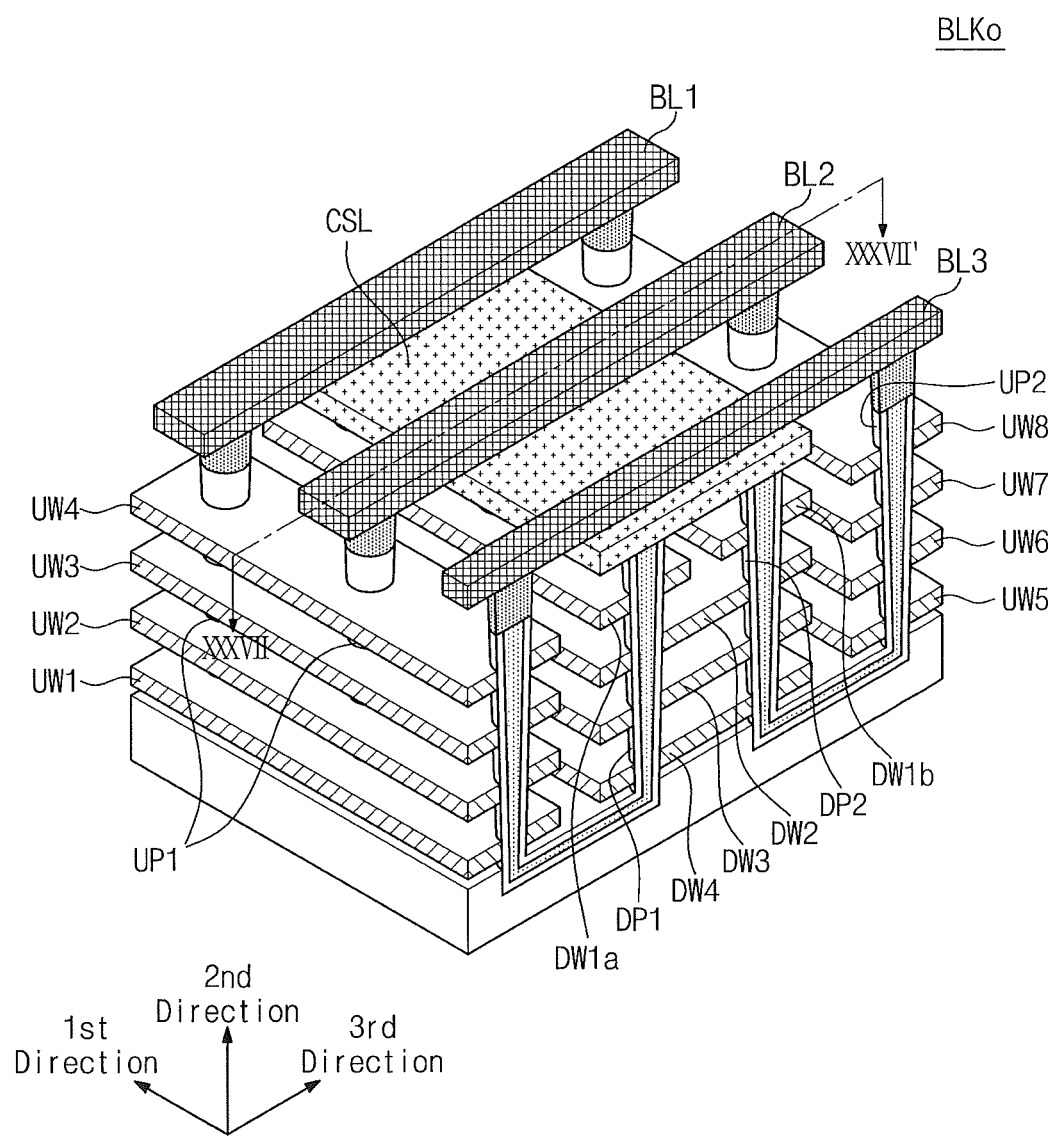
Figure 37:
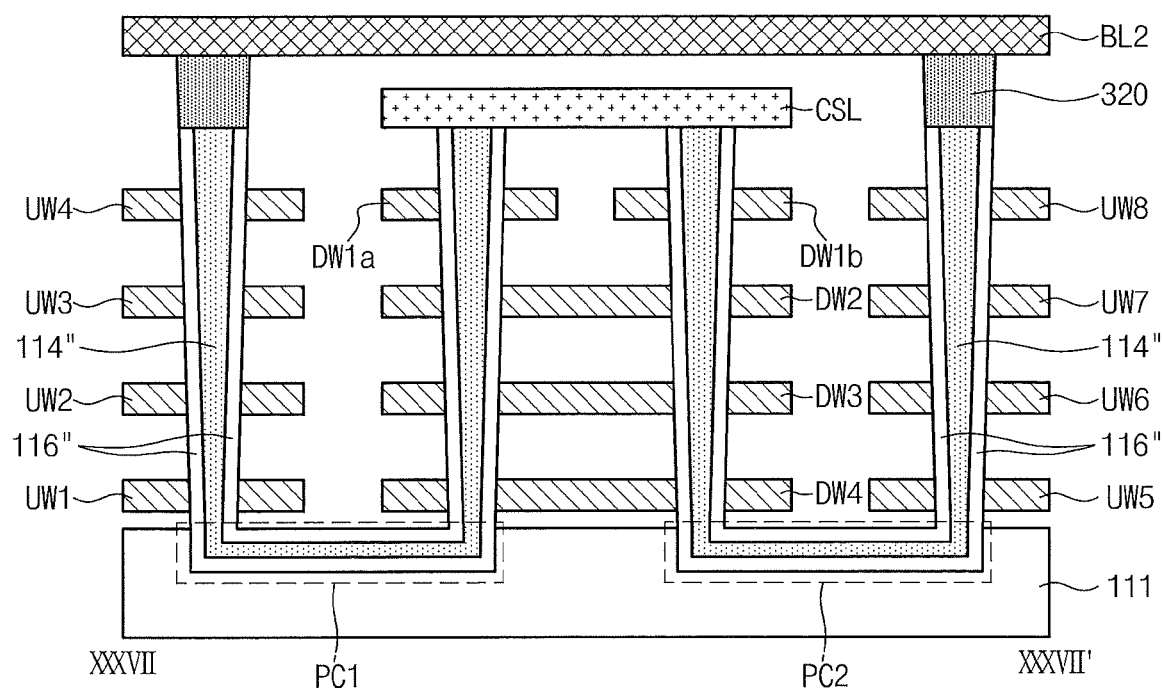

FIG. 36 is a perspective view illustrating a memory block BLKo according to yet still other example embodiments of the memory blocks BLK1-BLKz of FIG. 2. FIG. 37 is a cross-sectional view taken along line XXXVII-XXXVII' of a memory block BLKo of FIG. 36. Referring to FIGS. 36 and 37, first to fourth upper word lines UW1-UW4 extended in a first direction may be sequentially provided onto a substrate 111 in a second direction. The first to fourth upper word lines UW1-UW4 may be spaced apart in the second direction. First upper pillars UP1 may be spaced apart in the first direction and may pass through the first to fourth upper word lines UW1-UW4 in the second direction.

Second to fourth lower word lines DW2-DW4 extending in the first direction may be sequentially provided in the second direction on the substrate 111 and may be separated from the first to fourth upper word lines UW1-UW4 in a third direction. The second to fourth lower word lines DW2-DW4 may be spaced apart from in the second direction. A lower word line DW1$a$ and a lower word line DW1$b$ may be spaced apart from the lower word lines DW2-DW4 in the second direction on the second lower word line DW2. The lower word line DW1$a$ and the lower word line DW may be spaced apart in the third direction.

First lower pillars DP1 may be spaced apart in the first direction and may pass through the lower word line DW1$a$ and the second to fourth lower word lines DW2 to DW4. Second lower pillars DP2 may be spaced apart in the first direction and pass through the lower word line DW1$b$ and the second to fourth lower word lines DW2 to DW4 in the second direction. According to example embodiments of the inventive concepts, the first lower pillars DP1 and the second lower pillars DP2 may be disposed in parallel in the second direction.

Fifth to eighth upper word lines UW5-UW8 extending in the first direction may be sequentially provided in the second direction on the substrate 111 separated from the lower word lines DW1$a$, DW1$b$ and DW1-DW4 in the third direction. The fifth to eighth upper word lines UW5-UW8 may be spaced apart in the second direction. Second upper pillars UP2 may be spaced apart in the first direction and may pass through the fifth to eighth upper word lines UW5-UW8 in the second direction.

A common source line CSL extending in the first direction may be on upper portions of the first and second lower pillars DP1 and DP2. According to example embodiments of the inventive concepts, the common source line CSL may include n type silicon material. According to example embodiments of the inventive concepts, when the common source line CSL is a conductive material, with no polarity, such as metal or poly silicon, n-type sources may be included between the first and second lower pillars DP1 and DP2. According to example embodiments of the inventive concepts, the common source line CSL and the first and second lower pillars DP1 and DP2 may be connected through contact plugs (not shown).

Drains 320 may be on upper portions of the first and second upper pillars UP1 and UP2. According to example embodiments of the inventive concepts, the drains 320 may include n type silicon material. A plurality of bit lines BL1-BL3 extending in the third direction may be sequentially provided onto the portions of the drains 320 in the first direction. According to example embodiments of the inventive concepts, the bit lines BL1-BL3 may be metal. According to example embodiments of the inventive concepts, the bit lines BL1-BL3 and the drains 320 may be connected through the contact plugs.

Each of the first and second upper pillars UP1 and UP2 may include a surface layer 116" and an inner layer 114". Each of the first and second lower pillars DP1 and DP2 may include a surface layer 116" and an inner layer 114". The surface layer 116" may store data similarly to the insulation layer 116 described with reference to FIG. 5. The surface layer 116" of the first and second upper pillars UP1 and UP2 and first and second lower pillars DP1 and DP2 may include a blocking insulation layer, a charge storing layer and/or a tunneling insulation layer.

The tunneling insulation layer may include, for example, a thermal oxide layer. The charge storing layer may include, for example, a nitride layer and/or a metal oxide layer (e.g., an aluminum oxide layer and/or a hafnium oxide layer). A blocking insulation layer 119 may be a single layer or a multi layer. The blocking insulation layer 119 may be a high dielectric layer (e.g., an aluminum oxide layer and/or a hafnium oxide layer) with a higher dielectric constant than the charge storing layer and the tunneling insulation layer. According to example embodiments of the inventive concepts, the blocking insulation layer, the charge storing layer and the tunneling insulation layer may be an Oxide-Nitride-Oxide (ONO).

The inner layer 114" of the first and second upper pillars UP1 and UP2 and first and second lower pillars DP1 and DP2 may include a p type silicon material. The inner layer 114" of the first and second upper pillars UP1 and UP2 and first and second lower pillars DP1 and DP2 may serve as a second-direction body. In the substrate 111, the first upper pillars UP1 and the first lower pillars DP1 may be connected to first pipeline contacts PC1. According to example embodiments of the inventive concepts, the surface layers 116" of the first upper pillars UP1 and the first lower pillars DP1 may be connected through the surface layers of the first pipeline contacts PC1. The surface layers of the first pipeline contacts PC1 may be of the same materials as those of the surface layers 116" of the first upper pillars UP1 and the first lower pillars DP1.

According to example embodiments of the inventive concepts, the inner layers 114" of the first upper pillars UP1 and UP2 and first lower pillars DP1 may be connected through the inner layers of the first pipeline contacts PC1. The inner layers of the first pipeline contacts PC1 may be formed of the same materials as those of the inner layers 114" of the first upper pillars UP1 and UP2 and first lower pillars DP1. The first upper pillars UP1 and the first to fourth upper word lines UW1-UW4 may be first upper strings. The first lower pillars DP1, the lower word line DW1$a$ and the second to fourth lower word lines DW2-DW4 may be first lower strings. The first upper strings and the first lower strings may be connected through the first pipeline contacts PC1. The drains 320 and the bit lines BL1-BL3 may be connected to ends of the first upper strings. The common source line CSL may be connected to ends of the first lower strings. The first upper strings and the first lower strings may be a plurality of strings connected between the bit lines BL1-BL3 and the common source line CSL.

The second upper pillars UP2 and the fifth to eighth upper word lines UW5-UW8 may be second upper strings. The second lower pillars DP2, the lower word line DW1$b$ and the second to fourth lower word lines DW2-DW4 may be second lower strings. The second upper strings and the second lower strings may be connected through second pipeline contacts PC2. The drains 320 and the bit lines BL1-BL3 may be connected to ends of the second upper strings. The common source line CSL may be connected to ends of the second lower strings. The second upper strings and the second lower strings may be a plurality of strings connected between the bit lines BL1-BL3 and the common source line CSL.

Except that eight transistors are provided to one string and two strings are connected to the first to third bit lines BL1-BL3, the equivalent circuit of a memory block BLKo is configured similarly to the circuit of FIG. 6. The numbers of word lines, bit lines and strings of the memory block BLKo are not limited. To induce a channel at an inner layer serving as a body in the first and second pipeline contacts PC1 and PC2, according to example embodiments of the inventive concepts, first and second pipeline contact gates (not shown) may be provided. According to example embodiments of the inventive concepts, the first and second pipeline contact gates (not shown) may be provided onto the surfaces of the first and second pipeline contacts PC1 and PC2.

For convenience, it may be described above that the conductive lines UW1-UW8, DW1a, DW1b and DW2-DW4 are word lines. The upper word lines UW1-UW8 adjacent to the bit lines BL1-BL3 may be used as string selection lines SSL. The lower word lines DW1a and DW1b adjacent to the common source line CSL may be used as ground selection lines GSL. It may be described above that the lower word lines DW2-DW4 may be shared in adjacent lower pillars DP1 and DP2. When upper pillars adjacent to the upper pillars UP1 or UP2 are included, the adjacent upper pillars may share the upper word lines UW2-UW4 and/or UW5-UW7.

As described above with reference to FIGS. 6-21, a reading operation of the memory block BLKo may be performed. In the reading operation, a developing operation which accompanies boosting may be performed in the memory block BLKo. When the developing operation which accompanies boosting is performed generation of hot carriers may be prevented and/or reduced.

Figure 38:
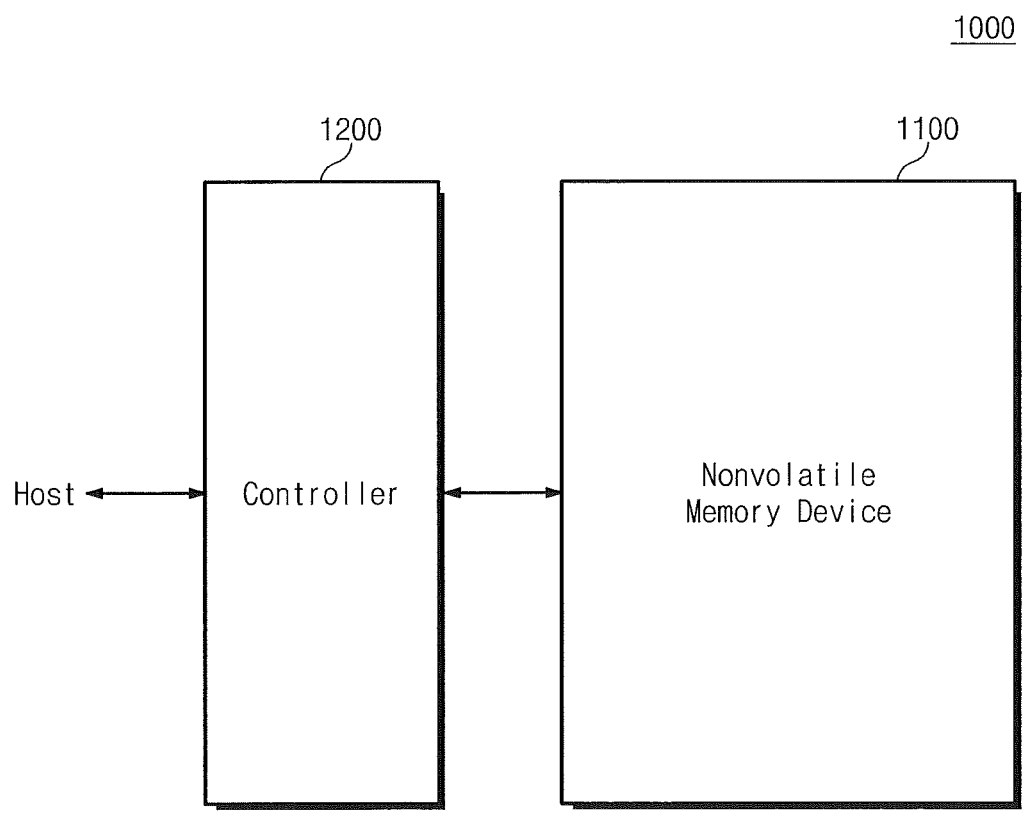

FIG. 38 is a block diagram illustrating a memory system 1000 which includes a nonvolatile memory device 100 of FIG. 1 according to example embodiments of the inventive concepts. Referring to FIG. 38, a memory system 1000 according to example embodiments of the inventive concepts may include a nonvolatile memory device 1100 and a controller 1200. The nonvolatile memory device 1100 may be configured and operate as described above with reference to FIGS. 1-37. The controller 1200 may be connected to a host and the nonvolatile memory device 1100. In response to a request from the host, the controller 1200 may access the nonvolatile memory device 1100.

For example, the controller 1200 may control reading, writing, erasing and background operations of the nonvolatile memory device 1100. The controller 1200 may provide an interface between the nonvolatile memory device 1100 and the host. The controller 1200 may drive firmware for controlling the nonvolatile memory device 1100. According to example embodiments of the inventive concepts, as described with reference to FIG. 1, the controller 1200 may provide a control signal CTRL and an address ADDR to the nonvolatile memory device 1100. The controller 1200 may exchange data DATA with the nonvolatile memory device 1100.

According to example embodiments of the inventive concepts, the controller 1200 may include a RAM, a processing unit, a host interface and/or a memory interface (not shown). The RAM may be used as at least one of a working memory of the processing unit, a cache memory between the nonvolatile memory device 1100 and the host, and a buffer memory between the nonvolatile memory device 1100 and the host. The processing unit may control the overall operation of the controller 1200.

The host interface may include a protocol for data exchange between the host and the controller 1200. According to example embodiments of the inventive concepts, the controller 1200 may communicate with external devices (e.g., a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and/or a Integrated Drive Electronics (IDE) protocol. A memory interface interfaces with the nonvolatile memory device 1100. For example, the memory interface may include a NAND interface and/or a NOR interface.

The memory system 1000 may include an error correction block (not shown). The error correction block may detect and correct error in data that is read from the nonvolatile memory device 1100 with an Error Correction Code (ECC). According to example embodiments of the inventive concepts, the error correction block may be provided as an element of the controller 1200. The error correction block may be provided as an element of the nonvolatile memory device 1100.

The controller 1200 and the nonvolatile memory device 1100 may be integrated as one semiconductor device. For example, the controller 1200 and the nonvolatile memory device 1100 may be integrated as one semiconductor device to configure a memory card. For example, the controller 1200 and the nonvolatile memory device 1100 may be integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and/or a universal flash memory device (UFS).

The controller 120 and the nonvolatile memory device 1100 may be integrated as one semiconductor device to configure a semiconductor drive (Solid State Drive (SSD)). The semiconductor drive (SSD) may include a storage unit for storing data in a semiconductor memory. When the memory system 1000 is used as the semiconductor drive (SSD) the operation speed of the host connected to the memory system 1000 may be considerably improved.

As another example, the memory system 1000 may be provided as one of various elements of electronic devices, for example, computers, Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and/or one of various elements configuring a computing system.

According to example embodiments of the inventive concepts, the nonvolatile memory device 1100 and/or the memory system 1000 may be mounted in various types of packages. For example, the nonvolatile memory device 1100 and/or the memory system 1000 may be packaged in a package type, for example, Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and/or Wafer-Level Processed Stack Package (WSP).

Figure 39:
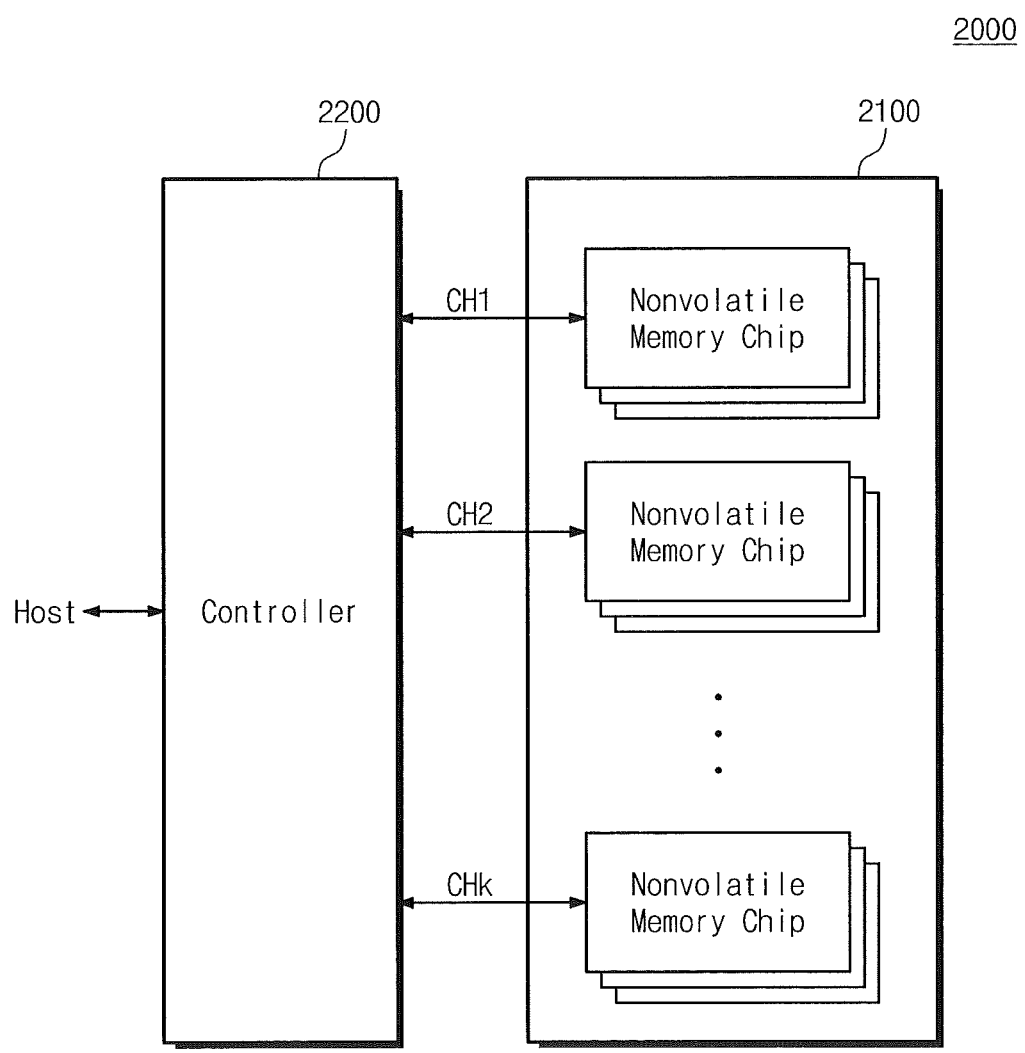

FIG. 39 is a block diagram illustrating example applications of a memory system 1000 of FIG. 38. Referring to FIG. 39, a memory system 2000 may include a nonvolatile memory device 2100 and a controller 2200. The nonvolatile memory device 2100 may include a plurality of nonvolatile memory chips. The plurality of nonvolatile memory chips may be divided into a plurality of groups. Each group of the nonvolatile memory chips may communicate with the controller 2200 through a common channel and/or through separate channels.

In FIG. 39, it may be illustrated that the plurality of nonvolatile memory chips communicate with the controller 2200 through first to kth channels CH1-CHk. Each nonvolatile memory chip may be configured similarly to the nonvolatile memory device 100 described with reference to FIGS. 1-37. It may be described with respect to FIG. 39 that the plurality of nonvolatile memory chips are connected to one channel. However, the memory system 2000 may be modified so that one nonvolatile memory chip may be connected to one channel.

Figure 40:
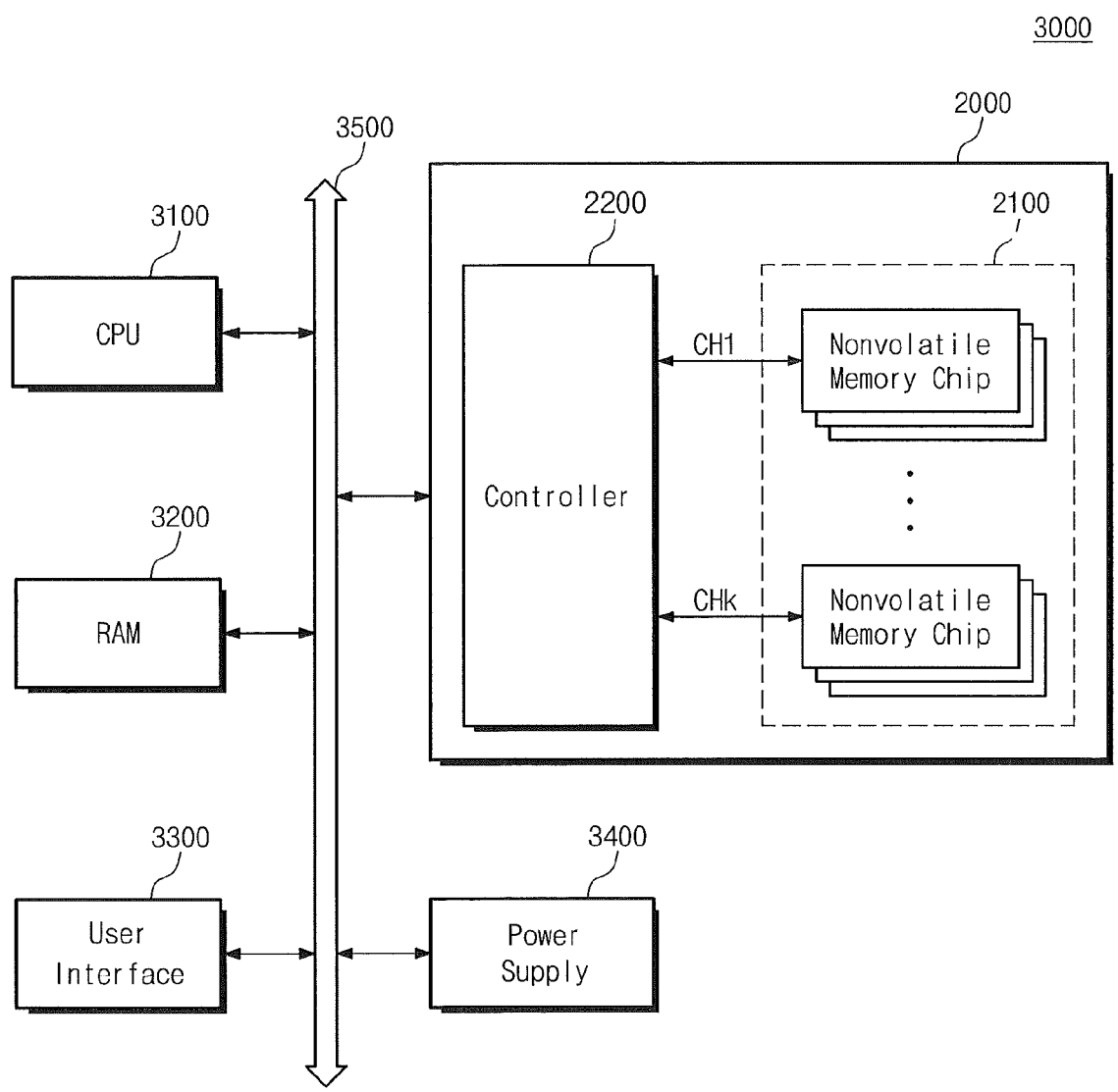

FIG. 40 is a block diagram illustrating a computing system 3000 including a memory system 2000 described with reference to FIG. 39. Referring to FIG. 40, a computing system 3000 may include a Central Processing Unit (CPU) 3100, a RAM 3200, a user interface 3300, a power supply 3400 and a memory system 2000. The memory system 2000 may be electrically connected to the CPU 3100, the RAM 3200, the user interface 3300 and the power supply 3400 through a system bus 3500. Data, which may be provided through the user interface 3300 and/or processed by the CPU 3100, may be stored in the memory system 2000.

FIG. 40 may illustrate that the nonvolatile memory device 2100 is connected to the system bus 3500 through the controller 2200. The nonvolatile memory device 2100 may be directly connected to the system bus 3500. FIG. 40 may illustrate that the memory system 2000 of FIG. 39 is included. The memory system 2000 may be replaced by, for example, a memory system 1000 described with reference to FIG. 38. According to example embodiments of the inventive concepts, the computing system 3000 may include the memory systems 1000 and 2000 described above with reference to FIGS. 38 and 39.

According to example embodiments of the inventive concepts, a reading operation which accompanies boosting may be performed and read disturbances may be reduced and/or prevented. The generation of hot carriers may be reduced and/or prevented between a boosted channel and a selection transistor. A nonvolatile memory device with enhanced reliability, a reading method thereof, and a memory system including the same may be provided.

While example embodiments of the inventive concepts have been particularly shown and described, it will be understood by one of ordinary skill in the art that variations in faun and detail may be made therein without departing from the spirit and scope of the claims.

What is claimed is:

1. A reading method of a nonvolatile memory device including a plurality of strings on a substrate, each one of the plurality of strings being perpendicular to the substrate and including a plurality of memory cells stacked in a direction perpendicular to the substrate, the reading method comprising:

applying a bit line voltage to a selected bit line among a plurality of bit lines, the selected bit line connected to a selected string among the plurality of strings;

applying a first string selection line voltage to at least one selected string selection line connected to the selected string;

applying a second string selection line voltage to at least one unselected string selection line connected to unselected strings among the plurality of strings;

applying at least one read voltage to a plurality of word lines connected to the plurality of strings;

applying a first ground selection line voltage to at least one selected ground selection line connected to the selected string; and applying a second ground selection line voltage to at least one unselected ground selection line connected to unselected strings among the plurality of strings, wherein each one of the plurality of strings includes the plurality of memory cells on a ground selection transistor, and a string selection transistor on the plurality of the memory cells.

2. The reading method of claim 1, wherein the at least one selected string selection line is connected to at least one string selection transistor, and the applying of the first string selection line voltage includes applying the first string selection line voltage to turn on the at least one string selection transistor.

3. The reading method of claim 1, wherein the at least one unselected string selection line is connected to at least one string selection transistor, and the applying of the second string selection line voltage includes applying the second string selection line voltage to turn off at the least one string selection transistor.

4. The reading method of claim 1, wherein the at least one selected ground selection line is connected to at least one ground selection transistor, and the applying of the first ground selection line voltage includes applying the first ground selection line voltage to turn on the at least one ground selection transistor.

5. The reading method of claim 1, wherein the at least one unselected ground selection line is connected to at least one ground selection transistor, and the applying of the second ground selection line voltage includes applying the second ground selection line voltage to turn off the at least one ground selection transistor.

6. The reading method of claim 1, wherein the applying the bit line voltage to the selected bit line includes pre-charging the selected bit line to the bit line voltage during a pre-charge operation and applying the bit line voltage to the selected bit line during a developing operation after the pre-charge operation, the applying the first string selection line voltage includes applying the first string selection line voltage to the string selection transistor of the selected string during the developing operation, a magnitude of the second string selection line voltage is less than a magnitude of the first string selection line voltage, the at least one read voltage includes a read voltage and at least one unselection read voltage having a magnitude greater than the read voltage, the applying the at least one read voltage to the plurality of word lines includes applying the read voltage during the developing operation to a selected word line among the plurality of word lines that is connected to a selected memory cell among the plurality of memory cells in the selected string, the applying the at least one read voltage to the plurality of word lines includes applying one of the at least one unselection read voltage during the developing operation to at least one of the unselected word lines among the plurality of word lines that are connected to unselected memory cells among the plurality of memory cells in the selected string, and the applying a first ground selection line voltage includes applying the first ground selection line voltage to the ground selection transistor of the selected string during the developing operation.

7. The reading method of claim 6, wherein the least one unselection read voltage includes a first unselection read voltage and a second unselection read voltage, the second unselection read voltage has a magnitude that is lower than a magnitude of the first unselection read voltage, the applying one of the at least one unselection read voltage during the developing operation includes applying the second unselection read voltage to unselected word lines connected to unselected memory cells adjacent to the string selection transistor or ground selection transistor among the plurality of memory cells in the selected string, and the applying one of the at least one unselection read voltage during the developing operation includes applying the first unselection read voltage to unselected word lines connected to other ones of the unselected memory cells among the plurality of memory cells in the selected string.

8. The reading method of claim 6, wherein each one of the plurality of strings further includes a plurality of dummy memory cells, one of the plurality of dummy memory cells is between the plurality of memory cells and the ground selection transistor, an other of the plurality of dummy memory cells is between the plurality of memory cells and the string selection transistor, the least one unselection read voltage includes a first unselection read voltage and a second unselection read voltage, the second unselection read voltage has a magnitude that is lower than a magnitude of the first unselection read voltage, the applying the at least one read voltage to the plurality of word lines includes applying the first unselection read voltage during the developing operation to at least one of the unselected word lines among the plurality of word lines that are connected to unselected memory cells among the plurality of memory cells in the selected string, and the method further includes applying the second unselection read voltage during the developing operation to dummy word lines among the plurality of word lines, the dummy word lines being connected to the dummy memory cells of the plurality of strings.

9. The reading method of claim 1, wherein the applying at least one read voltage includes applying a selection read voltage to a selected word line of the plurality of word lines and applying a non-selection read voltage to an unselected word lines among the plurality of word lines, and a magnitude of the non-selection read voltage applied to at least one of the unselected word lines is greater than a magnitude of at least one of the first string selection line voltage and the first ground selection line voltage.

10. A reading method of a nonvolatile memory device including a substrate and a plurality of memory cells stacked in a direction perpendicular to the substrate, the plurality of memory cells including some memory cells arranged in rows and columns on a plane parallel to the substrate that share a word line among a plurality of word lines, the reading method comprising:

applying a bit line voltage to a plurality of bit lines;

applying a first string selection line voltage to at least one selected string selection line;

applying a second string selection line voltage to at least one unselected string selection line;

applying at least one read voltage to the plurality of word lines;

applying a first ground selection line voltage to at least one selected ground selection line; and applying a second ground selection line voltage to at least one unselected ground selection line.

11. The reading method of claim 10, wherein the at least one read voltage is at least three read voltages, and the applying of the at least three read voltages includes applying a selection read voltage to a selected word line of the plurality of word lines and applying first and second non-selection read voltages to unselected word lines of the plurality of word lines.

12. The reading method of claim 11, wherein the applying of the at least three read voltages includes applying the second non-selection read voltage to a first word line of the plurality of word lines, the first word line adjacent to the at least one selected string selection line and the at least one unselected string selection line.

13. The reading method of claim 12, wherein the at least three read voltages is at least four read voltages, and the applying of the at least four read voltages includes applying a third non-selection read voltage to a second word line of the plurality of word lines, the second word line adjacent to the first word line.

14. The reading method of claim 13, wherein a magnitude of the second non-selection read voltage is less than a magnitude of the third non-selection read voltage.

15. The reading method of claim 11, wherein the applying of the at least three read voltages includes applying the second non-selection read voltage to a first word line of the plurality of word lines, the first word line adjacent to the at least one selected ground selection line and the at least one unselected ground selection line.

16. The reading method of claim 15, wherein the at least three read voltages is at least four read voltages, and the applying of the at least four read voltages includes applying a third non-selection read voltage to a second word line of the plurality of word lines, the second word line adjacent to the first word line.

17. The reading method of claim 11, wherein the applying of the at least three read voltages includes applying the first non-selection read voltage to a first word line of the plurality of word lines, the first word line separated from the at least one selected string selection line, the at least one unselected string selection line, the at least one selected ground selection line and the at least one unselected ground selection line by at least a second word line of the plurality of word lines.

18. The reading method of claim 11, wherein a magnitude of the first non-selection read voltage is greater than a magnitude of the second non-selection read voltage.

19. The reading method of claim 10, wherein
the plurality of memory cells include a plurality of first memory cells stacked in a direction perpendicular to the substrate and a plurality of second memory cells stacked in the direction perpendicular to the substrate,
the at least one selected string selection line is connected to a first string selection transistor,
the at least one unselected string selection line is connected to a second string selection transistor,
the at least one selected ground selection line is connected to a first ground selection transistor, a selected memory string is between the first string selection transistor and the first ground selection transistor, the selected memory string includes the plurality of first memory cells,
the at least one unselected ground selection line is connected to a second ground selection transistor, an unselected memory string is between the second string selection transistor and the second ground selection transistor, the unselected memory string includes the plurality of second memory cells,
the applying at least one read voltage includes applying a plurality of read voltages to the plurality of word lines, and
each of the plurality of word lines commonly connects at least one of the plurality of first memory cells and at least one of the plurality of second memory cells.

20. The method of claim 19, wherein
the plurality of first memory cells is at least three first memory cells,
the plurality of second memory cells is at least three second memory cells
the plurality of word lines is at least three word lines,
the plurality of read voltages is at least three read voltages, and
the applying at least three read voltages includes applying a selection read voltage to a selected word line of the at least three word lines and applying a plurality of non-selection read voltages to a plurality of non-selected word lines of the at least three word lines such that a voltage across adjacent non-selected word lines decreases as a function of distance from the selected word line.

21. The reading method of claim 10, wherein
the applying at least one read voltage includes applying a selection read voltage to a selected word line of the plurality of word lines and applying a non-selection read voltage to an unselected word lines among the plurality of word lines, and
a magnitude of the non-selection read voltage applied to at least one of the unselected word lines is greater than a magnitude of at least one of the first string selection line voltage and the first ground selection line voltage.

* * * * *